(12) United States Patent
Zandi et al.

(10) Patent No.: US 7,068,849 B2
(45) Date of Patent: Jun. 27, 2006

(54) METHOD AND APPARATUS FOR COMPRESSION USING REVERSIBLE WAVELET TRANSFORMS AND AN EMBEDDED CODESTREAM

(75) Inventors: Ahmad Zandi, Cupertino, CA (US); Edward L. Schwartz, Sunnyvale, CA (US); Michael J. Gormish, Los Altos, CA (US); Martin Boliek, San Francisco, CA (US)

(73) Assignees: Ricoh Co. Ltd., Tokyo (JP); Ricoh Corporation, Menlo Park, CA (US)

( * ) Notice: Subject to any disclaimer, the term of this patent is extended or adjusted under 35 U.S.C. 154(b) by 584 days.

(21) Appl. No.: 10/226,853

(22) Filed: Aug. 22, 2002

(65) Prior Publication Data

US 2003/0123743 A1    Jul. 3, 2003

Related U.S. Application Data

(60) Division of application No. 09/499,255, filed on Feb. 7, 2000, now Pat. No. 6,873,734, which is a division of application No. 08/498,695, filed on Jun. 30, 1995, now Pat. No. 6,195,465, which is a continuation-in-part of application No. 08/310,146, filed on Sep. 21, 1994, now Pat. No. 5,748,786.

(51) Int. Cl.
*G06K 9/36* (2006.01)
*G06K 9/46* (2006.01)

(52) U.S. Cl. ...................... 382/240; 382/248
(58) Field of Classification Search ............... 382/240, 382/248; 375/240.19
See application file for complete search history.

(56) References Cited

U.S. PATENT DOCUMENTS

| | | |
|---|---|---|
| 3,580,655 A | 5/1971 | Leith et al. |
| 3,950,103 A | 4/1976 | Schmidt-Weinmar |
| 4,136,954 A | 1/1979 | Jamieson |
| 4,155,097 A | 5/1979 | Lux |
| 4,190,861 A | 2/1980 | Lux |
| 4,223,354 A | 9/1980 | Noble et al. |
| 4,393,456 A | 7/1983 | Marshall, Jr. |
| 4,437,087 A | 3/1984 | Petr |
| 4,569,075 A | 2/1986 | Nussbaumer |
| 4,599,567 A | 7/1986 | Goupillaud et al. |

(Continued)

FOREIGN PATENT DOCUMENTS

DE    WO 9417492    8/1994

(Continued)

OTHER PUBLICATIONS

1977 IEEE International Conference on Acoustics Speech & Signal Processing, "Application of Quadrature Mirror Filters to Split Band Voice Coding Schemes", D. Esteban and C. Galand, pp. 191-195.

(Continued)

*Primary Examiner*—Phuoc Tran
(74) *Attorney, Agent, or Firm*—Blakely, Sokoloff, Taylor & Zafman LLP

(57) ABSTRACT

A compression and decompression system in which a reversible wavelet filter are used to generates coefficients from input data, such as image data. The reversible wavelet filter is an efficient transform implemented with integer arithmetic that has exact reconstruction. The present invention uses the reversible wavelet filter in a lossless system (or lossy system) in which an embedded codestream is generated from the coefficients produced by the filter. An entropy coder performs entropy coding on the embedded codestream to produce the compressed data stream.

18 Claims, 30 Drawing Sheets

U.S. PATENT DOCUMENTS

| | | |
|---|---|---|
| 4,652,881 A | 3/1987 | Lewis |
| 4,663,660 A | 5/1987 | Fedele et al. |
| 4,674,125 A | 6/1987 | Carlson et al. |
| 4,701,006 A | 10/1987 | Perlmutter |
| 4,751,742 A | 6/1988 | Meeker |
| 4,760,563 A | 7/1988 | Beylkin |
| 4,785,348 A | 11/1988 | Fonsalas et al. |
| 4,785,349 A | 11/1988 | Keith et al. |
| 4,799,179 A | 1/1989 | Masson et al. |
| 4,805,129 A | 2/1989 | David |
| 4,815,023 A | 3/1989 | Arbeiter |
| 4,817,182 A | 3/1989 | Adelson et al. |
| 4,821,223 A | 4/1989 | David |
| 4,827,336 A | 5/1989 | Acampora et al. |
| 4,829,378 A | 5/1989 | LeGall |
| 4,837,517 A | 6/1989 | Barber |
| 4,839,889 A | 6/1989 | Gockler |
| 4,858,017 A | 8/1989 | Torbey |
| 4,864,398 A | 9/1989 | Avis et al. |
| 4,868,868 A | 9/1989 | Yazu et al. |
| 4,881,075 A | 11/1989 | Weng |
| 4,894,713 A | 1/1990 | Delogne et al. |
| 4,897,717 A | 1/1990 | Hamilton et al. |
| 4,899,147 A | 2/1990 | Schiavo et al. |
| 4,904,073 A | 2/1990 | Lawton et al. |
| 4,918,524 A | 4/1990 | Ansari et al. |
| 4,922,544 A | 5/1990 | Stansfield et al. |
| 4,929,223 A | 5/1990 | Walsh |
| 4,929,946 A | 5/1990 | O'Brien et al. |
| 4,936,665 A | 6/1990 | Whitney |
| 4,972,484 A | 11/1990 | Theile et al. |
| 4,973,961 A | 11/1990 | Chamzas et al. |
| 4,974,187 A | 11/1990 | Lawton |
| 4,982,283 A | 1/1991 | Acampora |
| 4,985,927 A | 1/1991 | Norwood et al. |
| 4,987,480 A | 1/1991 | Lippmann et al. |
| 4,999,705 A | 3/1991 | Puri |
| 5,000,183 A | 3/1991 | Bonnefous |
| 5,001,764 A | 3/1991 | Wood et al. |
| 5,014,134 A | 5/1991 | Lawton et al. |
| 5,018,210 A | 5/1991 | Merryman et al. |
| 5,049,992 A | 9/1991 | Citta et al. |
| 5,049,993 A | 9/1991 | Le Gall et al. |
| 5,068,911 A | 11/1991 | Resnikoff et al. |
| 5,072,308 A | 12/1991 | Lin et al. |
| 5,073,964 A | 12/1991 | Resnikoff |
| 5,081,645 A | 1/1992 | Resnikoff et al. |
| 5,095,447 A | 3/1992 | Manns et al. |
| 5,097,261 A | 3/1992 | Langdon, Jr. et al. |
| 5,097,331 A | 3/1992 | Chen et al. |
| 5,101,280 A | 3/1992 | Moronaga et al. |
| 5,101,446 A | 3/1992 | Resnikoff et al. |
| 5,103,306 A | 4/1992 | Weiman et al. |
| 5,109,451 A | 4/1992 | Aono et al. |
| 5,121,191 A | 6/1992 | Cassereau et al. |
| 5,124,930 A | 6/1992 | Nicolas et al. |
| 5,128,757 A | 7/1992 | Citta et al. |
| 5,128,791 A | 7/1992 | LeGall et al. |
| 5,148,498 A | 9/1992 | Resnikoff et al. |
| 5,152,953 A | 10/1992 | Ackermann |
| 5,156,943 A | 10/1992 | Whitney |
| 5,173,880 A | 12/1992 | Duren et al. |
| 5,182,645 A | 1/1993 | Breeuwer et al. |
| 5,223,926 A | 6/1993 | Stone et al. |
| 5,235,434 A | 8/1993 | Wober |
| 5,241,395 A | 8/1993 | Chen |
| 5,262,958 A | 11/1993 | Chui et al. |
| 5,276,525 A | 1/1994 | Gharavi |
| 5,303,200 A | 4/1994 | Elrod et al. |
| 5,315,670 A | 5/1994 | Shapiro |
| 5,321,776 A | 6/1994 | Shapiro |
| 5,335,016 A | 8/1994 | Nakagawa |
| 5,347,479 A | 9/1994 | Miyazaki |
| 5,349,348 A | 9/1994 | Anderson et al. |
| 5,379,355 A | 1/1995 | Allen |
| 5,381,145 A | 1/1995 | Allen et al. |
| 5,384,869 A | 1/1995 | Wilkinson et al. |
| 5,412,741 A | 5/1995 | Shapiro |
| 5,414,780 A | 5/1995 | Carnahan |
| 5,416,604 A | 5/1995 | Park |
| 5,420,891 A | 5/1995 | Akansu |
| 5,442,458 A | 8/1995 | Rabbani et al. |
| 5,453,945 A | 9/1995 | Tucker et al. |
| 5,455,874 A | 10/1995 | Ormsby et al. |
| 5,481,308 A | 1/1996 | Hartung et al. |
| 5,495,292 A | 2/1996 | Zhang et al. |
| 5,497,435 A | 3/1996 | Berger |
| 5,511,151 A | 4/1996 | Russell et al. |
| 5,534,925 A | 7/1996 | Zhong |
| 5,537,493 A | 7/1996 | Wilkinson |
| 5,541,594 A | 7/1996 | Huang et al. |
| 5,546,477 A | 8/1996 | Knowles et al. |
| 5,563,960 A | 10/1996 | Shapiro |
| 5,566,089 A | 10/1996 | Hoogenboom |
| 5,600,373 A | 2/1997 | Chui et al. |
| 5,602,589 A | 2/1997 | Vishwanath et al. |
| 5,631,977 A | 5/1997 | Koshi |
| 5,638,498 A | 6/1997 | Tyler et al. |
| 5,657,085 A | 8/1997 | Katto |
| 5,701,367 A | 12/1997 | Koshi et al. |
| 5,717,789 A | 2/1998 | Anderson et al. |
| 5,748,786 A | 5/1998 | Zandi et al. |
| 5,754,793 A | 5/1998 | Eom et al. |
| 5,808,683 A | 9/1998 | Tong et al. |
| 5,809,176 A | 9/1998 | Yajima |
| 5,850,482 A | 12/1998 | Meany et al. |
| 5,867,602 A | 2/1999 | Zandi et al. |
| 5,880,856 A | 3/1999 | Ferriere |
| 5,966,465 A | 10/1999 | Keith et al. |
| 5,999,634 A | 12/1999 | Abbott et al. |
| 6,005,901 A | 12/1999 | Linz |
| 6,020,975 A | 2/2000 | Chen et al. |
| 6,026,198 A | 2/2000 | Okada |
| 6,031,940 A | 2/2000 | Chui et al. |
| 6,088,062 A | 7/2000 | Kanou et al. |
| 6,088,395 A | 7/2000 | Wang et al. |
| 6,101,279 A | 8/2000 | Nguyen et al. |
| 6,118,902 A | 9/2000 | Knowles |
| 6,121,970 A | 9/2000 | Guedalia |
| 6,128,413 A | 10/2000 | Benamara |
| 6,160,846 A | 12/2000 | Chiang |
| 6,195,465 B1 | 2/2001 | Zandi et al. |
| 6,201,897 B1 | 3/2001 | Nixon |
| 6,229,929 B1 | 5/2001 | Lynch et al. |
| 6,236,765 B1 | 5/2001 | Acharya |
| 6,237,010 B1 | 5/2001 | Hui et al. |
| 6,263,109 B1 | 7/2001 | Ordentlich et al. |
| 6,263,120 B1 | 7/2001 | Matsuoka |
| 6,266,450 B1 | 7/2001 | Yip et al. |
| 6,275,531 B1 | 8/2001 | Li |
| 6,327,392 B1 | 12/2001 | Li |
| 6,330,666 B1 | 12/2001 | Wise et al. |
| 6,332,043 B1 | 12/2001 | Ogata |
| 6,339,658 B1 | 1/2002 | Moccagatta et al. |
| 6,350,989 B1 | 2/2002 | Lee et al. |
| 6,356,668 B1 | 3/2002 | Honsinger et al. |
| 6,442,302 B1 | 8/2002 | Klassen |
| 6,466,698 B1 | 10/2002 | Creusere |
| 6,483,946 B1 | 11/2002 | Martucci et al. |
| 6,486,981 B1 | 11/2002 | Shimura et al. |
| 6,492,916 B1 | 12/2002 | Schwartz et al. |
| 6,546,143 B1 | 4/2003 | Taubman et al. |
| 6,549,673 B1 | 4/2003 | Ammicht et al. |
| 6,606,416 B1 | 8/2003 | Yip et al. |

| | | |
|---|---|---|
| 6,625,321 B1 | 9/2003 | Li et al. |
| 6,650,782 B1 | 11/2003 | Joshi et al. |
| 6,658,159 B1 | 12/2003 | Taubman |
| 6,668,090 B1 | 12/2003 | Joshi et al. |
| 2001/0003544 A1 | 6/2001 | Kajiwara et al. |
| 2001/0021223 A1 | 9/2001 | Andrew |
| 2001/0047517 A1 | 11/2001 | Christopoulos et al. |
| 2003/0110299 A1 | 6/2003 | Larsson et al. |

FOREIGN PATENT DOCUMENTS

| | | |
|---|---|---|
| DE | 195 49 491 C2 | 8/1995 |
| DE | 195 34 943 A1 | 3/1996 |
| DE | 195 34 730 A1 | 5/1996 |
| DE | 196 26 600 A1 | 1/1997 |
| DE | 196 26 615 A1 | 1/1997 |
| EP | 0510933 | 10/1992 |
| EP | 0510933 A1 | 10/1992 |
| EP | 0622741 | 3/1994 |
| EP | 0593013 | 4/1994 |
| EP | 0593013 A2 | 4/1994 |
| EP | 0611051 A1 | 8/1994 |
| EP | 0662741 A2 | 11/1994 |
| EP | 0701375 | 3/1996 |
| EP | 0967556 A2 | 12/1999 |
| EP | 1035511 A2 | 9/2000 |
| EP | 1164781 A1 | 12/2001 |
| GB | 2211691 A | 5/1989 |
| GB | 2211691 | 7/1989 |
| GB | 2284121 | 5/1995 |
| GB | 2285374 A | 5/1995 |
| GB | 2293733 | 7/1995 |
| GB | 2293734 | 7/1995 |
| GB | 2303030 | 6/1996 |
| GB | 2303031 | 6/1996 |
| GB | 2 341 035 A | 3/2000 |
| JP | 406038193 A | 7/1992 |
| JP | 06-177914 | 6/1994 |
| JP | 06-178280 | 6/1994 |
| JP | 06-224777 | 8/1994 |
| JP | 06-245077 | 9/1994 |
| JP | 6-350989 | 12/1994 |
| JP | 07-015609 | 1/1995 |
| JP | 07-074966 | 3/1995 |
| JP | 7-79350 | 3/1995 |
| JP | 07-107297 | 4/1995 |
| JP | 06-261061 | 9/2005 |
| WO | WO 88/04117 | 6/1988 |
| WO | WO 8810049 | 12/1988 |
| WO | WO 9103902 | 3/1991 |
| WO | WO 93/10634 | 11/1991 |
| WO | WO 9118361 | 11/1991 |
| WO | WO 91/18361 | 5/1993 |
| WO | WO 9310634 | 5/1993 |
| WO | WO 9423385 | 10/1994 |
| WO | WO 9519683 | 7/1995 |
| WO | WO 9609718 | 3/1996 |
| WO | WO 00/49571 | 8/2000 |
| WO | WO 01/16764 A1 | 3/2001 |

OTHER PUBLICATIONS

Martin Vetterli, "Filter Banks Allowing Perfect Reconstruction", *Signal Processing 10*, (1986), pp. 219-244.
R.E. Crochiere, S.A. Webber, J.L. Flanagan, "Digital Coding of Speech in Sub-bands", 1976, American Telephone and Telegraph Company, The Bell System Technical Journal, vol. 55, No. 8, Oct. 1976, pp. 1069-1085.
John W. Woods and Sean D. O'Neil, "Sub-band Coding of Images", *Proceedings ICASSP 86*, Tokyo, Japan, Apr. 1986, pp. 1005-1008.
"Proceedings: ICASSP 87", 1987 International Conference on Acoustics, Speech, and Signal Processing, Apr. 6, 7, 8, 9, 1987, vol. 3 of 4, "Sub-band coding of Images Using Predictive Vector Quantization", P.H. Westernick, J. Biemond and D.E. Boekee, pp. 1378-1381.
Mark J.T. Smith and Thomas P. Barnwell, III, "Exact Reconstruction Techniques for Tree-Structured Subband Coders", *IEEE Transactions on Acoustics, Speech, and Signal Processing*, vol. ASSP-34, No. 3, Jun. 1986, p. 434-441.
Marvin Vetterli, "Multi-Dimensional Sub-band coding: Some Theory and Algorithms", *Signal Processing 6* (1984), pp. 97-112.
H. Gharavi and Ali Tabatabai, "Sub-band coding of Digital Images Using Two-Dimensional Quadrature Mirror Filtering", SPIE vol. 707 Visual Communications and Image Processing, pp. 51-61.
"Proceedings: ICASSP 87", 1987 International Conference on Acoustics, Speech, and Signal Processing, Apr. 6,7,8,9, 1987, vol. 4 of 4, "Application of Quadrature Mirror Filtering to the Coding of Monochrome and Color Images", H. Gharavi and A. Tabatabai, pp. 2384-2387.
International Search report for Application No. GB 9518298.6, dated Nov. 1995.
Mutsumi Ohta, Mitsuharu Yano and Takao Nishitani, "Wavelet Picture Coding with Transform Coding Approach", Jan. 31, 1999, pp. 776-785.
French Search Report, FR9511024, Nov. 26, 1996.
French Search Report, FR9511023, Nov. 26, 1996.
Dutch Search Report, NO133082, Nov. 26, 1996.
Calderbank, et al., "Wavelet Transforms That Map Integers to Integers", Aug. 1996.
Szu et al., "Image Wavelet Transforms Implemented by Discrete Wavelet Chips", Jul. 1994, *Optimal Engineering*, vol. 33, No. 7, pp. 2310-2325.
Villasenor, et al., "Filter Evaluation and Selection in Wavelet Image Compression", *IEEE*, 1994, pp. 351-360.
Denk, et al., "Architectures for Lattice Structure Based Orthonormal Discrete Wavelet Transforms", *IEEE*, 1994, pp. 259-270.
Shapiro, "Embedded Image Coding Using Zerotrees of Wavelet Coefficients", *IEEE Transactions on Signal Processing*, Dec. 1993, No. 12, pp. 3445-3462.
Jie Chen, Shuichi Itoh, and Takeshi Nishitani, "Wavelet Picture Coding with Transform Coding Approach", Jan. 31, 1999, pp. 776-785.
Padmanabhan, et al., "Feedback-Based Orthogonal Digital Filters", *IEEE Transactions on Circuits and Systems*, Aug. 1993, No. 8, pp. 512-525.
Said, et al., "Reversible Image Compression Via Multiresolution Representation and Predictive Coding", *SPIE*, vol. 2094, Aug. 11, 1993, pp. 664-674.
Said, et al., "Image Compression Using the Spatial-Orientation Tree", *IEEE*, 1993, pp. 279-282.
Xiong, et al., "Joint Optimization of Scalar and Tree-Structured Quantization of Wavelet Image Decompositions", *IEEE*, Jan. 11, 1993, pp. 891-895.
Howard et al., "Fast and Efficient Lossless Image Compression", *IEEE*, 1993, pp. 351-360.
Shapiro, J.M., "An Embedded Hierarchical Image Coder Using Zerotrees of Wavelet Coefficients", *IEEE*, 1993, pp. 214-223.
Cha Keon Cheong, Kyoharu Aizawa, Takahiro Saito and Mitsutoshi Hatori; "Subband Image Coding with Biorthogonal Wavelets"; Jul. 1992; pp. 871-881.
Antonini et al., "Image Coding Using Wavelet Transform", *IEEE Transactions on Image Processing*, vol. 1, No. 2, Apr. 1992, pp. 205-220.

Chui, et al., "Wavelets on a Bounded Interval", *Numerical Methods of Approximation Theory*, vol. 9, 1992, pp. 53-75.

Shah et al., "A Chip Set for Lossless Image Compression", IEEE Journal of Solid-State Circuits, vol. 26, No. 3, Mar. 1991, pp. 237-244.

Langdon, Jr., Glen G., "Sunset: A Hardware-Oriented Algorithm for Lossless Compression of Gray Scale Images", *SPIE vol. 1444, Image Capture, Formatting, and Display*, 1991, p. 272-282.

A.S. Lewis and G. Knowles; "Image Compression Using the 2-D Wavelet Transform"; Nov. 15, 1990, pp. 244-250.

Le Gall, et al., "Sub-band Coding of Digital Images Using Symmetric Short Kernal Filters and Arithmetic Coding Techniques", 1988, International Conference on Acoustics, Speech and Signal Processing, pp. 761-764.

Komatsu et al., "Reversible Subband Coding of Images", pp. 429-136 (Japanese).

Lux, P., "A Novel Set of closed Orthogonal Functions for Picture Code", 1977, pp. 267-274.

Blumberg, et al., "Visual Realism and Interativity for the Internet", IEEE, 1997, pp. 269-273.

Boliek, et al., "Decoding compression with reversible embedded wavelets (CREW) codestreams", Journal of Electronic Imaging, Jul. 1998, vol. 7 (3), pp. 402-409.

Boliek, et al., "JPEG 2000 for Efficient Imaging in a Client/Server Environment", Proceeding of the PIE, SPIE, Bellingham, VA, US, vol. 4472, Jul. 31, 2001, pp. 212-223, XP008010308.

Boliek, et al., "JPEG 2000 Next Generation Image Compression System", IEEE 0-7803-6297, 45-48.

Carey, et al: "Regularity-Preserving Image Interpolation", IEEE Transactions on Image Processing, vol. 8., No. 9, Sep. 1999, pp. 1293-1297, XP002246254.

Carrato, et al: "A Simple Edge-Sensitive Image Interpolation Filter", Proceedings of the International Conference on Image Processing (ICIP) Lausanne, Sep. 16-19, 1996, New York, IEEE, US, vol. 1, pp. 711-714, XP010202493.

Chen, et al., "Wavelet Pyramid Image Coding with Predictable and Controllable Subjective Picture Quality", *IEICE Trans. Fundamentals*, vol. E76-A., No. 9, Sep. 1993, pp. 1458-1468.

Chrysafis, et al., "An Algorith for Low Memory Wavelet Image Compression", IEEE 0-7803-5467-Feb. 1999, p. 354-358.

Chrysafis, et al., "Line Based Reduced Memory, Wavelet Image Compression," Data Compression Conference, 1998, DCC '98, Proceedings Snowbird, UT, Mar. 1998, pp. 398-407.

Deshpande, et al., "HTTP Streaming of JPEG2000 Images", IEEE, 2001, pp. 15-19.

German Search Report, Dated Mar. 21, 1997, 3 pages.

Gordon, Benjamin M., et al., "A 1.2 mW Video-Rate 2-D Color Subband Decoder," IEEE Journal of Solid-State Circuits, IEEE Inc. New York, vol. 30, No. 12, Dec. 1, 1995, pp. 1510-1516.

Hauf, et al., "The FlashPix™ Image File Format", The Fourth Color Imaging Conference: Color Science, Systems and Application, 1996, pp. 234-238.

Information Technology—JPEG 2000 Image Coding System—Part 1: Core Coding System, ISO/IEC 15444-1, Dec. 15, 2000, p. 5, 14, 22.

JPEG 2000 Part 1 Final Committee Draft Version 1.0, Image Compression Standard described in ISO/IEC 1/SC 29/WG 1 N1646, Mar. 16, 2000.

Marcellin, et al., "An Overview of JPEG-2000", Proceedings. DCC 2000 Snowbird, UT, USA, Mar. 28-30, 2000, pp. 523-541, XP010377392.

Meng, Teresa H., "A Wireless Portable Video-on-Demand System," VLSI Design, 1998, Proceedings Eleventh International Conference on Chennai, India 407, Jan. 1998, California, pp. 4-9.

Pollara et al., "Rate-distortion Efficiency of Subband Coding with Integer Coefficient Filters", Jul. 1994, p. 419, Information Theory, 1994, IEEE.

Reeves, et al: "Multiscale-Based Image Enhancement", Electrical and Computer Engineering, 1997. Engineering Innovation: Voyage of Discovery. IEEE 1997 Canadian Conference on St. Johns, NFLD., Canada May 25-28, 1997, New York, NY. (pp. 500-503), XP010235053.

Reusens, "New Results in Subband/Wavelet Image Coding", May 1993, p. 381-385.

Stoffel, et al: "A Survey Of Electronic Techniques For Pictorial Image Reproduction," IEEE Transactions On Communications, vol. COM-29, No. 12, Dec. 1981, pp. 1898-1925, XP000560531 IEEE, New York (US).

Woods, "Subband Image Coding", 1991, pp. 101-108, 163-167, and 180-189.

Woods, et al., "Subband Coding of Images", *IEEE Transactions on Acoustics, Speech, and Signal Processing*, vol. 1 ASSP-34, No. 5, Oct. 1986, pp. 1278-1288.

Wu, et al., "New Compression Paradigms in JPEG2000", Applications of Digital Image Processing XXIII, San Diego, CA USA, Jul. 31-Aug. 3, 2000, vol. 4115, pp. 418-429, XP008013391, Proceedings of the DPIE—The International Society for Optical Engineering, 2000, SPIE-Int. Soc. Opt. Eng., USA.

Chae, et al., Blocking Artifact Reduction in JPEG-Coded Images, IEEE 0-7803-5467-2, pp. 894-898, published Oct. 24-28, 1999, © 1999 IEEE.

International Standard, Information Technology—JPEG 2000 image coding system—Part 1: Core coding system, ISO/IEC 15444-1, First edition 2000-12-15, pp. ii-226.

Wu, et al., On Optimal Multi-resolution Scalar Quantization, Proceedings DCC 2002, Data Compression Conference, Apr. 2-4, 2002, Snowbird, Utah, IEEE Computer Society, Los Alamitos, California, Washington, Brussels, Tokyo, pp. 322-331.

U.S. Appl. No. 08/310,141, filed Sep. 20, 1994, Zandi et al. "ISO/IEC 11172-3: 1993 (E)", C.1.5.3-C.1.5.4.4.8, pp. 80-110.

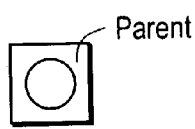 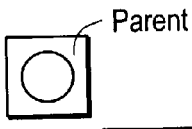 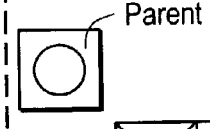
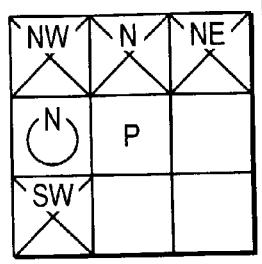 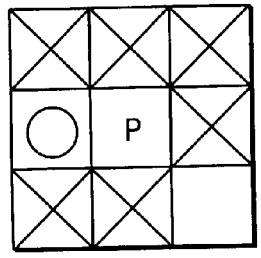 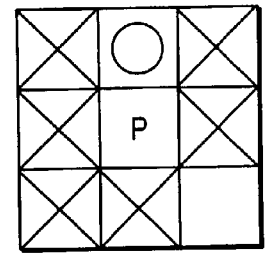
FIG. 26A     FIG. 26B     FIG. 26C
× = Tail-On Bit (1 Bit)
○ = Tail-On Information (2 Bits)
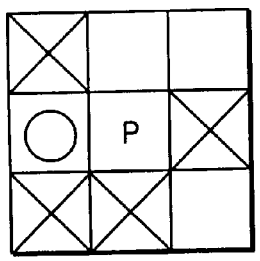
FIG. 26D

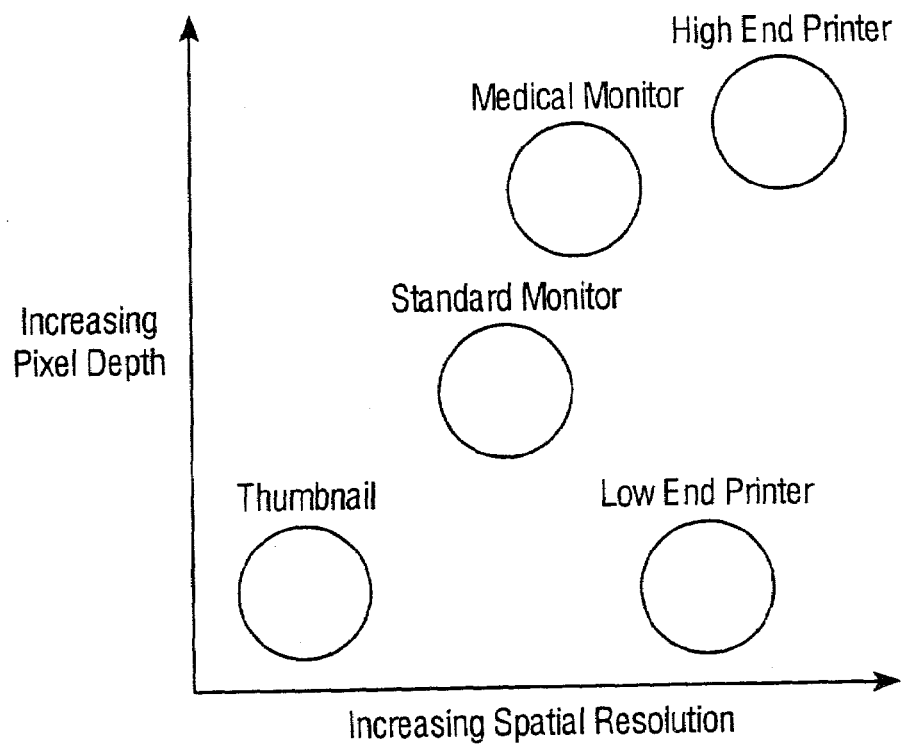
FIG. 34
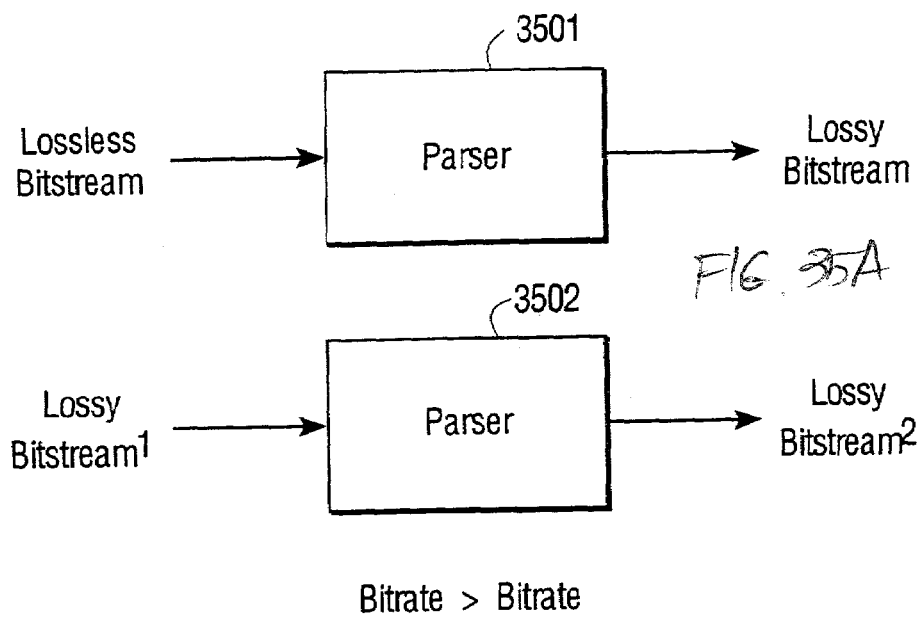
FIG. 35A
Bitrate > Bitrate
FIG. 35B

METHOD AND APPARATUS FOR COMPRESSION USING REVERSIBLE WAVELET TRANSFORMS AND AN EMBEDDED CODESTREAM

RELATED APPLICATIONS

This application is a divisional of U.S. patent application Ser. No. 09/499,255, filed on Feb. 7, 2000, U.S. Pat. No. 6,873,734, entitled Method And Apparatus For Compression Using Reversible Wavelet Transforms And An Embedded Codestream, which is a divisional of U.S. patent application Ser. No. 08/498,695, filed on Jun. 30, 1995, U.S. Pat. No. 6,195,465, which is a CIP of U.S. patent application Ser. No. 08/310,146, filed Sep. 21, 1994, U.S. Pat. No. 5,748,786, all assigned to the corporate assignee of the present invention.

FIELD OF THE INVENTION

The present invention relates to the field of data compression and decompression systems; particularly, the present invention relates to a method and apparatus for lossless and lossy encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially or temporally), two-dimensional (e.g., data changing in two spatial directions (or one spatial and one temporal dimension)), or multi-dimensional/multi-spectral data. If the compression is successful, the codewords are represented in fewer bits than the number of bits required for the uncoded input symbols (or intensity data). Lossless coding methods include dictionary methods of coding (e.g., Lempel-Ziv), run length encoding, enumerative coding and entropy coding. In lossless image compression, compression is based on predictions or contexts, plus coding. The JBIG standard for facsimile compression and DPCM (differential pulse code modulation—an option in the JPEG standard) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Recent developments in image signal processing continue to focus attention on a need for efficient and accurate forms of data compression coding. Various forms of transform or pyramidal signal processing have been proposed, including multiresolution pyramidal processing and wavelet pyramidal processing. These forms are also referred to as subband processing and hierarchical processing. Wavelet pyramidal processing of image data is a specific type of multi-resolution pyramidal processing that may use quadrature mirror filters (QMFs) to produce subband decomposition of an original image. Note that other types of non-QMF wavelets exist. For more information on wavelet processing, see Antonini, M., et al., "Image Coding Using Wavelet Transform", *IEEE Transactions on Image Processing*, Vol. 1, No. 2, April 1992; Shapiro, J., "An Embedded Hierarchical Image Coder Using Zerotrees of Wavelet Coefficients", *Proc. IEEE Data Compression Conference*, pgs. 214–223, 1993.

One problem associated with much of prior art wavelet processing is that a large memory is required to store all of the data while it is being processed. In other words, in performing wavelet processing, all of the data must be examined before encoding is performed on the data. In such a case, there is no data output until at least one full pass has been made through all of the data. In fact, wavelet processing typically involves multiple passes through the data. Because of this, a large memory is often required. It is desirable to utilize wavelet processing, while avoiding the requirement of a large memory. Furthermore, it is desirable to perform wavelet processing using only a single pass through the data.

Many wavelet or subband transform implementations require filters in a particular canonical form. For example, low and high-pass filters must be the same length, the sum of the squares of the coefficients must be one, the high-pass filter must be the time and frequency reverse of the low-pass filter, etc. (See U.S. Pat. No. 5,014,134 issued May 1991 to Lawton et al.). It is desirable to allow a wider class of filters. That is, it is desirable to provide wavelet or subband transform implementations that use low and high-pass filters that are not the same length, the sum of the squares of the coefficients need not be one, the high-pass filter need not be the time and frequency reverse of the low-pass filter, etc.

The present invention provides lossy and lossless compression using a transform that provides good energy compaction.

SUMMARY OF THE INVENTION

A compression and decompression system is described. In the compression system, an encoder encodes input data into a compressed data stream. In one embodiment, the encoder comprises a reversible wavelet filter, an ordering and modeling mechanism and an entropy coder. The reversible wavelet filter transforms the input data into a plurality of coefficients. The ordering and modeling mechanism receives the coefficients and generates an embedded codestream. The entropy coder performs entropy coding on the embedded codestream to produce the compressed data stream.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 26A–D illustrate embodiments of context models.

FIG. 34 illustrates target devices versus a parameter space.

FIGS. 35A and 35B illustrate various embodiments of the parser of the present invention.

DETAILED DESCRIPTION OF THE INVENTION

Figure 1:
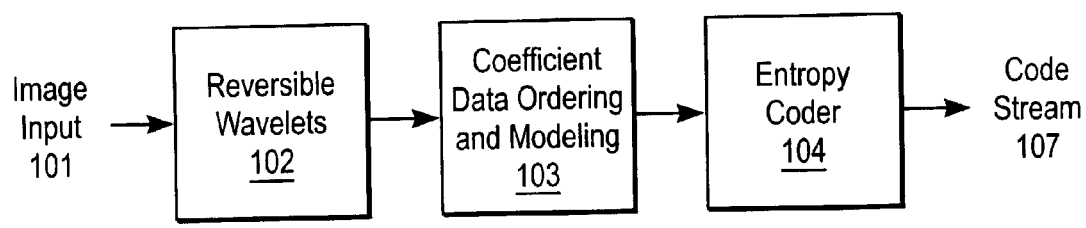
FIG. 1 is a block diagram of one embodiment of the encoding portion of the coding system of the present invention.

A method and apparatus for compression and decompression is described. In the following detailed description of the present invention numerous specific details are set forth, such as types of coders, numbers of bits, signal names, etc., in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

The following terms are used in the description that follows. A definition has been included for these various terms. However, the definition provided should not be considered limiting to the extent that the terms are known in the art. These definitions are provided to help in the understanding of the present invention.

| | |
|---|---|
| bit-significance: | A number representation, similar to sign magnitude, with head bits, followed by the sign bit, followed by tail bits, if any. The embedding encodes in bit-plane order with respect to this representation. |
| coding unit: | Unit of coefficients that are coded together and can be in arbitrary order. In one embodiment, a coding unit comprises one or more trees arranged in a rectangle. A coding unit may consist of an entire image, set of images or other data set. The coding unit has a significant impact on the buffer size needed for computing a transform. Also, in one embodiment, no contents can be derived from coefficients outside the current coding unit. However, the entropy codes may be reset within a coding unit or after many coding units. The coding unit is not necessarily randomly addressable. |
| context model: | Available information relative to the current bit to be coded that give historically learned information about the current bit. This enables conditional probability estimation for entropy coding. |
| trees: | The coefficients, and the pixels, that are related to a single coefficient in the LL of the highest level wavelet decomposition. The number of coefficients is a number of the number of levels. |
| band: | The coefficients, and the pixels, that are related to a single row or line of coefficients in the LL of the highest level wavelet decomposition for two-dimensional data. Bands are similarly defined for data of other dimensions. |
| decomposition level: | A location in the wavelet decomposition pyramid. |
| embedded quantization: | Quantization that is implied by the codestream. For example, if the importance levels are placed in order, from the most important to the least, then quantization is performed by simple truncation of the codestream. The same functionality is available with tags, markers, pointers, or other signaling. |
| entropy coder: | A device that encodes a current bit based on its context. The context allows probability estimation for the best representation of the current bit (or multiple bits). |
| fixed-rate: | An application or system that maintains a certain pixel rate and has a limited bandwidth channel. This requires achieving local average compression rather than a global average compression. Example: MPEG. |
| fixed-size: | An application or system that has a limited size buffer. In such a case, a global average compression is achieved, e.g., a print buffer. (An application can be both fixed-rate and fixed-size or either.) |
| fixed-length: | A system that converts a specific block of data to a specific block of compressed data, e.g., BTC. Fixed-length codes serve fixed-rate and fixed-size applications; however, the rate-distortion performance is often poor compared with variable rate systems. |
| Horizon context model: | A context model for use with an entropy coder (in one embodiment), defined herein as part of the present invention. |
| head: | In bit-significance representation, the head bits are the magnitude bits from the most significant up to and including the first non-zero bit |
| overlapped transform: | A transform where a single source sample point contributes to multiple coefficients of the same frequency. Examples include many wavelets and the Lapped Orthogonal Transform. |

-continued

| | |
|---|---|
| progressive: | A codestream that is ordered such that a coherent decompressed result is available from part of the coded data which can be refined with more data. In some embodiments, a codestream that is ordered with deepening bit-planes of data; in this case, it usually refers to wavelet coefficient data. |
| pyramidal: | Succession of resolutions where each lower resolution is a linear factor of two greater (a factor of four in area). |
| reversible transform: | An efficient transform implemented with integer arithmetic that has exact reconstruction. |
| S-transform: | A specific reversible wavelet filter pair with a 2-tap low pass and a 2-tap high pass filter. |
| tail: | In bit-significance representation, the tail bits are the magnitude bits with less significance than the most significant non-zero bit. |
| tail information: | In one embodiment, four states possible for a coefficient represented in bit-significance representation. It is a function of the coefficient and the current bit-plane, and is used for the Horizon context model. |
| tail-on: | In one embodiment, two states depending on whether the tail information state is zero or non-zero. It is used for the Horizon context model. |
| TS-transform: | Two-Six transform, a specific wavelet filter pair with a 2-tap low pass and a 6-tap high pass filter. |
| unified lossless/lossy: | The same compression system provides a coded data stream capable of lossless or lossy reconstruction. In the case of the present invention as will be described below, this codestream is capable of both without settings or instructions to the encoder. |
| visual importance levels: | By definition of the specific system, the input data (pixel data, coefficients, error signals, etc.) is divided logically into groups with the same visual impact. For example, the most significant bit-plane, or planes, is probably more visually important than lessor planes. Also low frequency information is generally more important than high frequency. Most working definitions of "visual significance", including the present invention as described below, are with respect to some error metric. Better visual metrics, however, could be incorporated in the system definition of visual importance. Alternate data types have alternate importance levels, for example, audio data has audio importance levels. |
| wavelet filters: | The high and low pass synthesis and analysis filters used in wavelet transform. |
| wavelet transform: | A transformation with both "frequency" and "time (or space)" domain constraints. In a described embodiment, it is a transform consisting of a high pass filter and a low pass filter. The resulting coefficients are decimated by two (critically filtered) and the filters are applied to the low pass coefficients. |

Overview of the Present Invention

The present invention provides a compression/decompression system having an encoding portion and a decoding portion. The encoding portion is responsible for encoding input data to create compressed data, while the decoding portion is responsible for decoding previously encoded data to produce a reconstructed version of the original input data. The input data may comprise a variety of data types, such as image (still or video), audio, etc. In one embodiment, the data is digital signal data; however, analog data digitized, text data formats, and other formats are possible. The source of the data may be a memory or channel for the encoding portion and/or the decoding portion.

In the present invention, elements of the encoding portion and/or the decoding portion may be implemented in hardware or software, such as that used on a computer system. The present invention provides a lossless compression/ decompression system. The present invention may also be configured to perform lossy compression/decompression.

Overview of the System of the Present Invention

FIG. 1 is a block diagram of one embodiment of the encoding portion of the system. Note the decoding portion of the system operates in reverse order, along with the data flow. Referring to FIG. 1, input image data 101 is received by wavelet transform block 102. The output of wavelet transform block 102 is coupled to coefficient data ordering and modeling block 103. In response to the output from wavelet transform block 102, the ordering/modeling block 103 produces at least one bit stream that is received by an entropy coder 104. In response to the input from ordering/modeling block 103, entropy coder 104 produces code stream 107.

Figure 2:
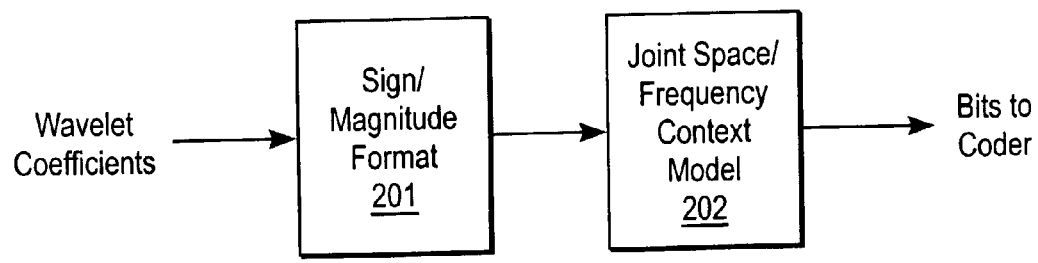
FIG. 2 is a block diagram of one embodiment of the coefficient data ordering and modeling of the present invention.

In one embodiment, the ordering/modeling block 103 comprises a sign/magnitude formatting unit 201 and a joint space/frequency context model 202, such as shown in FIG. 2. In one embodiment, the joint space/frequency context model 202 comprises a horizon context model, as is described below. The input of the sign/magnitude unit 201 is coupled to the output of the wavelet transform coding block 102. The output of sign/magnitude unit 201 is coupled to joint space/frequency modeling block 202. The output of JSF context model 202 is coupled to the input of entropy coder 104 which produces the output code stream 107.

Referring back to FIG. 1, in the present invention, the image data 101 is received and transform coded using reversible wavelets in wavelet transform block 102, as defined below, to produce a series of coefficients representing a multi-resolution decomposition of the image. The reversible wavelet transforms of the present invention are not computationally complicated. The transforms may be performed in software or hardware with no systematic error. Furthermore, the wavelets of the present invention are excellent for energy compaction and compression performance. These coefficients are received by the ordering/modeling block 103.

The ordering/modeling block 103 provides coefficient ordering and modeling. The coefficient ordering provides an embedded data stream. The embedded data stream allows a resulting codestream to be quantized at encode time, transmission time, or decode time. In one embodiment, ordering/modeling block 103 orders and converts the coefficients into sign-magnitude format and, based on their significance (as described below later), the formatted coefficients are subjected to an embedded modeling method. In one embodiment, the formatted coefficients are subjected to joint spatial/frequency modeling.

The results of ordering and modeling comprise decisions (or symbols) to be coded by the entropy coder. In one embodiment, all decisions are sent to a single coder. In another embodiment, decisions are labeled by significance, and decisions for each significance level are processed by different (physical or virtual) multiple coders.

Referring back to FIG. 2, the bit stream(s) resulting from JSF context model block 201 are encoded in order of significance using entropy coder 104. In one embodiment, entropy coder 104 comprises one or more binary entropy coders.

Wavelet Decomposition

The present invention initially performs decomposition of an image (in the form of image data) or another data signal using reversible wavelets. In the present invention, a reversible wavelet transform comprises an implementation of an exact-reconstruction system in integer arithmetic, such that a signal with integer coefficients can be losslessly recovered. By using reversible wavelets, the present invention is able to provide lossless compression with finite precision arithmetic. The results generated by applying the reversible wavelet transform to the image data are a series of coefficients.

The reversible wavelet transform of the present invention may be implemented using a set of filters. In one embodiment, the filters are a two-tap low-pass filter and a six-tap high-pass filter. In one embodiment, these filters are implemented using only addition and subtraction operations (plus hardwired bit shifting). Also, in an embodiment of the present invention, the high-pass filter generates its output using the results of the low-pass filter. The resulting high-pass coefficients are only a few bits greater than the pixel depth and the low-pass coefficients are the same as the pixel depth. Because only the low-pass coefficients are repeatedly filtered in a pyramidal decomposition, coefficient resolution is not increased in multi-level decompositions.

In alternate embodiments, the low-pass filter output coefficients could increase in size, instead of high-pass filter output coefficients.

Figure 3A:
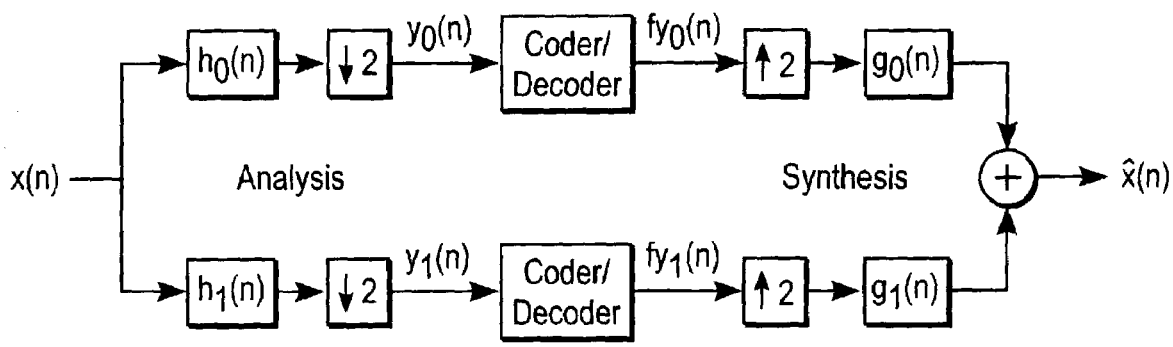
FIG. 3A is a block diagram of a wavelet analysis/synthesis system.

A wavelet transform system is defined by a pair of FIR analysis filters $h_0(n)$, $h_1(n)$, and a pair of FIR synthesis filters $g_0(n)$, $g_1(n)$. In the present invention, $h_0$ and $g_0$ are the low-pass filters and $h_1$ and $g_1$ are the high-pass filters. A block diagram of the wavelet system is shown in FIG. 3A. Referring to FIG. 3A, for an input signal, x(n), the analysis filters $h_0$ and $h_1$ are applied and the outputs are decimated by 2 (critically subsampled) to generate the transformed signals $y_0(n)$ and $y_1(n)$, referred to herein as low-passed (smooth) and high-passed (detail) coefficients respectively. The analysis filters and their corresponding decimation, or subsampling, blocks form the analysis portion of the wavelet transform system. The coder/decoder contain all the processing logic and routines performed in the transformed domain (e.g., prediction, quantization, coding, etc.). The wavelet system shown in FIG. 3A also includes a synthesis portion in which the transformed signals are upsampled by 2 (e.g., a zero is inserted after every term) and then passed through synthesis filters, $g_0(n)$ and $g_1(n)$. The low-passed (smooth) coefficients $y_0(n)$ are passed through the low-pass synthesis filter $g_0$ and the high-passed (detail) coefficients $y_1(n)$ are passed through the high-passed filter $g_1$. The output of filters $g_0(n)$ and $g_1(n)$ are combined to produce $\hat{x}(n)$.

While downsampling and upsampling are performed in some embodiments, in other embodiments, filters are used such that computations which are unneeded due to downsampling and upsampling are not performed.

The wavelet system may be described in terms of the Z-transform, where X(Z), $\hat{X}(Z)$ are the input and output signals respectively, $Y_0(Z)$, $Y_1(Z)$ are the low-passed and high-passed transformed signals, $H_0(Z)$, $H_1(Z)$ the low-pass and the high-pass analysis filters and finally $G_0(Z)$, $G_1(Z)$ are the low-pass and the high-pass synthesis filters. If there is no alteration or quantization in the transform domain, the output $\hat{X}(Z)$ in FIG. 3, is given by $$\hat{X}(Z) = \frac{1}{2}[H_0(Z)G_0(Z) + H_1(Z)G_1(Z)]X(Z) +$$

$$\frac{1}{2}[H_0(-Z)G_0(Z) + H_1(-Z)G_1(Z)]X(-Z).$$

In the present invention, the second term of $\hat{X}(Z)$, referred to as the "aliasing" term, is canceled because the synthesis filters are defined to be the quadrature mirror of the analysis filters, i.e., $$\begin{cases} G_0(Z) = H_1(-Z) \\ G_1(Z) = -H_0(-Z) \end{cases}$$

In terms of the filter coefficients, $$\begin{cases} g_0(n) = (-1)^n h_1(n) \\ g_1(n) = -(-1)^n h_0(n) \end{cases}$$

Therefore, for a quadrature mirror filter pairs, after substitution, the output is:

$$\hat{X}(z) = \frac{1}{2}[H_0(Z)H_1(-Z) - H_1(Z)H_0(-Z)]X(Z).$$

Figure 6:
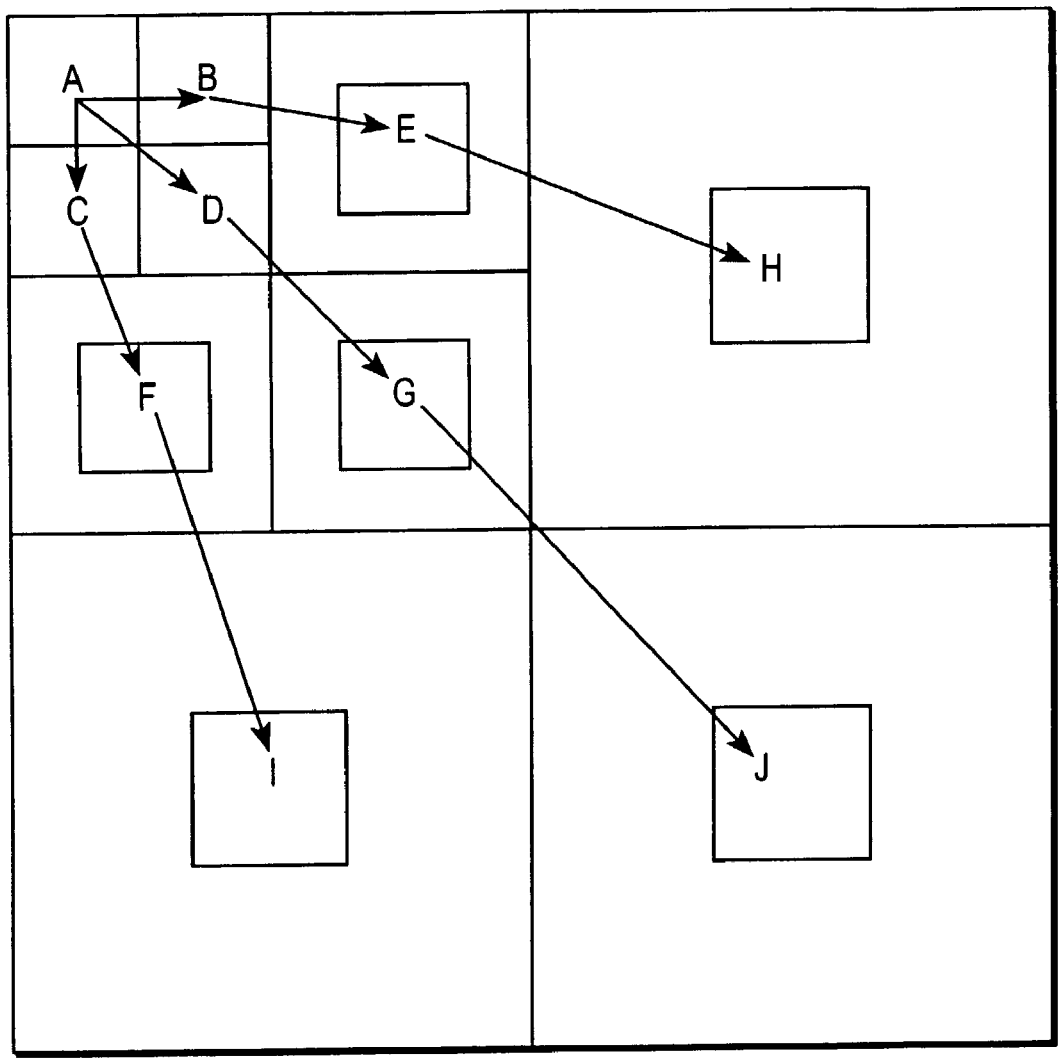
FIG. 6 illustrates the parental relationship between two consecutive levels.

Thus, in the quadrature mirror system of the present invention, the output is defined in terms of the analysis filters only. The wavelet transform is applied recursively to the transformed signals in that the outputs generated by the filters are used as inputs, directly or indirectly, into the filters. In the described embodiment, only the low-passed transformed component $y_0(n)$ is recursively transformed such that the system is pyramidal. An example of such a pyramidal system is shown in FIG. 6.

The Z transform is a convenient notation for expressing the operation of hardware and/or software on data. Multiplication by $Z^{-m}$ models a m clock cycle delay in hardware, and an array access to the mth previous element in software. Such hardware implementations include memory, pipestages, shifters, registers, etc.

In the present invention, the signals, $x(n)$ and $\hat{x}(n)$, are identical up to a multiplicative constant and a delay term, i.e. in terms of the Z-transform, $$\hat{X}(Z) = cZ^{-m}X(Z).$$

This is called an exact reconstruction system. Thus, in one embodiment of the present invention, the wavelet transform initially applied to the input data is exactly reconstructable.

One embodiment of the present invention using the Hadamard Transform is an exact reconstruction system, which in normalized form has the following representation in the Z-domain:

$$\begin{cases} H_0(Z) = \frac{1}{\sqrt{2}}(1+Z^{-1}) \\ H_1(Z) = \frac{1}{\sqrt{2}}(1-Z^{-1}) \end{cases}$$

After substitution, the output is $$\hat{X}(Z) = Z^{-1}X(Z),$$

which is clearly an exact-reconstruction. For more information on the Hadamard Transform, see Anil K. Jain, Fundamentals of Image Processing, pg. 155.

A reversible version of the Hadamard Transform is referred to herein as the S-transform. For more information on S-transform, see Said, A. and Pearlman, W. "Reversible Image Compression via Multiresolution Representation and Predictive Coding," Dept. of Electrical, Computer and Systems Engineering, Renssealaer Polytechnic Institute, Troy, N.Y. 1993. Since the Hadamard Transform is an exact reconstruction transform, the following unnormalized version (which differs from the Hadamard Transform by constant factors) is also an exact reconstruction transform:

$$\begin{cases} h_0(Z) = \frac{1}{2}(1+Z^{-1}) \\ h_1(Z) = 1 - Z^{-1} \end{cases}$$

Given the samples of the input signal as $x_0$, $x_1$, the S-transform is a reversible implementation of this system as, $$\begin{cases} y_0(0) = \lfloor (x(0) + x(1))/2 \rfloor \\ y_1(0) = x(0) - x(1) \end{cases}$$

The S-transform may be defined by the outputs with a generic index, n, as follows:

$$\begin{cases} s(n) = \left\lfloor \dfrac{x(2n) + x(2n+1)}{2} \right\rfloor \\ d(n) = x(2n) - X(2n+1) \end{cases}$$

Note that the factor of two in the transform coefficients addressing is the result of an implied subsampling by two. This transform is reversible and the inverse is:

$$\begin{cases} x(2n) = s(n) + \left\lfloor \dfrac{d(n)+1}{2} \right\rfloor \\ x(2n+1) = s(n) - \left\lfloor \dfrac{d(n)}{2} \right\rfloor \end{cases}$$

The notation $\lfloor . \rfloor$ means to round down or truncate and is sometimes referred to as the floor function. Similarly, the ceiling function $\lceil . \rceil$ means round up to the nearest integer.

The proof that this implementation is reversible follows from the fact that the only information lost in the approximation is the least significant bit of $x(0)+x(1)$. But since the least significant bits of $x(0)+x(1)$ and $x(0)-x(1)$ are identical, this can be recovered from the high-pass output $y_1(0)$. In other words, $$\begin{cases} x(0) = y_0(0) + \lfloor (y_1(0)+1)/2 \rfloor \\ x(1) = y_0(0) - \lceil (y_1(0)-1)/2 \rceil \end{cases}$$

The S-transform is a non-overlapping transform using minimal length reversible filters. Minimal length filters comprise a pair of filters, where both filters have two taps. Minimal length transforms do not provide good energy compaction. Minimal length filters implement a non-overlapped transform because the length of the filters is equal to the number of filters. Overlapped transforms use at least one filter which has length greater than the number of filters. Overlapped transforms using longer (non-minimal length) filters can provide better energy compaction. The present invention provides non-minimal length reversible filters which permits an overlapped transform.

Another example of an exact-reconstruction system comprises the Two/Six (TS)-Transform which has the Z-domain definition, $$\begin{cases} H_0(Z) = \frac{1}{\sqrt{2}}(1+Z^{-1}) \\ H_1(Z) = \frac{1}{8\sqrt{2}}(-1-Z^{-1}+8Z^{-2}-8Z^{-3}+Z^{-4}+Z^{-5}) \end{cases}$$

After substitution, the output is $$\hat{X}(Z) = 2Z^{-3}X(Z),$$

which is an exact-reconstruction transform.

The rational unnormalized version of the TS-transform comprises:

$$\begin{cases} h_0(Z) = \frac{1}{2}(1+Z^{-1}) \\ h_1(Z) = \frac{1}{8}(-1-Z^{-1}+8Z^{-2}-8Z^{-3}+Z^{-4}+Z^{-5}) \end{cases}$$

If $x(0)$, $x(1)$, ... $x(5)$ are six samples of the signal, then the first three low-passed coefficients $y_0(0)$, $y_0(1)$, $y_0(2)$ and the first high-passed coefficient $y_1(0)$ are given by:

$$\begin{cases} y_0(0) = \lfloor (x(0)+x(1))/2 \rfloor \\ y_0(1) = \lfloor (x(2)+x(3))/2 \rfloor \\ y_0(2) = \lfloor (x(4)+x(5))/2 \rfloor \end{cases}$$

$$y_1(0) = \lfloor (-(x(0)+x(1))) + 8(x(2)-x(3)) + (x(4)+x(5))/8 \rfloor.$$

However, the straight forward implementation of the rational unnormalized version of the TS-transform is not reversible. The following example shows that the implementation is non-reversible locally. A longer sequence can be constructed as an example for the global case. Since $-(x(0)+x(1))+(x(4)+x(5)) \neq -y_0(0)+y_0(2)$ because of rounding to compute $y_0(0)$ and $y_0(2)$, this transform is not reversible using local information.

For example, if $x(0)=1$, $x(1)=1$, $x(2)=3$, $x(3)=1$, $x(4)=1$, $x(5)=1$, then $y_0(0)=\lfloor (1+1)/2 \rfloor=1$ $y_0(1)=\lfloor (3+1)/2 \rfloor=2$ $y_0(2)=\lfloor (1+1)/2 \rfloor=1$ $y_1(0)=\lfloor [-(1+1)+8(3-1)+(1+1)]/8 \rfloor=\lfloor (-2+16+2)/8 \rfloor=2$ and if $x(0)=1$, $x(1)=2$, $x(2)=4$, $x(3)=1$, $x(4)=1$, $x(5)=1$, then $y_0(0)=\lfloor (1+2)/2 \rfloor=1$ $y_0(1)=\lfloor (4+1)/2 \rfloor=2$ $y_0(2)=\lfloor (1+1)/2 \rfloor=1$ $y_1(0)=\lfloor [-(1+2)+8(4-1)+(1+1)]/8 \rfloor=\lfloor 23/8 \rfloor=2$ Since $y_0(0)$, $y_0(1)$, $y_0(2)$ and $y_1(0)$ are the same for two different sets of inputs $x(0)$ ... $x(5)$, the transform is not reversible, since given $y_0(0)$, ... $y_1(0)$ it cannot be determined from this local information which of the two sets were input. (Note that it can be proved that the transform is not reversible using global information from all coefficients.)

Now consider a reversible TS-transform, which is referred to herein as an RTS-transform, which provides a different high-pass filtering operation.

If $x(0)$, $x(1)$, $x(2)$, $x(3)$, $x(4)$, $x(5)$ are 6 samples of the signal, then the first three low-passed coefficients $y_0(0)$, $y_0(1)$, $y_0(2)$ and the first high-passed coefficient $y_1(0)$ are given by, $$\begin{cases} y_0(0) = \lfloor (x(0)+x(1))/2 \rfloor \\ y_0(1) = \lfloor (x(2)+x(3))/2 \rfloor \\ y_0(2) = \lfloor (x(4)+x(5))/2 \rfloor \end{cases}$$

$$\begin{aligned} y_1(0) &= \lfloor (-\lfloor (x(0)+x(1))/2 \rfloor + 4(x(2)-x(3)) + \lfloor (x(4)+x(5))/2 \rfloor + 2)/4 \rfloor \\ &= \lfloor (-y_0(0) + 4(x(2)-x(3)) + y_0(2) + 2)/4 \rfloor. \end{aligned}$$

Since $x(2)-x(3)=y_1(0)-\lfloor -(y_0(0)-y_0(2)+2)/4 \rfloor$ then $x(2)-x(3)$ is completely known. With $y_0(1)=\lfloor (x(2)+x(3))/2 \rfloor$ and $x(2)-x(3)$ and $x(2)-x(3)$ defined above, $x(2)$ and $x(3)$ may be recovered because the least significant bits of $x(0)+(1)$ and $x(0)-x(1)$ are identical.

Specifically, let $d(0)=x(2)-x(3)=y_1(0)-\lfloor (-Y_0(0)+y_0(2)+2)/4 \rfloor$ $x(2)=y_0(1)+\lfloor (d(0)+1)/2 \rfloor$ $x(3)=y_0(1)+\lceil (d(0)-1)/2 \rceil$ In one embodiment of the RTS-transform, as well as that of the S-transform, a divide-by-eight is implemented as a divide-by-two and then a divide-by-four in order to provide additional accuracy. Note that mathematically the equation $$\frac{1}{8}(-1-Z^{-1}+8Z^{-2}-8Z^{-3}+Z^{-4}+Z^{-5}+4)$$

and the equation $$\frac{1}{4}\left(\frac{1}{2}(-1-Z^{-1})+4(Z^{-2}-Z^{-3})+\frac{1}{2}(Z^{-4}+Z^{-5})+2\right)$$

are the same when performed with infinite precision arithmetic. The reason the second equation represents a reversible filter is apparent when physically implemented with integer arithmetic. Exemplary hardware implementations of the low-pass filter and the high-pass filter are described in conjunction with FIGS. 16 and 17.

Note that in both the S-transform and the RTS-transform, the low-pass filter is implemented so that the range of the input signal x(n) is the same as the output signal $y_0$(n). For example, if the signal is an 8-bit image, the output of the low-pass filter is also 8 bits. This is an important property for a pyramidal system where the low-pass filter is successively applied because in prior art systems the range of the output signal is greater than that of the input signal, thereby making successive applications of the filter difficult. In addition, the low-pass filter has only two taps which makes it a non-overlapping filter. This property is important for the hardware implementation, as is described below later.

In a more generic format, the reversible TS-transform is defined by the expression of the two outputs of a low-pass and a high-pass filter:

$$\begin{cases} s(n) = \left\lfloor \dfrac{x(2n)+x(2n+1)}{2} \right\rfloor \\ d(n) = \left\lfloor -\dfrac{\left\lfloor \dfrac{x(2n)+x(2n+1)}{2}\right\rfloor + 4(x(2n+2)-x(2n+3)) + \left\lfloor \dfrac{x(2n+4)+x(2n+5)}{2}\right\rfloor}{4} \right\rfloor \end{cases}$$

The expression for d(n) can be simplified and written with the use of s(n) (moreover the integer division by 4 can be rounded by adding a 2 to the numerator). These result in:

$$\begin{cases} s(n) = \left\lfloor \dfrac{x(2n)+x(2n+1)}{2} \right\rfloor \\ d(n) = x(2n+2)-(2n+3) + \left\lfloor \dfrac{-s(n)+s(n+2)+2}{4} \right\rfloor \end{cases}$$

The TS-transform is reversible and the inverse is:

$$\begin{cases} x(2n) = s(n) + \left\lfloor \dfrac{p(n)+1}{2} \right\rfloor \\ x(2n+1) = s(n) - \left\lfloor \dfrac{p(n)}{2} \right\rfloor \end{cases}$$

where p(n) must first be computed by, $$p(n) = d(n-1) - \left\lfloor \dfrac{-s(n-1)+s(n+1)+2}{4} \right\rfloor$$

The results from the low-pass filter may be used twice (in the first and third terms) in the high-pass filter. Therefore, only two other additions need to be performed to arrive at the results of the high-pass filter.

The TS-transform, in addition to being reversible, is also efficient. Hence, it lends itself quite well to lossless compression. The TS-transform (like the S-transform) has no growth in the smooth output, i.e., if the input signal is b bits deep, so is the smooth output. This is useful for in pyramidal systems, defined in the next section, where the smooth output is decomposed further. There is no systemic error due to rounding in the integer implementation of the transform, so all error in a lossy system can be controlled by quantization.

Among the four filters participating in a wavelet transform, the low-pass synthesis filter is the most important because it combines the quantized coefficients and also smooths the artifacts. This fact has led to the choice of a relatively long (six-tap) and particularly well behaved filter for the low-pass synthesis filter in the present invention. Note that in a QMF system, there are only two independent filters.

Figure 3B:
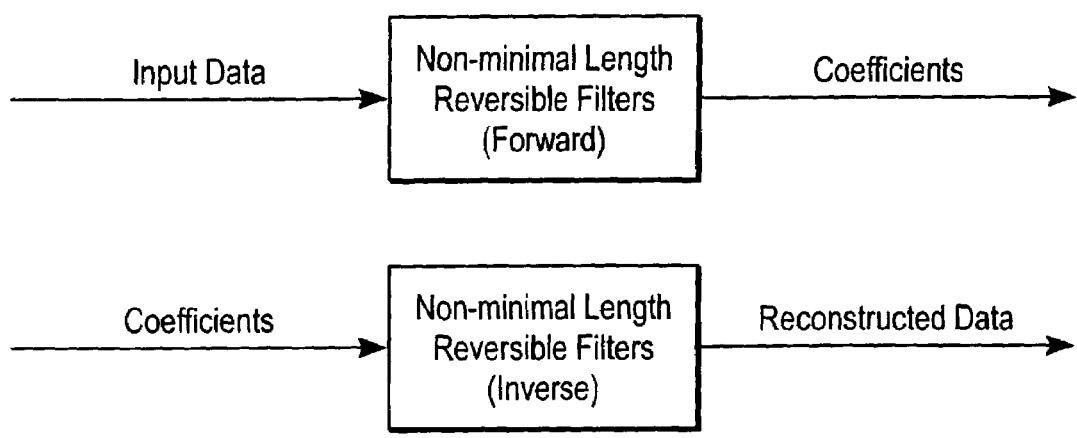
FIG. 3B illustrates forward and reverse representations of transform systems for filtering with non-overlapped minimal length reversible filters.

Many overlapped, non-minimal length reversible filters may be used in the present invention. Such forward and inverse representations of the transform system for filtering with non-overlapped minimal length reversible filters is shown in FIG. 3B. For instance, the following class of filters may be used in the present invention. For an integer L≧z, $$d(0)=x(2(\lfloor L/2 \rfloor+1))-x(2(\lfloor L/2 \rfloor+1)+1)$$

and $$y_0(0)=\lfloor (x(0)+x(1))/2 \rfloor$$

$$y_0(1)=\lfloor (x(2)+x(3))/2 \rfloor$$

$$y_0(L-1)=\lfloor (x(2\lfloor (L-1)/2 \rfloor)+x(2\lfloor (L-1)/2 \rfloor+1))/2 \rfloor$$

and $$y_1(0) = \dfrac{\sum_{i=0}^{\lfloor L/2 \rfloor} a_i y_0(i) + bd(0) + \sum_{j=\lfloor L/2 \rfloor+2}^{L-1} c_i y_0(j) + \left\lfloor \dfrac{k}{2} \right\rfloor}{k}$$

The length of the high-pass filter is 2L. If L is odd, the filter may be closer to a symmetric filter. If $a_i$, b, $c_i$ and k are integers and k≦b, then the filter is reversible. If $a_i$, b, $c_i$, and k are powers of two (or the negative or complement of a power of two), then the implementation of the filter may be simplified. If k=b (regardless of the values of $a_i$ and $c_i$) then the range of the output of the high-pass filter $y_1$ is minimized. For each $a_i$, if there is exactly one $c_j$ where $a_i=-c_j$, then the high-pass filter will have no response to a constant input. If $a_i=-c_j$ when j-(L-1)=i, then the filter may be closer to a symmetric filter.

Another useful property is $$\sum_{i=0}^{\lfloor L/2 \rfloor} [(a_i)(2i)^m + (a_i)(2i+1)^m] + (b)(2\lfloor 1/2 \rfloor +1)^m - $$
$$(b)(2\lfloor 1/2 \rfloor +1)+1)^m + \sum_{j=\lfloor L/2 \rfloor +2}^{L-1} [c_j(2j)^m + c_j(2j+1)^m] = 0$$

This makes the high-pass filter have no response to a linearly changing input when m=1 and a quadratically changing input when m=2, etc., where m is the moment condition. This property is the principle reason that the RTS-transform has better energy compaction than the S-transform.

While filters must meet the minimum constraints for reversibility, for different applications, filters may be used that meet none, some or all of the other properties. In some embodiments, one of the following example high-pass filters is used. The filters are listed in a notation that just lists the integer coefficients of the rational version of the filter, to avoid obscuring the invention.

```
   1  1  -4  -4  16 -16   4   4  -1  -1
   1  1  -3  -3   8  -8   3   3  -1  -1
  -1 -1   0   0  16 -16   0   0   1   1
  -1 -1   4   4 -16 -16 256 -256 16  16 -4 -4  1  1
   3  3 -22 -22 128 -128 22  22  -3  -3
```

The last filter is referred to as the (Two/Ten) TT-filter, and it has the property that it has no response to a cubically increasing function. Note—that since 22=16+2×3 and 3=2+1, this filter can be implemented with a total of seven additions and subtractions.

Figure 4:
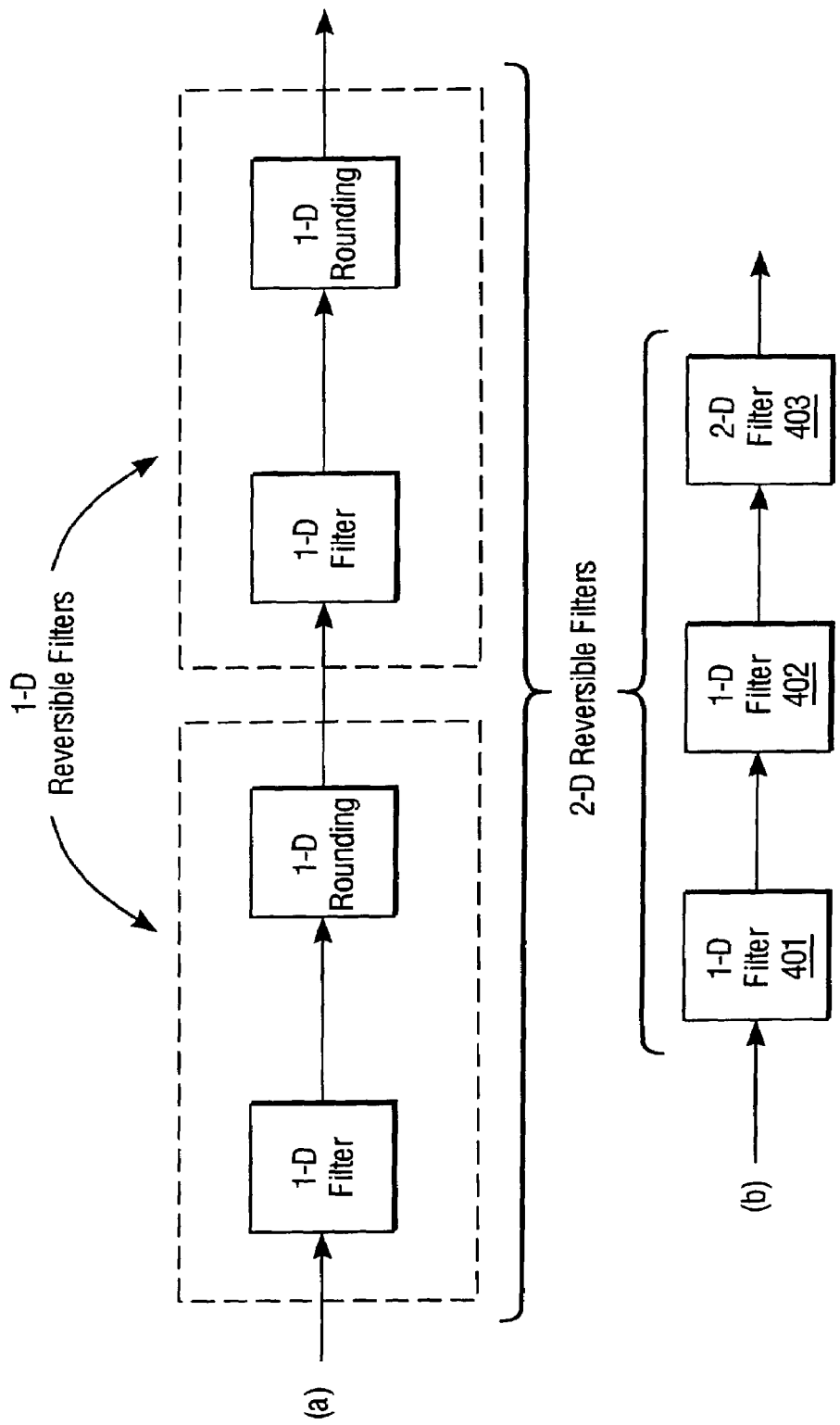
FIG. 4 is a block diagram illustrating alternative embodiments of a 2-D reversible filter.

In one embodiment, the filters can be combined and applied to a block, such that both the horizontal and the vertical passes are performed in one operation. FIG. 4 illustrates the filters to perform the combined operation. Configuration (a) shows the use of two separate 1-D reversible filters, one for each pass, that include a 1-D filter and 1-D rounding. Configuration (b) shows a 1-D filter 401, followed by another 1-D filter 402, ending with a 2-D rounding operation 403. This configuration produces more precise results in that it allows for better rounding.

The strict reversibility requirements for filters can be relaxed by noting the following. High pass coefficients are encoded and decoded in the some order. Pixel values corresponding to previously decoded high pass coefficients are known exactly, so they can be used in current high pass filtering. For example, the following filter can be used when a raster order is used.

$$H_1(Z) = \left\lfloor \frac{1}{4}\left(\left\lfloor -\frac{1}{2}(1+Z^{-1})\right\rfloor + \left\lfloor \frac{1}{2}(8(Z^{-2}-Z^{-3})+(Z^{-4}+Z^{-5}))\right\rfloor + 2\right)\right\rfloor$$

The use of a single fixed high-pass filter is not required. Adaptive filters may be used or multiple filters may be used. The data used to adapt or select among multiple filters must be restricted to data that is available in the decoder prior to a particular inverse filtering operation.

One way to use multiple filters is to process the high-pass coefficients progressively. Alternate high-pass filtering operations ($y_1(0)$, $y_1(2)$, $y_1(4)$, . . . ) may be processed first with a reversible filter such as the RTS high-pass filter. The remaining processing ($y_1(1)$, $y_1(3)$, $y_1(5)$, . . . ) may use a non-reversible filter of up to six taps, because the exact values of the inputs to the overlap portion of the filter are known. For example, any of the following filters may be used.

```
  -1  3 -3  1
  -1  4 -4  1
  -3  8 -8  3
  1 -5 10 -10  5 -1
  1 -4  8  -8  4 -1
```

Note that QMF filters are not used in some embodiments.

In some embodiments, the high pass filter may be replaced with a prediction/interpolation operation. A predictor/interpolator may predict the difference between a pair of inputs using any data that is available in the decoder prior to a particular prediction/interpolation operation. The predicted difference is subtracted from the actual difference of the inputs and the result is outputted. In one embodiment, prior art prediction methods used in DPCM, progressive coding or spatial domain coding are used.

In one embodiment, non-linear filters may be used, such as morphological filters (e.g., a median filter). In one embodiment, the 1,1 filter is used in conjunction with a different filter for the highpass. Such a filter system must be able to transmit the difference between two pixels. Based on any data the decoder has, a prediction can be made as to what the difference should be. A non-linear morphological filter may be used to do the estimate. The present invention computes the median around a pixel using the actual pixels on the causal side of the window and inputting them into the filter. On the non-causal side of the filter, the low pass coefficients are used instead of pixel values.

Two-Dimensional Wavelet Decomposition

Using the low-pass and high-pass filters of the present invention, a multi-resolution decomposition is performed. The number of levels of composition is variable and may be any number; however, currently the number of decomposition levels equals from two to five levels.

The most common way to perform the transform on two-dimensional data, such as an image, is to apply the one-dimensional filters separately, i.e., along the rows and then along the columns. The first level of decomposition leads to four different bands of coefficients, referred to herein as LL, HL, LH, and HH. The letters stand for low (L) and high (H) corresponding to the application smooth and detail filters defined above respectively. Hence, the LL band consist of coefficients from the smooth filter in both row and column directions. It is common practice to place the wavelet coefficients in the format as in FIGS. 5A–5D.

Each subblock in a wavelet decomposition can be further decomposed. The most common practice is to only decompose the LL subblock further, but this can be done a number of times. Such a multiple decomposition is called pyramidal decomposition (FIGS. 5A–5D). The designation LL, LH, HL, HH and the decomposition level number denote each decomposition. Note that with either filters, S or TS, of the present invention, pyramidal decomposition does not increase the coefficient size.

Figure 5A:
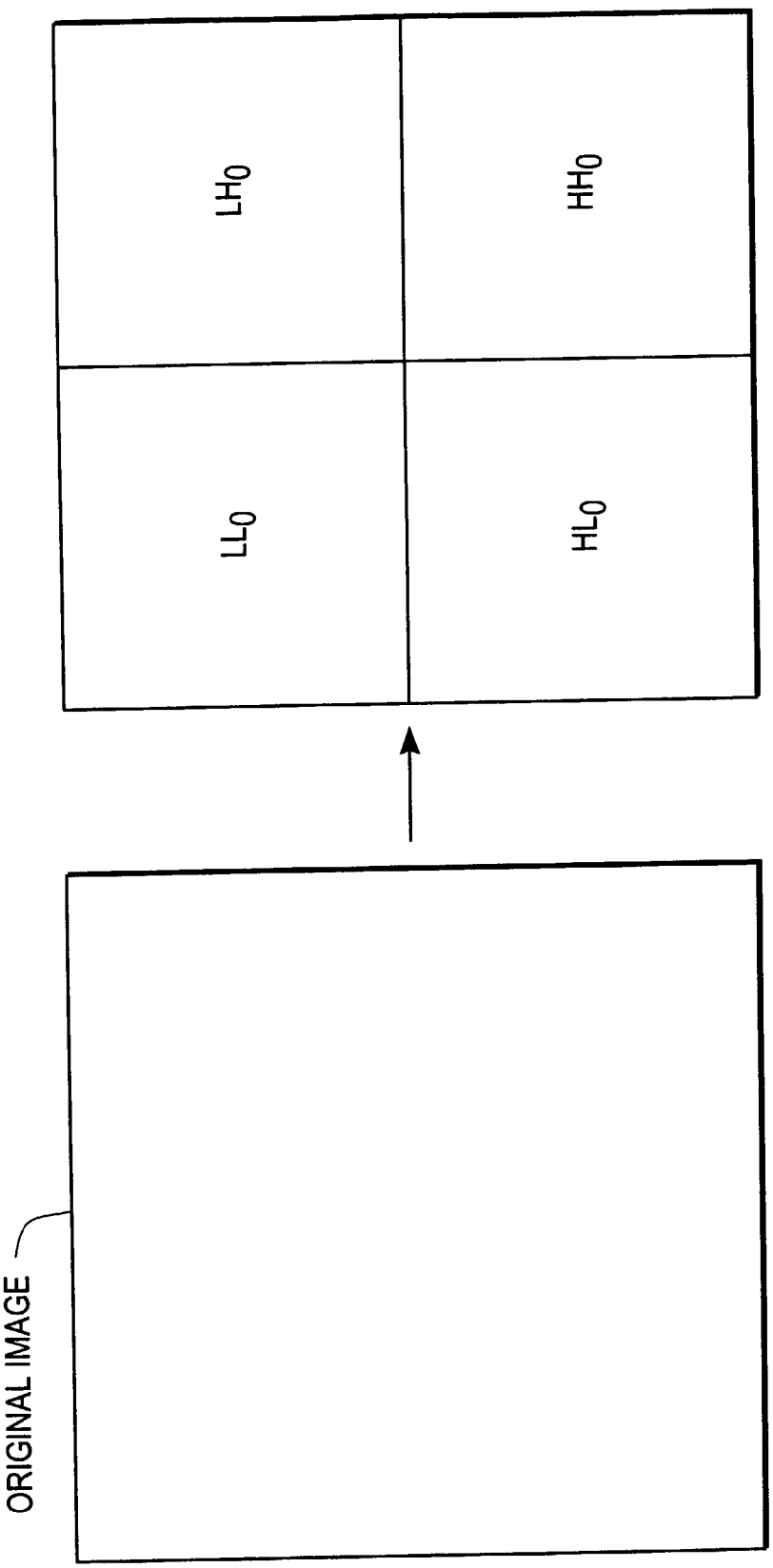
FIG. 5 illustrate results of performing a four level decomposition.

For example, if the reversible wavelet transform is recursively applied to an image, the first level of decomposition operates on the finest detail, or resolution. At a first decomposition level, the image is decomposed into four sub-images (e.g., subbands). Each subband represents a band of spatial frequencies. The first level subbands are designated $LL_0$, $LH_0$, $HL_0$ and $HH_0$. The process of decomposing the original image involves subsampling by two in both horizontal and vertical dimensions, such that the first level subbands $LL_0$, $LH_0$, $HL_0$ and $HH_0$ each have one-fourth as many coefficients as the input has pixels (or coefficients) of the image, such as shown in FIG. 5A.

Subband $LL_0$ contains simultaneously low frequency horizontal and low frequency vertical information. Typically a large portion of the image energy is concentrated in this subband. Subband $LH_0$ contains low frequency horizontal and high frequency vertical information (e.g., horizontal edge information). Subband $HL_0$ contains high frequency horizontal information and low frequency vertical information (e.g., vertical edge information). Subband $HH_0$ contains high frequency horizontal information and high frequency vertical information (e.g., texture or diagonal edge information).

Figure 5B:
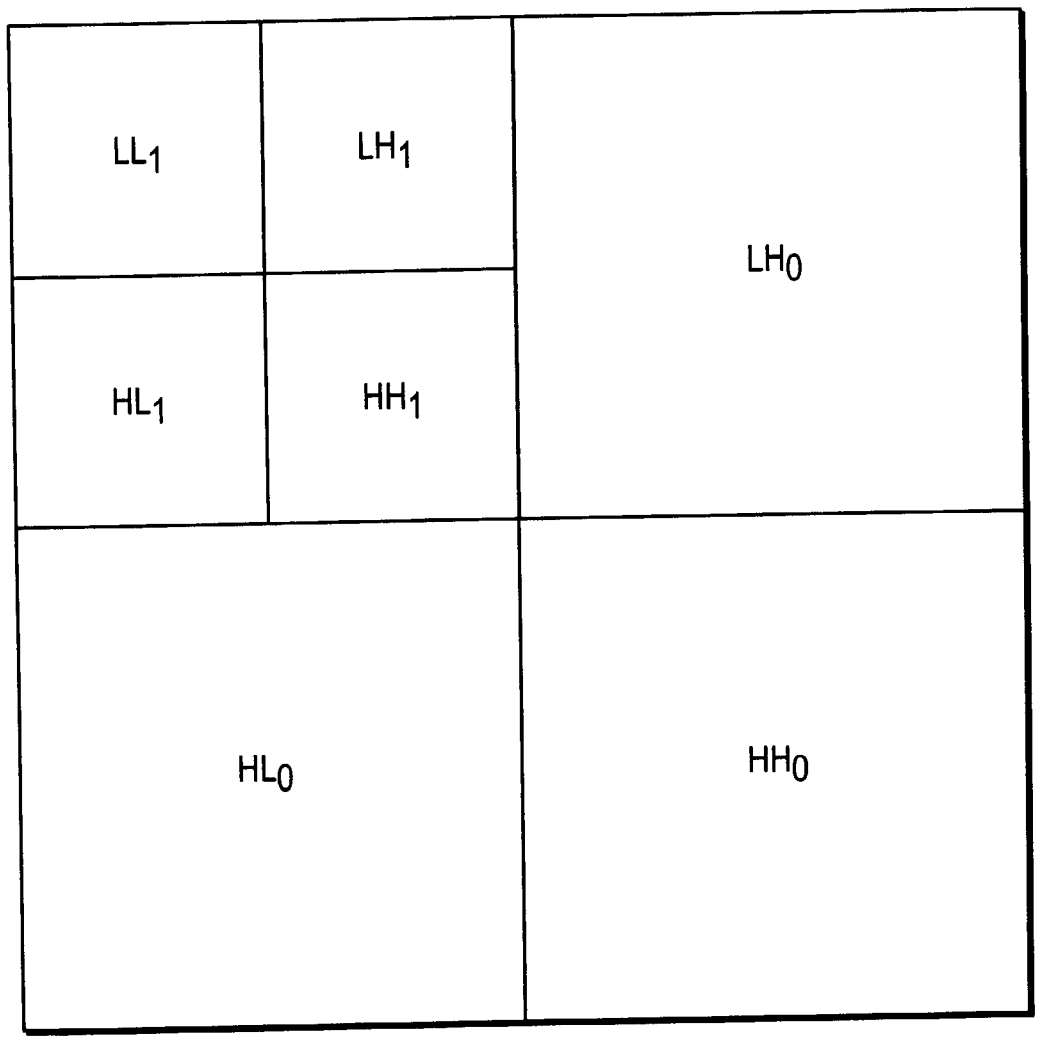
Figure 5C:
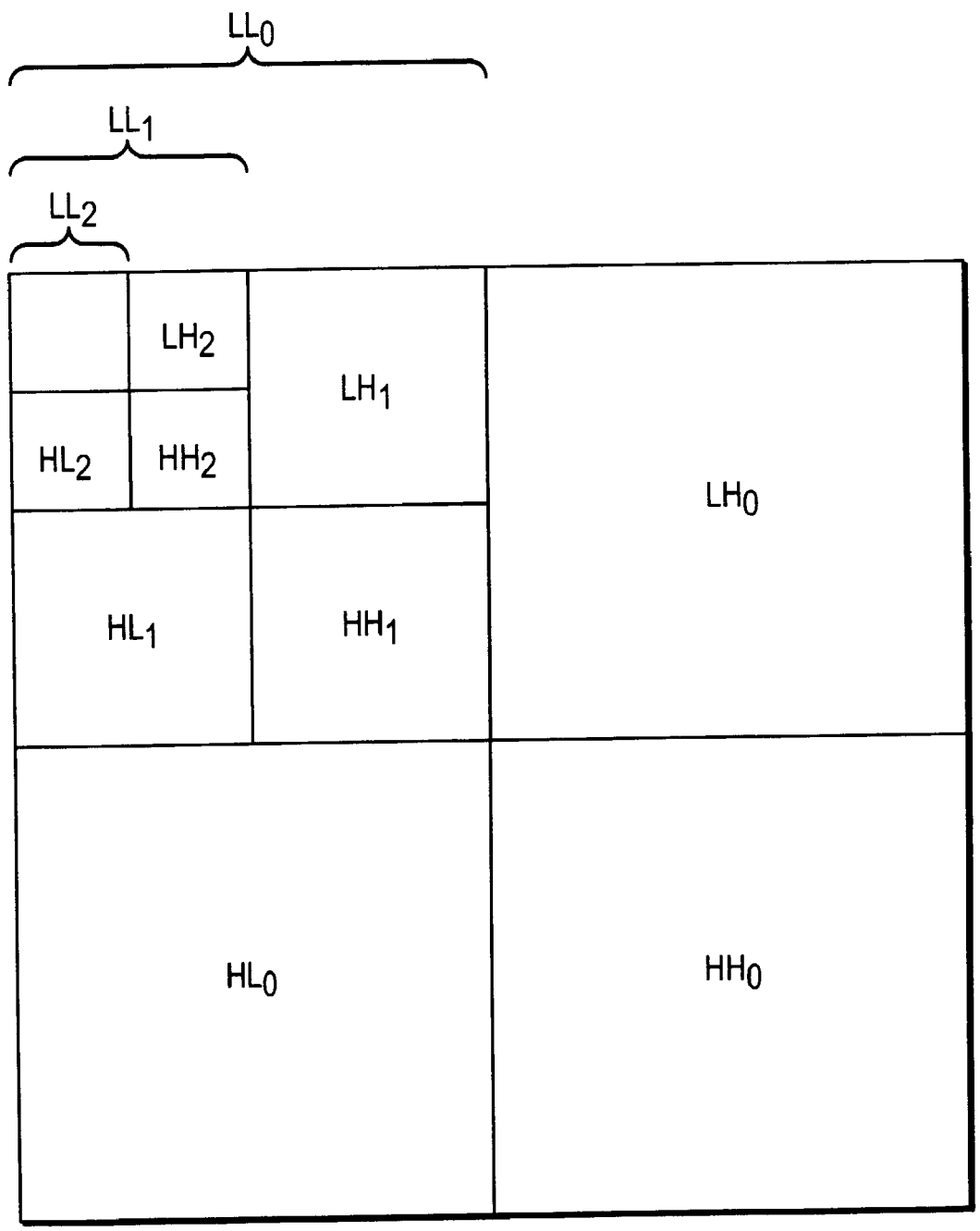
Figure 5D:
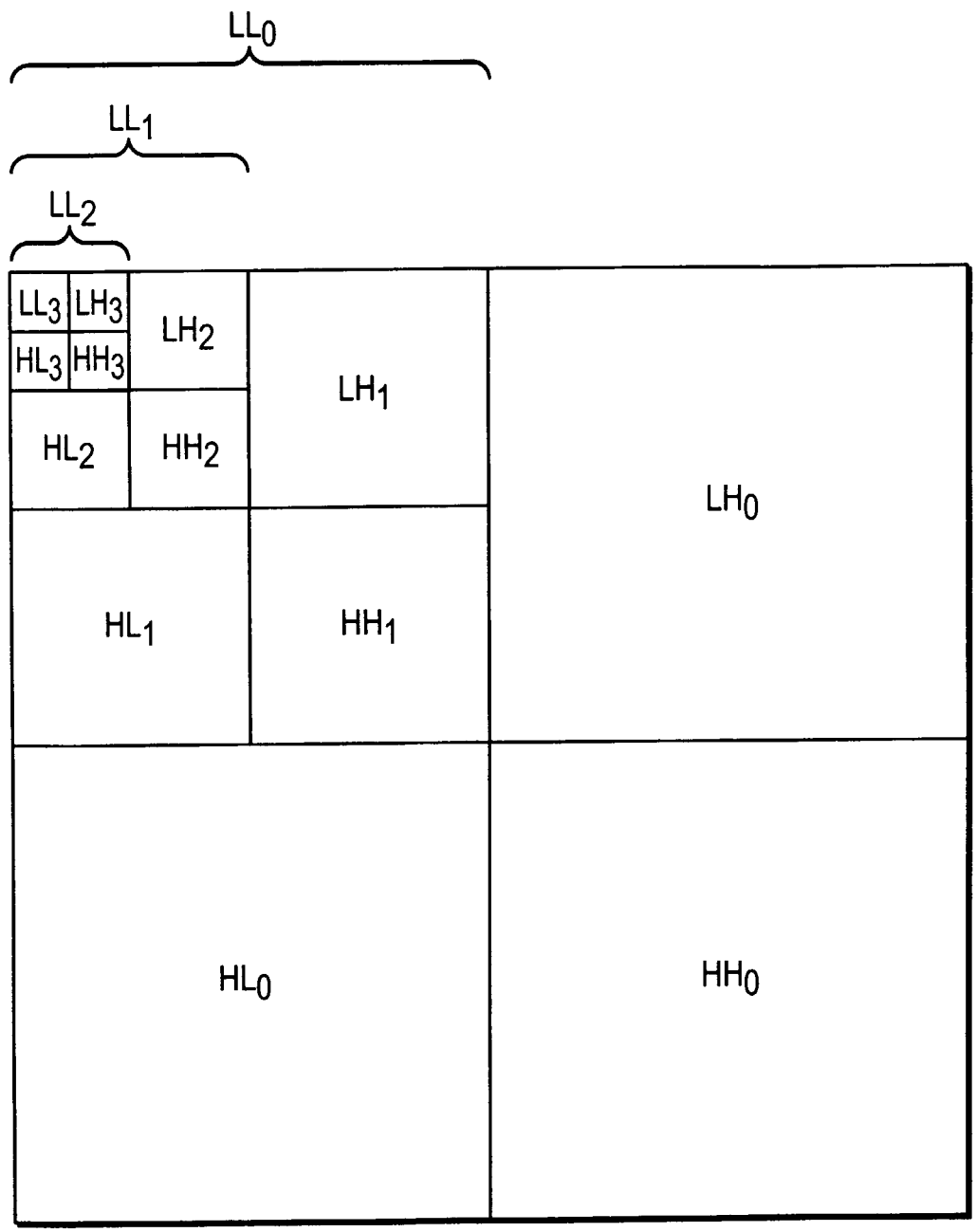

Each of the succeeding second, third and fourth lower decomposition levels is produced by decomposing the low frequency LL subband of the preceding level. This subband $LL_0$ of the first level is decomposed to produce subbands $LL_1$, $LH_1$, $HL_1$ and $HH_1$ of the moderate detail second level, as shown in FIG. 5B. Similarly, subband $LL_1$ is decomposed to produce coarse detail subbands $LL_2$, $LH_2$, $HL_2$ and $HH_2$ of the third level, as shown in FIG. 5C. Also, subband $LL_2$ is decomposed to produce coarser detail subbands $LL_3$, $LH_3$, $HL_3$ and $HH_3$ of the third level, as shown in FIG. 5D. Due to subsampling by two, each second level subband is one-sixteenth the size of the original image. Each sample (e.g., pel) at this level represents moderate detail in the original image at the same location. Similarly, each third level subband is 1/64 the size of the original image. Each pel at this level corresponds to relatively coarse detail in the original image at the same location. Also, each fourth level subband is 1/256 the size of the original image.

Since the decomposed images are physically smaller than the original image due to subsampling, the same memory used to store the original image can be used to store all of the decomposed subbands. In other words, the original image and decomposed subbands $LL_0$ and $LL_1$ are discarded and are not stored in a three level decomposition.

Although only four subband decomposition levels are shown, additional levels could be developed in accordance with the requirements of a particular system. Also, with other transformations such as DCT or linearly spaced subbands, different parent-child relationships may be defined.

There is a natural and useful tree structure to wavelet coefficients in a pyramidal decomposition. Note that there is a single LL subblock corresponding to the last level of decomposition. On the other hand, there are an many LH, HL, and HH bands as the number of levels. The tree structure defines the parent of a coefficient in a frequency band to be a coefficient in a same frequency band at a lower resolution and related to the same spatial locality. FIG. 6 shows the parental relationship between two consecutive levels.

Referring to FIG. 6, the coefficient at A is the direct parent to B, C, and D but is also parent to the coefficients that have B, C and D as parents. Specifically, B is parent to the four coefficients around E and the sixteen coefficients around H, etc.

Figure 7:
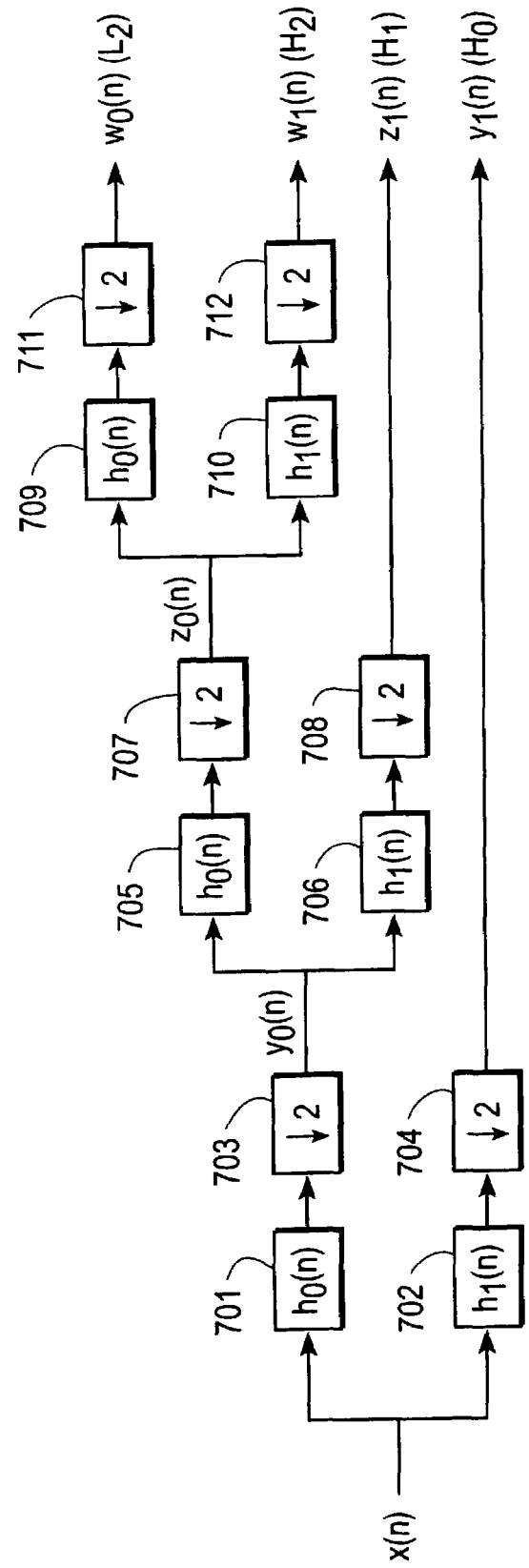
FIG. 7 is a block diagram of a three-level pyramidal transform.

The process of multi-resolution decomposition may be performed using a filtering system, such as that depicted in FIG. 7. An input signal representing a one-dimensional signal with length L is low-pass and high-pass filtered by filter units 701 and 702 before being subsampled by two via units 703 and 705. A subsampled output signal from unit 703 is low-pass and high-pass filtered by units 705 and 706 before being subsampled by two via units 707 and 708, respectively. Subband components L and H appear at respective outputs of units 707 and 708. Similarly, the output signal from unit 705 is low-pass and high-pass filtered by units 709 and 710 before being subsampled by units 711 and 712, respectively. Subband components L and H appear at respective outputs of units 711 and 712. As described above, the filters in one embodiment of the present invention used in subband decomposition are digital quadrature mirror filters for splitting the horizontal and vertical frequency bands into low frequency and high frequency bands.

Figure 8:
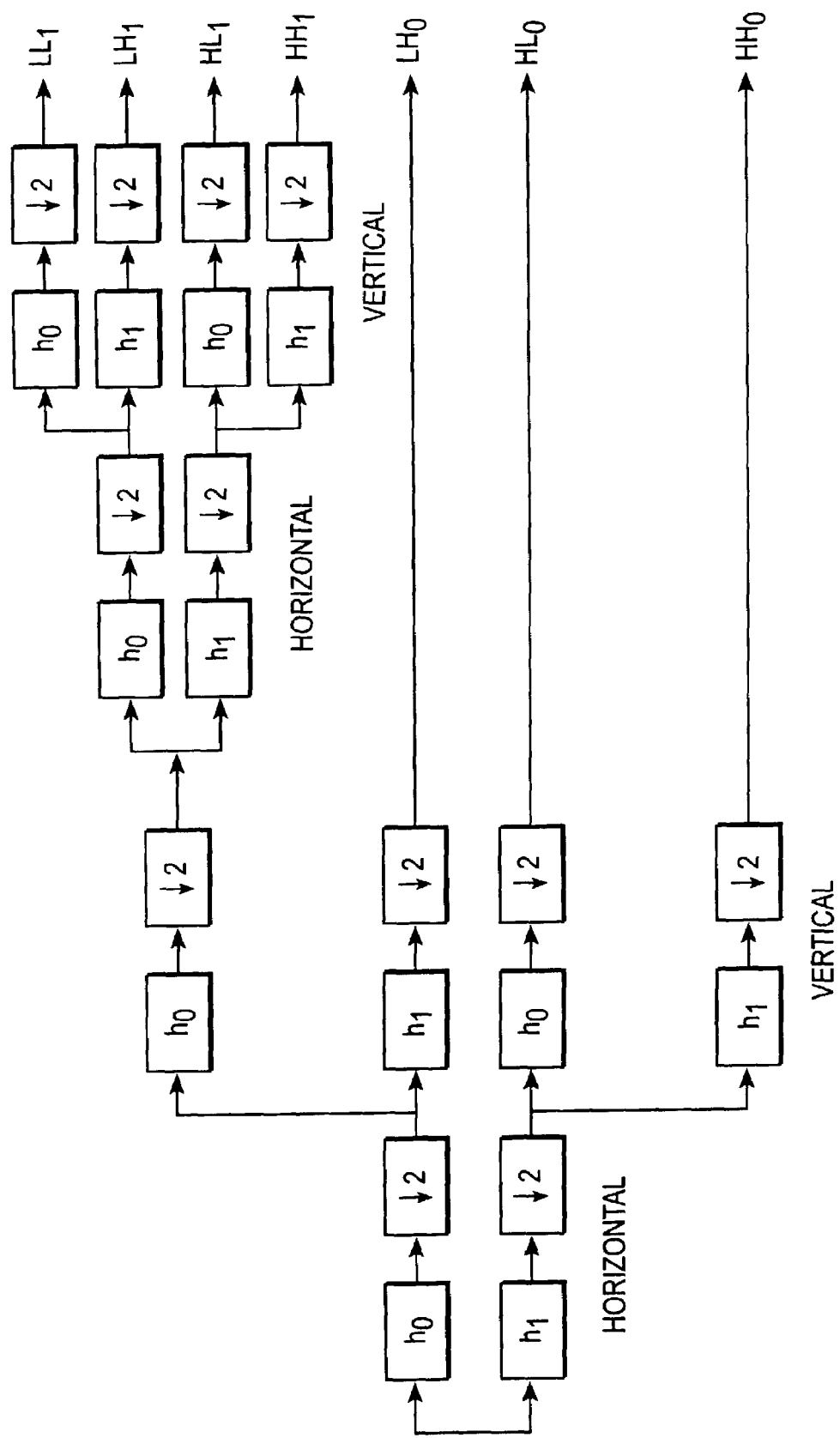
FIG. 8 is a block diagram of a two-dimensional, two level transform.
Figure 9:
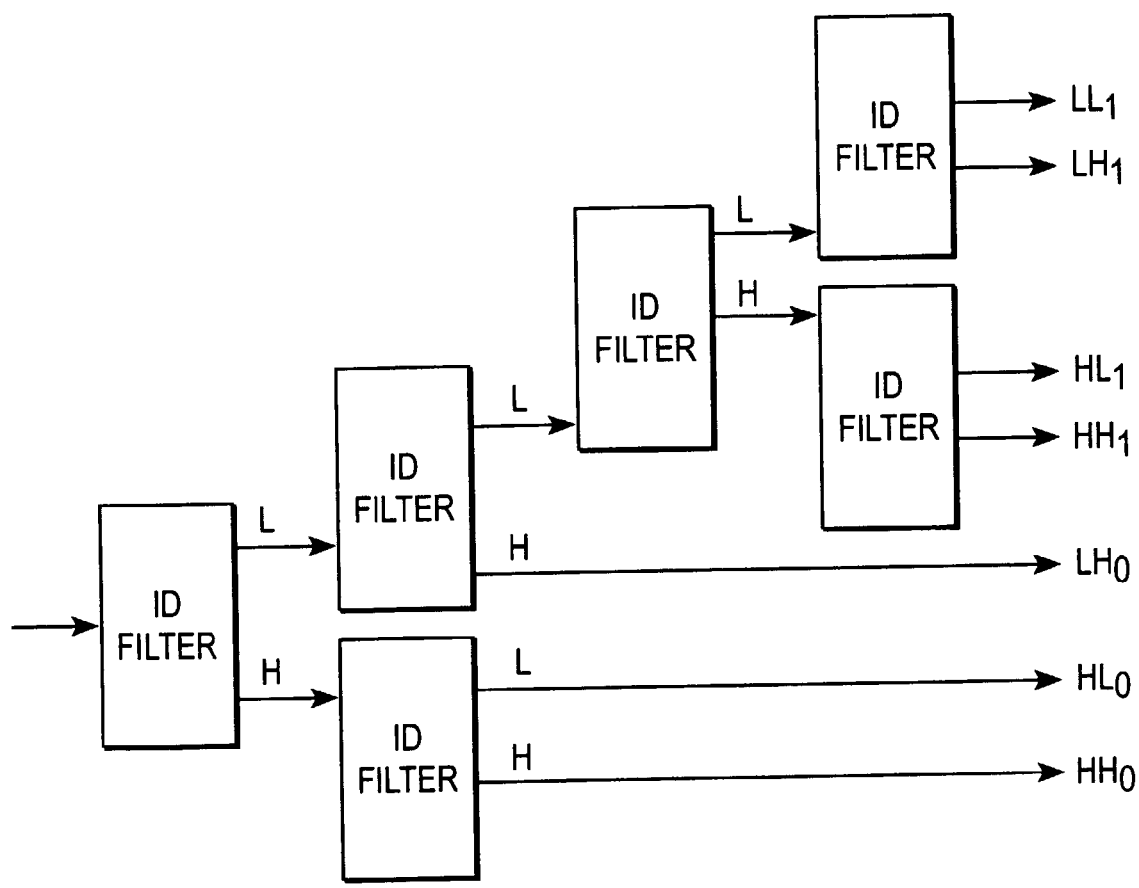
FIG. 9 is a block diagram illustrating one-dimensional filters performing a multi-resolution decompression.

FIG. 8 illustrates a two-dimensional, two-level transform. FIG. 9 also illustrates a two-dimensional, two-level transform implemented using one-dimensional filters, such as those shown in FIGS. 16 and 17. The one-dimensional filters are applied at every other position, to avoid computation rendered unnecessary by subsampling. In one embodiment, one-dimensional filters share computation between low-pass and high-pass computation.

Figure 10:
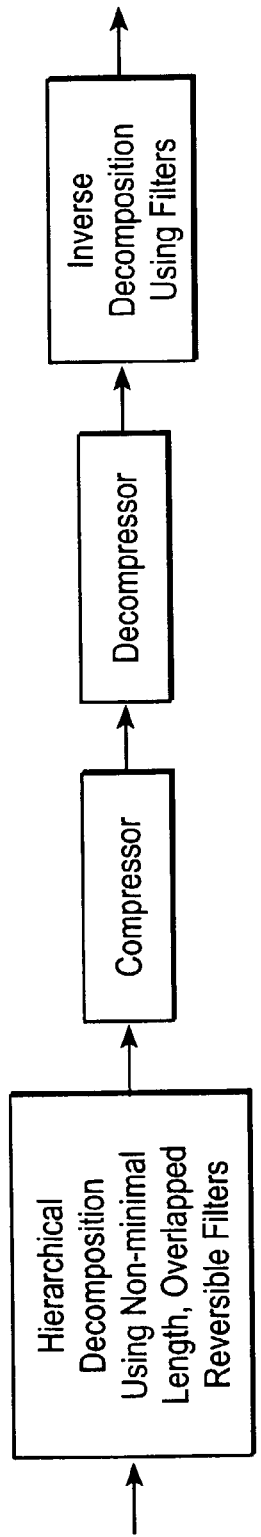
FIG. 10 is a block diagram of a system using the reversible wavelets of the present invention.

Therefore, the present invention provides a system for compression and decompression in which non-minimal length, overlapped reversible filters are used. FIG. 10 is a block diagram of one embodiment of such a system. Referring to FIG. 10, hierarchical decompression is initially performed. The results of the hierarchical decomposition are sent to a compressor for compression. The compression performed may include vector quantization, scalar quantization, zero run length coding, Huffman coding, Tunstall, etc. The output of the compressor compresses data representing a compressed version of the original input data. A decompressor may receive the data at sometime in the future and decompress the data. The present invention then performs an inverse decomposition using non-minimal length, overlapped reversible filters to generate a reconstructed version of the original data. Note that the non-minimal length, overlapped reversible filters comprise non-S transform filters.

Figure 11:
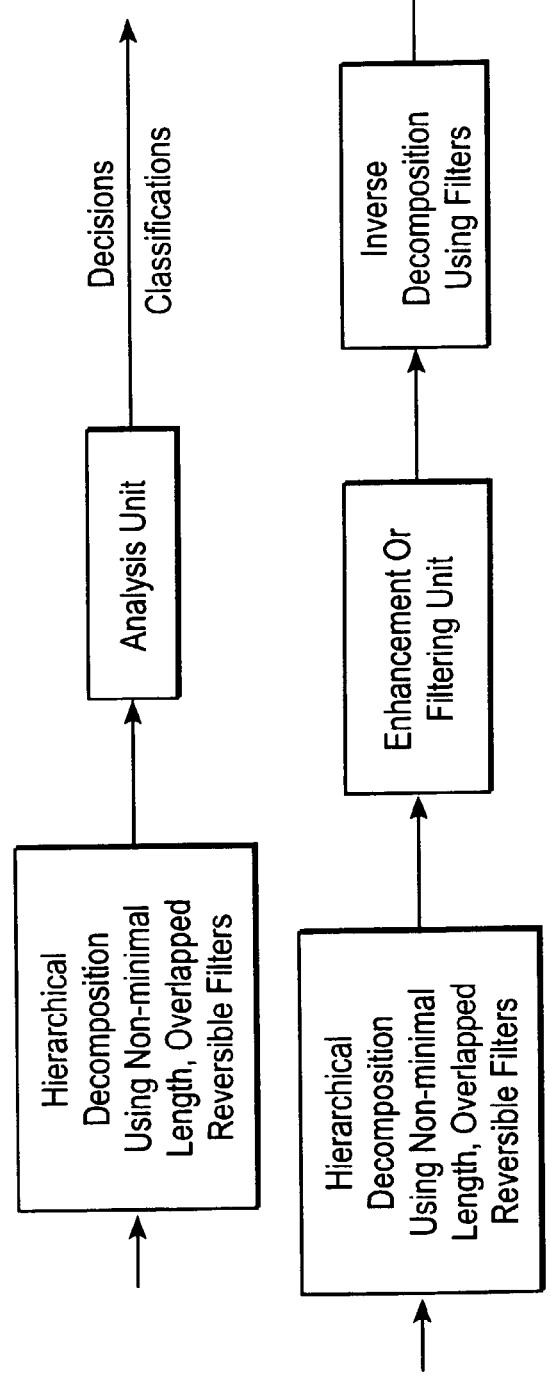
FIG. 11 are block diagrams of enhancement and analysis system using the reversible wavelets of the present invention.

The reversible wavelet filters of the present invention may also be used in exemplary analysis and enhancement systems, such as shown in FIG. 11. Referring to FIG. 11, hierarchical decomposition is performed on input data using non-minimal length, overlapped reversible wavelet filters. The analysis unit receives the coefficients generated by the filters and classifies them into decisions, e.g., rather than encoding the coefficients completely, only relevant information is extracted. For example, in a document archiving system, blank pages might be recognized using only the coarsest low-pass subband. Another example would be to only use high pass information from a particular subband to distinguish between image of text and images of natural scenes. The hierarchical decomposition may be used for registering multiple images, such that coarse registration is done first with coarse subbands. In another embodiment, the coefficients undergo enhancement or filtering followed by inverse decomposition. Sharpening, edge enhancements, noise control, etc. may be performed using a hierarchical decomposition. Thus, the present invention provides a wavelet transform for use in joint time/space and frequency domain analysis and filtering/enhancement systems.

Ordering and Modeling of the Coefficients and Bit Planes

In the present invention, the coefficients generated as a result of the wavelet decomposition are entropy coded. In the present invention, the coefficients initially undergo embedded coding in which the coefficients are ordered in a visually significant order or, more generally, ordered with respect to some error metric (e.g., distortion metric). Error or distortion metrics include peak error, and mean squared error (MSE). Additionally, ordering can be performed to give preference to bit-significance spatial location, relevance for data base querying, and directionally (vertical, horizontal, diagonal, etc.).

The ordering of the data is performed to create the embedded quantization of the codestream. In the present invention, two ordering systems are used: a first for ordering the coefficients and a second for ordering the binary values within a coefficient. The ordering of the present invention produces a bitstream that is thereafter coded with a binary entropy coder.

In one embodiment, the coefficient ordering and modeling comprises M-ary coding. In an alternate embodiment, it may be embedded by band only, instead of by bit. Also, for lossless coding or single quality lossy coding (e.g., quantization specified at the encoder), non-embedded coding may be used in the coefficient ordering and modeling.

Coding Unit

In the present invention, a coding unit is a rectangular set of trees that are coded independently of the rest of the image. The coding unit represents the smallest unit of coded data (although there are quantization options that would allow partial coding units to be decoded). All of the data in a coding unit is available to the encoder at one time, e.g., buffered in memory.

The choice of a coding unit is implementation dependent. The coding unit may be defined as the entire image (or other data set) or a single tree of the present invention or any rectangle in between. In one embodiment, the choice of a coding unit may entail a compromise between compression efficiency and memory usage.

In one embodiment, all the coefficients within a coding unit are available in random access memory. Since all coefficients within a coding unit are available in random access memory, the embedding order between the coefficients within a coding unit can be any arbitrary order. This order is known to both the encoder and the decoder. But since the entropy coder is causal with respect to this ordering, the order has a significant impact on the compression and is chosen with care. One embodiment of particular ordering is described below.

Modeling

In the present invention, joint spatial/frequency modeling comprises an embedded coding system used to encode the coefficients generated by the wavelet transform of the present invention. The joint space/frequency modeling takes advantage of both the known frequency bands and the neighboring pixels (or data). One embodiment of the joint space/frequency modeling is referred to herein as horizon modeling.

The data is initially formatted in sign magnitude format, which is followed by the data being sorted based on significance. In another embodiment, to further reduce workspace memory, the coefficients could be stored in a magnitude/mantissa form instead of a sign/magnitude.

After the data is sorted with respect to the given significance metric, the data is encoded.

Assuming a digital signal, x(n), for each x(n) is represented with R bits of precision, then the embedded coding of the present invention encodes the most significant bit (or bits) of every x(n) of the signal, then the next significant bit (or bits) and so on. For example, in the case of visually defined ordering, an image that requires better quality in the center than along the corners or near the edges (such as some medical images) may be subjected to encoding such that the low-order bits of the central pixels might be coded prior to the higher-order bits of the boundary pixels.

Bit-Significance Representation

In one embodiment, the embedded order used for binary values within a coefficient is by bit-plane. The coefficients are expressed in bit-significance representation. Bit-significance is a sign-magnitude representation where the sign bit, rather than being the most significant bit (MSB), is encoded with the first non-zero magnitude bit.

There are three types of bits in a number represented in bit-significance form: head, tail, and sign. The head bits are all the zero bits from the MSB to the first non-zero magnitude bit plus the first non-zero bit. The bit-plane where the first non-zero magnitude bit occurs defines the significance of the coefficient. The bits after the first non-zero magnitude bit to the LSB are the tail bits. The sign bit simply denotes the sign. A number with a non-zero bit as the MSB has only one head bit. A zero coefficient has no tail or sign bits.

In the case where the values are non-negative integers, such as occurs with respect to the intensity of pixels, the order that may be used is the bitplane order (e.g., from the most significant to the least significant bitplane). In embodiments where two's complement negative integers are also allowed, the embedded order of the sign bit is the same as the first non-zero bit of the absolute value of the integer. Therefore, the sign bit is not considered until a non-zero bit is coded. For example, using sign magnitude notation, the 16-bit number −7 is:

1000000000000111

On a bit-plane basis, the first twelve decisions will be "insignificant" or zero. The first 1-bit occurs at the thirteenth decision. Next, the sign bit ("negative") will be coded. After the sign bit is coded, the tail bits are processed. The fifteenth and sixteenth decisions are both "1".

Coefficient Alignment

The coefficients in the different subblocks represent different frequencies similar to the FFT or the DCT. The quantization is performed by aligning coefficients with respect to each other before the bit-plane encoding. The less heavily quantized coefficients will be aligned toward the earlier bit-planes (e.g., shifted to the left). Thus, if the stream is truncated, these coefficients will have more bits defining them than the more heavily quantized coefficients.

In one embodiment, the coefficients are aligned for the best rate-distortion performance in terms of SNR or MSE. Alternately, the alignment could allow a physchovisual quantization of the coefficient data. The alignment has significant impact on the evolution of the image quality (or in other words on the rate-distortion curve), but has negligible impact on the final compression ratio of the lossless system.

Figure 12A:
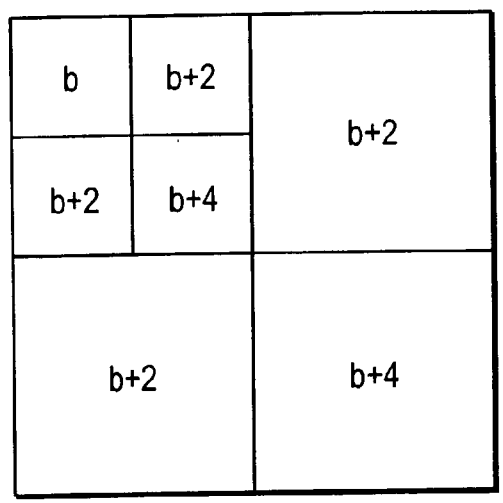
FIG. 12A illustrates coefficient size in the present invention.
Figure 12B:
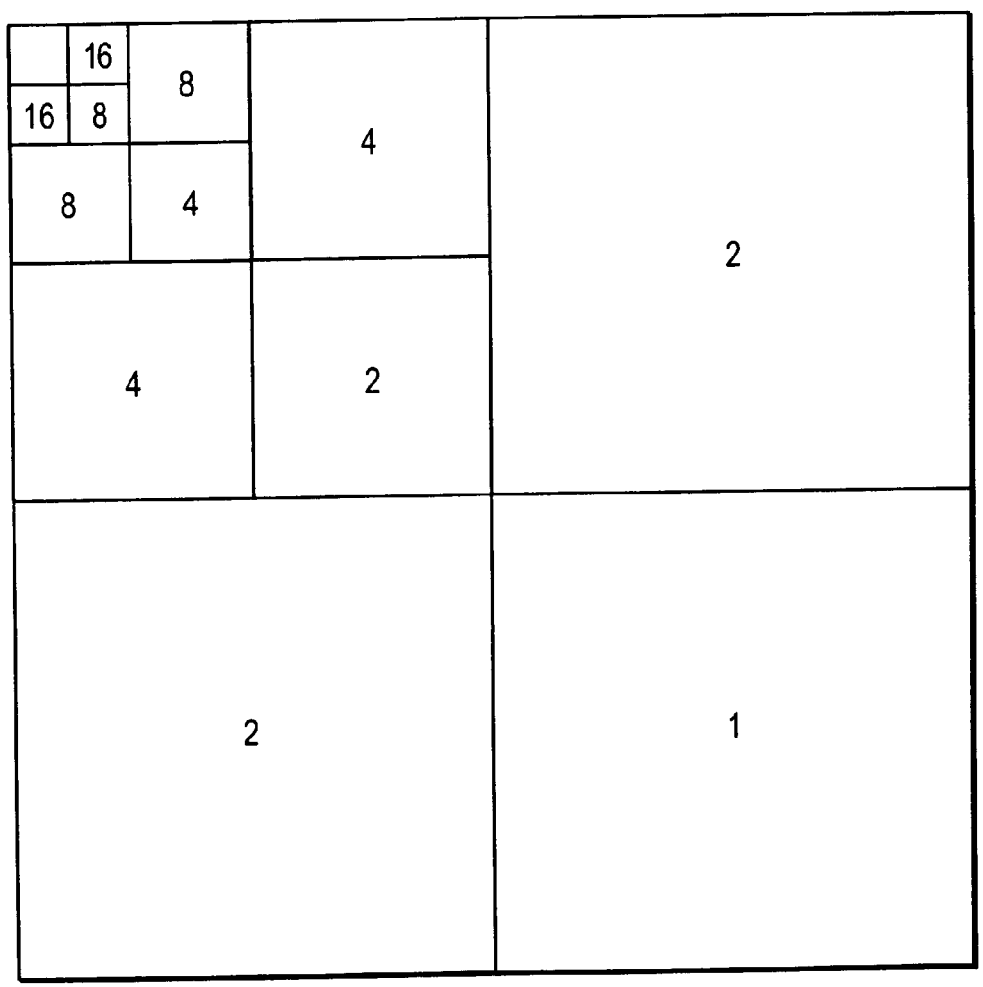
FIG. 12B is one embodiment of the multipliers for the frequency band used for coefficient alignment in the present invention.

The bit depths of the various coefficients in a two-level TS-transform decomposition from an input image with b bits per pixel are shown in FIG. 12. To align the coefficients, the 1-HH coefficient size is used as a reference, and shifts are given with respect to this size. Table 1 shows an example of this alignment process.

TABLE 1

Example of coefficient alignment, b = 8

| 1-HH | Reference | 10 | 9 | 8 | 7 | 6 | 5 | 4 | 3 | 2 | 1 | 0 |
|---|---|---|---|---|---|---|---|---|---|---|---|---|
| x-HL or x-LH | Left 3 | 8 | 7 | 6 | 5 | 4 | 3 | 2 | 1 | 0 | | |
| x-HL or x-LH | Left 2 | | 8 | 7 | 6 | 5 | 4 | 3 | 2 | 1 | 0 | |
| x-HL or x-LH | Left 1 | | | 8 | 7 | 6 | 5 | 4 | 3 | 2 | 1 | 0 |
| x-HL or x-LH | none | | | | 8 | 7 | 6 | 5 | 4 | 3 | 2 | 1 | 0 |
| x-HL or x-LH | Right 1 | | | | | 8 | 7 | 6 | 5 | 4 | 3 | 2 | 1 | 0 |

Note the sign bit is not the MSB and is encoded with the first tail bit. It is important to note that the alignment simply controls the order the bits are sent to the entropy coder. Actual padding, shifting, storage, or coding of extra zero bits is not performed.

Context Model

One embodiment of the Horizon context model used in the present invention is described below. This model uses bits within a coding unit based on the spatial and spectral dependencies of the coefficients. The available binary values of the neighboring coefficients, and parent coefficients can be used to create contexts. The contexts, however, are causal for decodability and in small numbers for efficient adaptation.

Entropy Coding

In one embodiment, the entropy coding performed by the present invention is performed by binary entropy coders. In one embodiment, entropy coder 104 comprises a Q-coder, a QM-coder, a finite state machine coder, a high speed parallel coder, etc. A single coder may be used to produce a single output code stream. Alternately, multiple (physical or virtual) coders may be employed to produce multiple (physical or virtual) data streams.

In one embodiment, the binary entropy coder of the present invention comprises a Q-coder. For more information on the Q-coder, see Pennebaker, W. B., et al., "An Overview of the Basic Principles of the Q-coder Adaptive Binary Arithmetic," *IBM Journal of Research and Development* Vol. 32, pg. 717–26, 1988. In an alternate embodiment, a binary entropy coder uses a QM-coder, which is a well known and efficient binary entropy coder. It is particularly efficient on bits with very high probability skew. The QM-coder is used in both the JPEG and JBIG standards.

The binary entropy coder may comprise a finite state machine (FSM) coder. Such a coder provides the simple conversion from a probability and an outcome to a compressed bit stream. In one embodiment, a finite state machine coder is implemented using table look-ups for both decoder and encoder. A variety of probability estimation methods may be used with such a finite state machine coder. Compression is excellent for probabilities close to 0.5. Compression for highly skewed probabilities depends on the size of the lookup table used. Like the QM-coder, it is useful with embedded bit streams because the decisions are coded in the order of occurrence. There is no possibility for "carry-over" problems because the outputs are defined by a lookup table. In fact, there is a maximum delay between encoding and the production of a compressed output bit, unlike the Q and QM coders. In one embodiment, the finite state machine coder of the present invention comprises a B-coder defined in U.S. Pat. No. 5,272,478, entitled "Method and Apparatus for Entropy Coding", issued Dec. 21, 1993.

In one embodiment, the binary entropy coder of the present invention comprises a high speed parallel coder. Both the QM-coder and the FSM coder require that one bit be encoded or decoded at a time. The high-speed parallel coder handles several bits in parallel. In one embodiment, the high speed parallel coder is implemented in VLSI hardware or multi-processor computers without sacrificing compression performance. One embodiment of a high speed parallel coder that may be used in the present invention is described in U.S. Pat. No. 5,381,145, entitled "Method and Apparatus for Parallel Decoding and Encoding of Data", issued Jan. 10, 1995.

Most efficient binary entropy coders are limited in speed by fundamental feedback loops. A possible solution is to divide the incoming data stream into multiple streams and feed these to parallel encoders. The output of the encoders are multiple streams of variable-length coded data. One problem with this type of approach is how to transmit the data on a single channel. The high speed parallel coder described in U.S. Pat. No. 5,381,145 solves this problem with a method of interleaving these coded data streams.

Many of the contexts used in the present invention are fixed probability, which makes a finite state machine coder, such as the B-coder especially useful. Note when a system using probabilities close to 0.5, both high speed parallel coder disclosed above and the finite state machine coder operate with more efficiency than the Q-coder. Thus, both have a potential compression advantage with the context model of the present invention.

The Encoding and Decoding Process of the Present Invention

Figure 13:
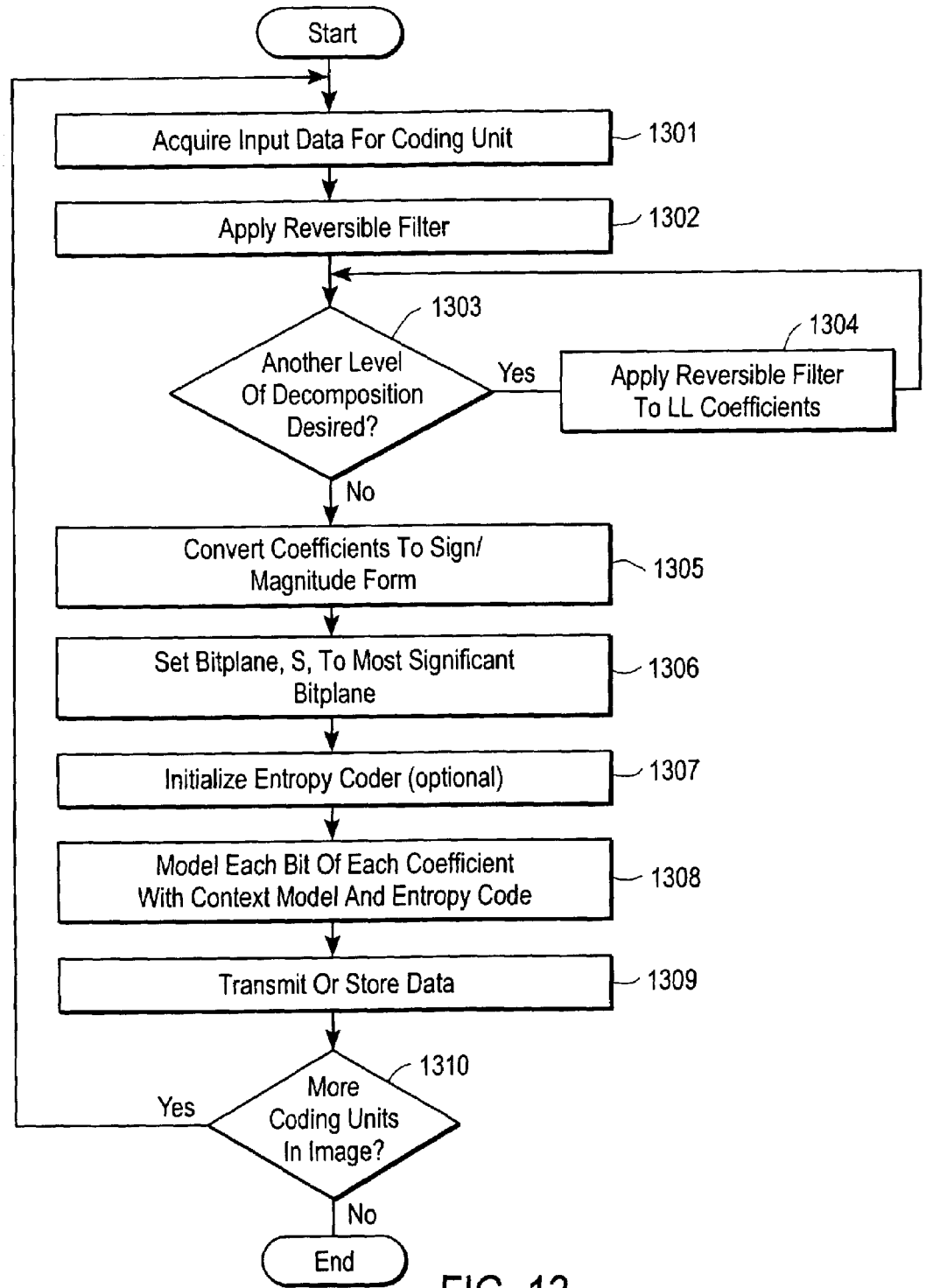
FIG. 13 is a flow chart of one embodiment of the encoding process of the present invention.
Figure 14:
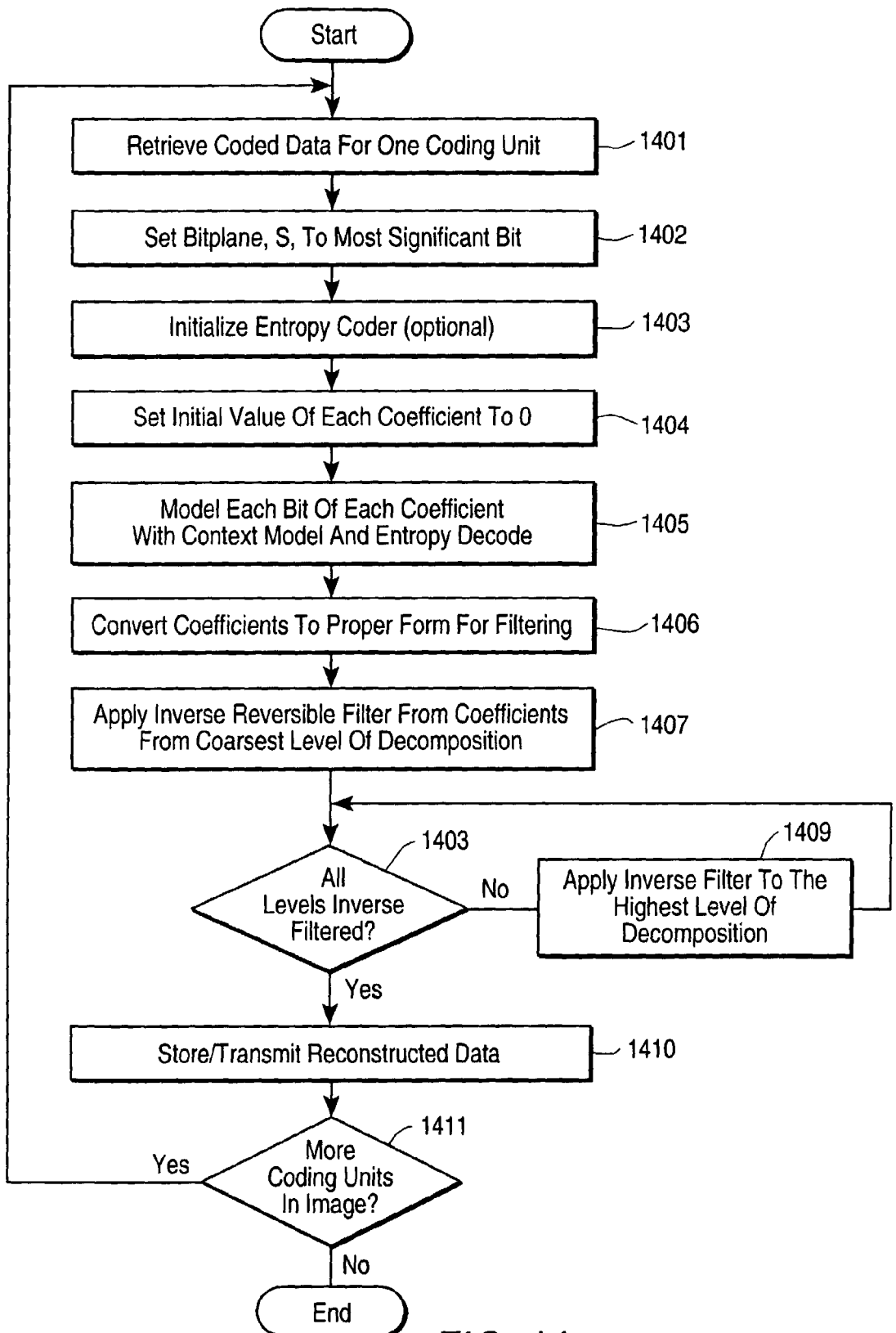
FIG. 14 is a flow chart of one embodiment of the decoding process of the present invention.
Figure 15:
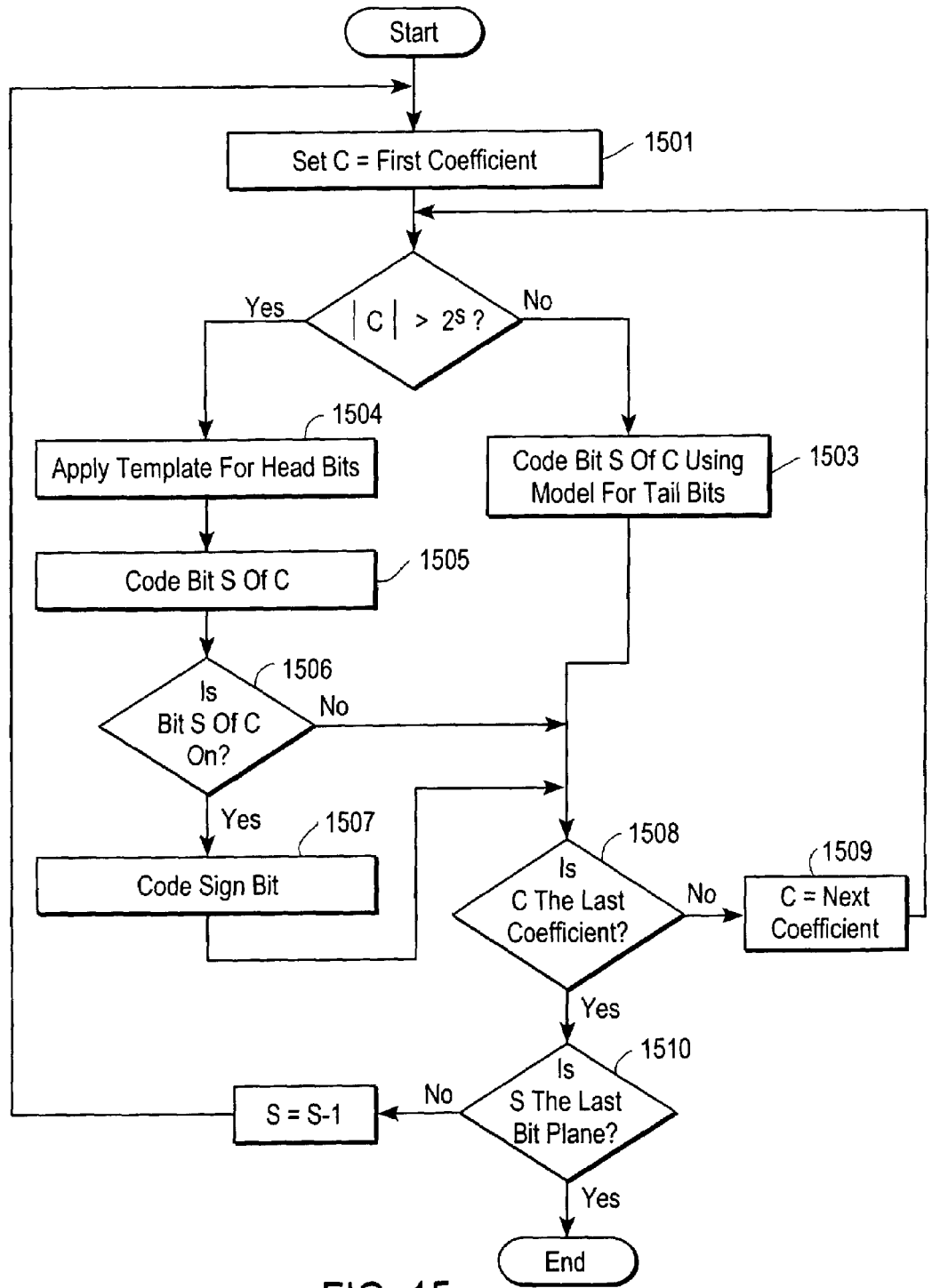
FIG. 15 is a flow chart of the modeling process of the present invention.

The following flow charts, FIGS. 13–15, depict one embodiment of the encoding and decoding processes of the present invention. These processes may be performed in software or with hardware. In either case, references have been made to processing logic, which may represent either.

FIG. 13 illustrates one embodiment of the encoding process of the present invention. Referring to FIG. 13, the encoding process begins by having processing logic acquiring an input data for a coding unit (processing block 1301). Next, processing logic applies reversible filter(s) to the input data unit of the coding unit (processing block 1302).

A test then determines if another level of decomposition is desired (processing block 1303). If so, processing logic applies the reversible filter to all the LL coefficients (processing block 1304), and the process loops back and continues at processing block 1303. If another level of decomposition is not desired, processing continues at processing block 1305 where processing logic converts the coefficients to sign/magnitude form.

After converting coefficients to the sign/magnitude form, a bitplane variable, S, is set to the most significant bitplane (processing block 1306). Then, the processing logic optionally initializes the entropy coder (processing block 1307).

Once the entropy coder has been initialized, processing logic models each bit of each coefficient with the context model and entropy codes the bits (processing block 1308). After entropy coding the bit, the data is either transmitted or stored (processing block 1309).

Thereafter, a test determines if there are any more coding units in the image (processing block 1310). If there are more coding units, processing continues to processing block 1301. On the other hand, if there are no more coding units, then processing ends.

FIG. 14 illustrates one embodiment of the decoding process of the present invention. Referring to FIG. 14, the process begins by processing logic retrieving coded data for one coding unit (processing block 1401). Next, a variable S is set to the most significant bitplane (processing block 1402). After setting the bitplane variable S to the most significant bitplane, processing logic optionally initializes the entropy coder (processing block 1403).

After the entropy coder has been initialized, processing logic sets the initial value of each coefficient to zero (processing block 1404). Then the processing logic models each bit of each coefficient with a context model and entropy decoder (processing block 1405) and converts coefficients to proper form for filtering (processing block 1406). This conversion may convert from bit significance to two's compliment form. Thereafter, the processing logic applies an inverse filter(s) on the coefficients starting from the highest level of decomposition (processing block 1407).

A test then determines if all the levels have been inverse filtered (processing block 1408). If all the levels have not been inverse filtered, processing logic applies the inverse filter(s) on the coefficients from the next highest level of decomposition (processing block 1409), and processing continues at processing block 1408. If all the levels have been inverse filtered, processing continues at processing block 1410 where the reconstructed data is either stored or transmitted. After storing the transmitted reconstructed data, a test determines if there are more coding units (processing block 1411). If there are more coding units, processing loops back and continues at processing block 1401 where the process is repeated. If there are no more coding units, the process ends.

Figure 19A:
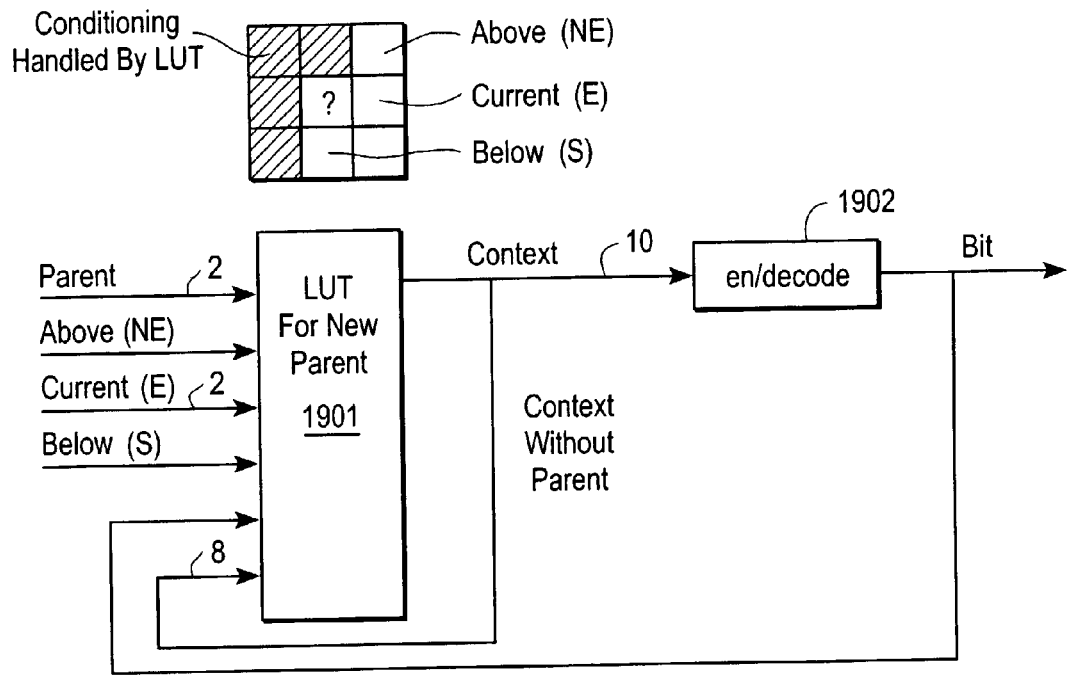
FIGS. 19A and 19B illustrate two embodiments of context models using look-up tables.
Figure 19B:
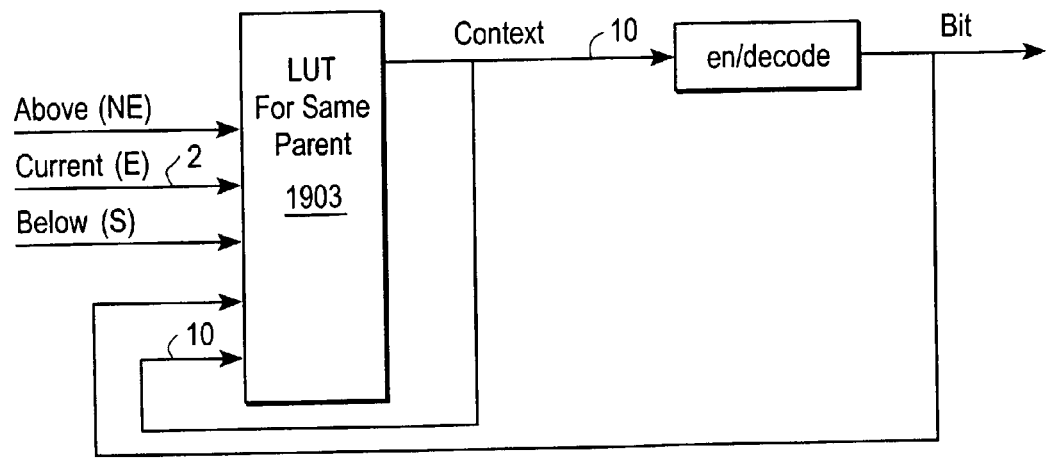

FIG. 15 illustrates one embodiment of the process for modeling bits according to the present invention. Referring to FIG. 15, the process for modeling bits begins by setting a coefficient variable C to the first coefficient (processing block 1501). Then, a test determines if $|c|>2^S$. If yes, processing continues at processing block 1503 where processing logic codes bit S of coefficient C using the model for tail bits and processing continues at processing block 1508. The model for tail bits may be a stationary (non-adaptive) model. If $|c|$ is not greater that $2^S$, then processing continues at processing block 1504 where processing logic applies a template for head bits (i.e., the initial zeros and the first on "1" bit). After applying the template, processing logic codes bit S of coefficient C (processing block 1505). Possible templates are shown in FIGS. 26A–C. Templates may be implemented with LUTs, as shown in FIGS. 19A and 19B.

Next, a test determines if bit S of coefficient C is on (processing block 1506). If bit S of coefficient C is not on, processing continues at processing block 1508. On the other hand, if bit S of coefficient C is on, processing continues at processing block 1507 where processing logic codes the sign bit. Thereafter, processing continues at processing block 1508.

At processing block 1508, a test determines if coefficient C is the last coefficient. If coefficient C is not the last coefficient, processing continues at processing block 1509 where the coefficient variable C is set to the next coefficient and processing continues at processing block 1502. On the other hand, if coefficient C is the last coefficient, processing continues at processing block 1510 where a test determines if S is the last bitplane. If S is not the last bitplane, bitplane variable S is decremented by 1 (processing block 1511) and processing continues at processing block 1501. If S is the last bitplane, processing ends.

Alternative Embodiments of the Present Invention

The present invention may be implemented in hardware and/or software. A hardware implementation of the present invention requires implementation of the wavelet filters, memory/data flow management to provide the data for the filters, a context model to control the embedded coding of the present invention, memory/data flow management to provide the data for the context model, and a binary entropy coder.

Wavelet Filters

Figure 16:
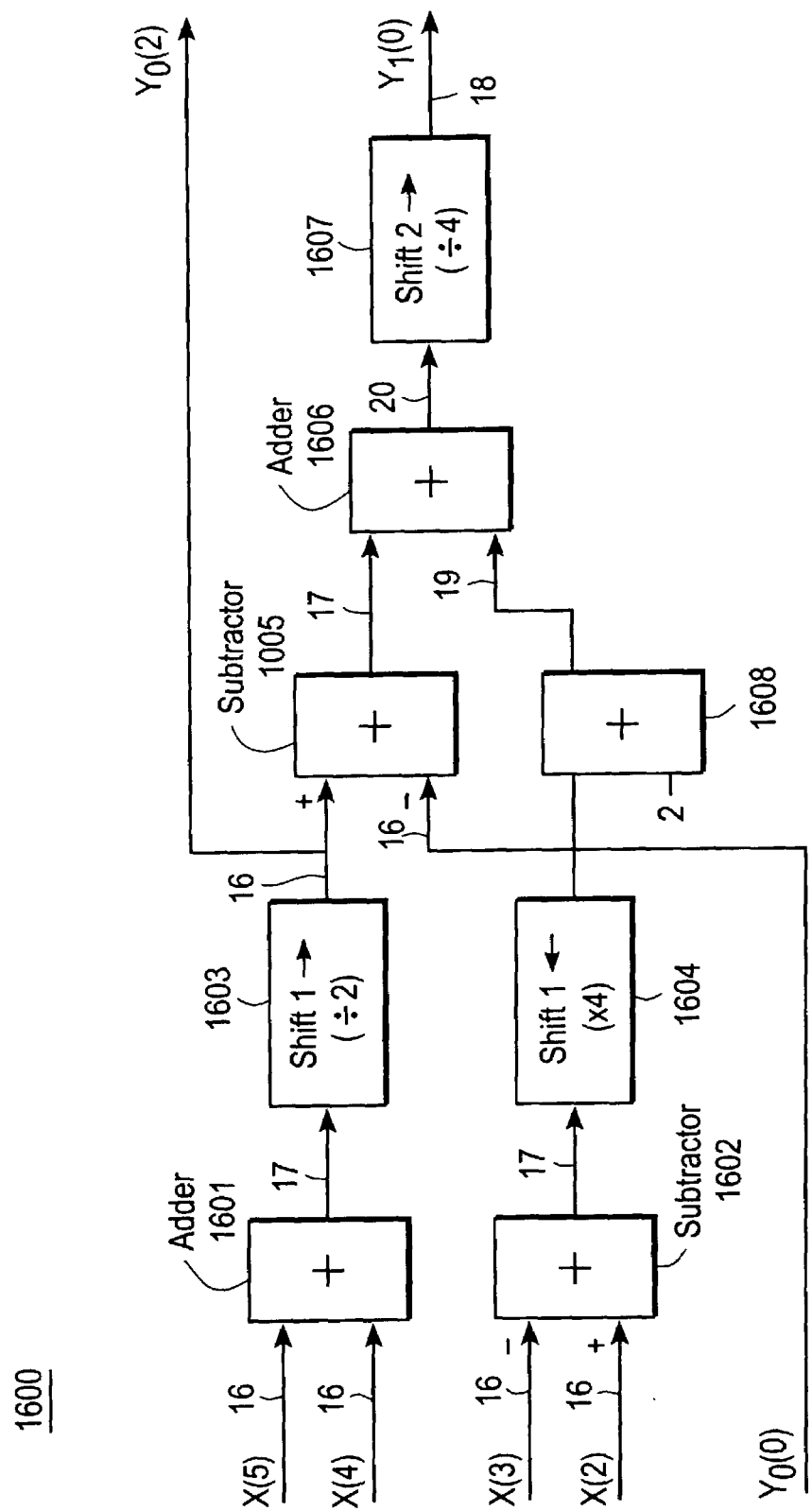
FIG. 16 is one embodiment of the forward wavelet filter of the present invention.

One embodiment of the forward wavelet filter of the present invention is shown in FIG. 16. The wavelet filter shown in FIG. 16 accommodates 4 16-bit two's complement input pixels, shown as x(2)–x(5).

Referring to FIG. 16, the two tap "1 1" low-pass filter uses one 16-bit adder 1601. The outputs are called S and D, respectively. The output of the adder (S) is truncated to 16 bits using shift-by-1 block 1603. The shift-by-1 block 1603 performs a divide-by-2 function by shifting its 17-bit input to the right one bit.

The six tap "−1 −1 8 −8 1 1" high-pass filter requires the computation of $-S_0+4D_1+S_2$. The function $S_2-S_0$ is computed with 16-bit subtractor 1605 receiving the output of shift-by-1 block 1603 and the $Y_0(0)$. The $4D_1$ term is computed using subtractor 1602, shift-by-2 block 1604 and adder 1608. The output produced by 16-bit subtractor 1602 is shifted to the left two places by shift-by-two block 1604, thereby effectively multiplying its output by four. The output of block 1604 is added to 2 by adder 1608. Note that because of the shift by 2, adder 1608 may be replaced by wiring. Adding the $4D_1$ output from adder 1608 to the output of subtractor 1605 is performed by 20-bit adder 1606. The output of the adder 1606 is truncated to 18 bits using shift-by-2 block 1607. Shift-by-2 block 1607 performs a divide-by-4 function by shifting its 20 bit input to the right two bits.

Thus, the total computational hardware required (not counting registers for storing temporary results) is:
1@16-bit adder,
2@16-bit subtractors,
1@19-bit adder.

Note that shifting (and adder 1608) is performed by the wiring, such that no logic is needed.

In other embodiments, for inputs of size N, one N-bit adder, two N-bit subtractors and one (N+3) bit adder may be used.

Due to the extremely low hardware cost of these adders/subtractors, parallel implementations of the filters can be used if desired.

Note that alternatively, instead of subtracting X(3) and X(2), X(4)–X(5) can be computed and saved until needed later as X(2)–X(3) for the next shift or application of the filter. Both the forward filter (and the inverse filter described below) may be pipelined to achieve higher throughput.

Figure 17:
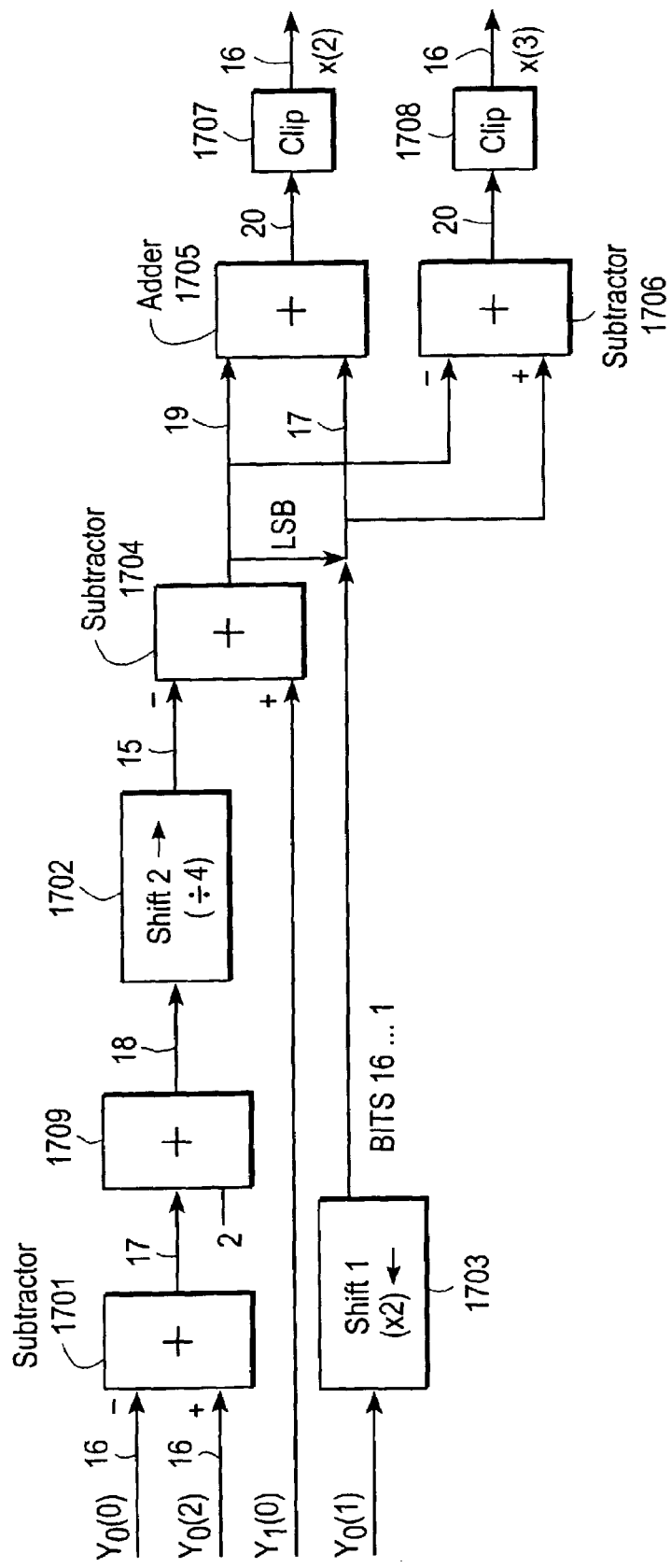
FIG. 17 is a block diagram of one embodiment of a reverse wavelet filter of the present invention.

The inverse wavelet filter is shown in FIG. 17. The inputs of $Y_0(0)$ and $Y_0(2)$ are subtracted by subtractor 1701. Two (2) is added from the output of subtractor 1701 by adder 1709. The result of the addition is shifted to the right two bits by shift-by-2 block 1702. This effectively divides the output of the subtractor by 4. A subtraction is performed between the output of shift-by-2 block 1704 and the $Y_1(0)$ input. The input $Y_0(1)$ is shifted one bit to the left by shift-by-1 block 1703, thereby multiplying the input by two. After $Y_0(1)$ is shifted by 1 (multiplied by two), the LSB of the shifted value is the LSB taken from the output of subtractor 1704 and combined with the 16 bits output from shift-by-1 block 1703 to form an input for adder 1705 and subtractor 1706. The other input for adder 1705 and subtractor 1706 is the output of subtractor 1704. The outputs of adder 1705 and subtractor 1706 may subsequently undergo clipping.

A choice of two clip operations may be used. In both cases, the 20-bit value is shifted by 1 (divided by 2), to a 19-bit value. For a system that only performs lossless compression, the least significant 16 bits can be output (the remaining 3 bits can be ignored). In a lossy system (or a lossy/lossless system), the 19-bit value is set to zero if it is negative or set to $2^{16}-1$ if it is greater than $2^{16}-1$; otherwise, the least significant 16 bits can be output.

For inputs of size N bits, one N-bit subtractor, one (N+1) bit adder, one (N+2) bit subtractor, one (N+3) bit adder and one (N+3) bit subtractor may be used, and the clip unit outputs N bits.

In one embodiment of the wavelet transform, Monte Carlo division is used in the transform computations, wherein a pseudo random generator is used and based on its output, the results of a transform operation are either rounded up or down. Such an implementation may be used as long as a decoder is aware of the rounding being performed (i.e., uses the same random generator starting at the same point).

Memory Usage for Data Flow Management for Wavelet Filters

With respect to memory and data flow management for the wavelet filters of the present invention, for images where a full frame can fit in memory, memory/data flow management is not a difficult issue. Even for 1024×1024 16-bit medical images (e.g., 2 Mbytes in size), requiring a full frame buffer is reasonable for many applications. For larger images (e.g., A4, 400 DPI 4-color images are about 50 Mbytes in size), performing the wavelet transform with a limited amount of line buffer memory is desirable.

Note that a full frame buffer is not necessary for the present invention to implement a one-pass system. Because of this, the memory required may be reduced by about a factor of 100 (compared to using a full frame buffer for large images). The one-pass system of the present invention is described later.

The data stored in the filter memory is a series of coefficients that are to be subjected to the embedded coding and binary entropy coding. The embedded coding uses a context model to coordinate the use of horizon coding, and to provide data in the proper order. The context model operates in conjunction with a memory management scheme. For systems with a full frame buffer, providing data in the proper order is not difficult.

For systems with a finite amount of workspace memory, in one embodiment, different height transforms are used to reduce the number of workspace lines of memory needed for storage. Thus, if a wider image is encountered, it may be compressed efficiently within the allotted workspace memory. For instance, the S-transform may be used vertically to reduce the number of lines.

Memory is required to buffer raster data, so a wavelet transform can be performed. In some applications, minimizing this memory is important for reducing cost. A technique for accomplishing this is described below.

Figure 20:
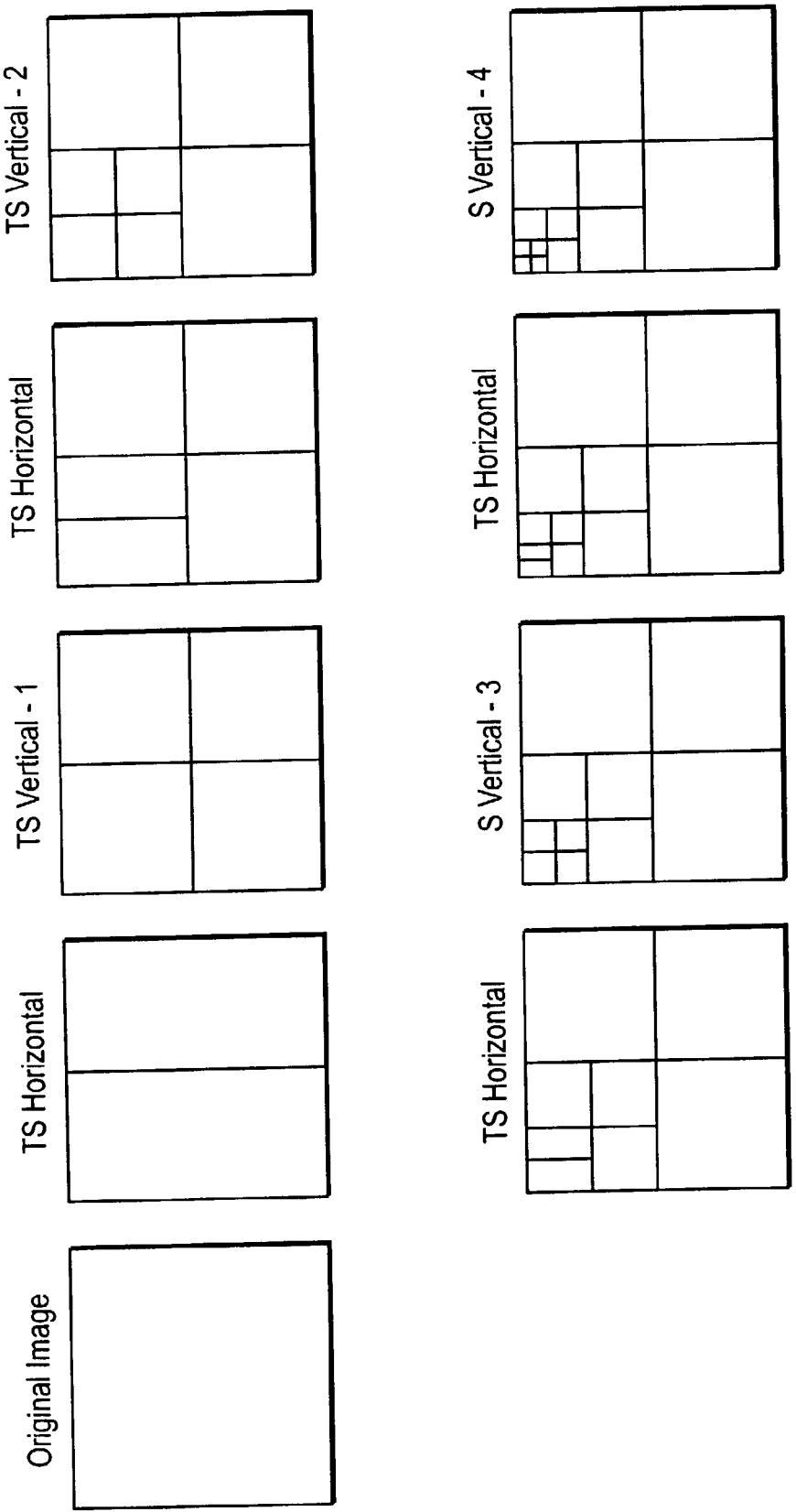
FIG. 20 illustrates one embodiment of a wavelet decomposition stages.

One embodiment of the wavelet 2-D transform described herein is designed for a one-pass implementation and restricted memory usage. In one embodiment, the wavelet transforms applied to achieve the pyramidal decomposition are only TS and S transforms. In this embodiment, there are four levels of separable pyramidal decompositions. In one embodiment, a four level decomposition is performed using the S and TS transforms. In one embodiment, in the horizontal (row-wise) decomposition, solely the TS-transform is used, i.e., the horizontal decomposition is formed of TS-TS-TS-TS. In the vertical (column-wise) decomposition, the S-transform and the TS-transform are both used in the form of TS-TS-S-S. Two of the TS-transforms are replaced by S-transform at a small cost to the compression, but significant impact on the memory usage. The horizontal and vertical transforms are applied alternatively as usual (FIG. 20).

Note that any combination of the S and TS transforms may be used to implement the horizontal and vertical transforms. Note that although the orders of the transforms may be mixed, the decoder must be aware of the order and must perform a reverse operation in the reverse order to be fully reversible.

Coefficient Trees

In a pyramidal system, the coefficients can be grouped into sets using a tree structure. The root of each tree is a purely low-pass coefficient. FIG. 6 illustrates the tree structure of one purely low-pass coefficient of the transformed image. For a two-dimensional signal such as an image, the root of the tree has three "children" and the rest of the nodes have four children each. The tree hierarchically is not limited to two dimensional signals. For example, for a one dimensional signal, a root has one child and non-root nodes have two children each. Higher dimensions follow from the one-dimensional and two-dimensional cases.

The tree structure is also apparent from the operation of the filters shown in FIGS. 7-9. The operation of the pairs of filters with subsampling causes the previously described coefficients to be related.

In one embodiment, the coefficients are coded in a bit significance, or bit-plane embedded system. Since the coefficients are coded from most significant bitplane to least significant bitplane, the number of bitplanes in the data must be determined. In the present invention, this is accomplished by finding an upper bound on the magnitudes of the coefficient values calculated from the data or derived from the depth of the image and the filter coefficients. For example, if the upper bound is 149, then there are 8 bits of significance or 8 bitplanes. For speed in software, bitplane coding may not be used. In an alternate embodiment, a bitplane is coded only when a coefficient becomes significant as a binary number.

In one embodiment, the horizon context model of the present invention comprises the bit-significance embedded encoding of the wavelet coefficients that feeds a binary entropy coder.

Context Model Alternatives

Once the decomposition has been completed and the data coefficients ordered, the context model of the present invention is used to encode the coefficients. There are various context models that may be used. Decisions may be conditioned on spatial location, level, and/or bit position. Decisions may also be conditioned on previously decoded data that is close to the current data in spatial location, level, and/or bit position.

Some examples are as follows. The most significant tail bit (and therefore most easily predicted) could use a different context than the rest of the tail bits. Head bits can be conditioned on the same bit for spatially close previous coefficients at the same transform level. Similarly, the sign bits for significant coefficients might be conditioned on the sign of spatially close previous coefficients at the same level or the sign of the coefficient of the parent.

Context model improvements might be especially important when compressing images that have spatial or multi-resolution structure. Grayscale images of line drawings or text are an example of images with both of these types of structure. Improvements are also important for compressing files that already have to be compressed and decompressed with a specified peak error.

When performing the present invention in software, a large amount of time is expended to obtain bits for contexts because the bits are required for conditioning (e.g., every head bit). In one embodiment of the present invention, a software implementation may be speeded up using look-up tables (LUTs). This avoids separate bit extraction operations for the North (N), Northwest (NW), West (W) and Southwest (SW) pixels that are used as contexts.

FIGS. 19A and 19B illustrate a state machine for head bit conditioning in the present invention. Referring to FIG. 19A, a LUT 1901 for a new parent is shown coupled to an encode/decode block 1902. LUT 1901 is coupled to receive bits indicative of a parent, bits representing the above (NE) coefficients, the current (E) coefficient and the coefficient below (S). In one embodiment, the parent input and current input comprise two bits each. Other inputs to LUT 1901 include all or part of the context output from LUT 1901 and the output of encode/decode block 1902, as feedbacks. In one embodiment, 8 of 10 bits output as a context by LUT 1901 are fed back to an input of LUT 1901.

The NE, E and S coefficients are used because they represent the leading edge of template information which comprises coefficient information associated with the previous bit-planes. Note that the Southeast (SE) coefficient may be used instead of the South (S) coefficient.

In one embodiment, if the template is outside the coding unit, the outside conditioning bits may be replaced with bits from the current pixel.

FIG. 19B illustrates state machine conditioning using a LUT for the same parent. In such a case, the entire context is fed back as an input to LUT 1903.

Where data is processed in raster order, using a LUT reduces the number of memory accesses because the same memory used to generate the last context does not have to be reloaded.

To reduce the size of LUT memory, alternatively the parent conditioning can be done separately by ORing with the output of a LUT which only handles the other conditioning.

A slightly larger LUT table can also provide most of the conditioning for the next bitplane also. Another smaller LUT could take the state information from the current context LUT and combine it with the newly available data from the next bitplane. This may especially be useful if coding one tree at a time.

As described above with respect to the present invention, "efficient" may be defined to mean the transform has determinant of 1. In such a case, code space is not wasted by saving room to code low probability events when the low probability is zero. However, 8-bit coefficients are still input and produce an 8-bit coefficient and one 9-bit coefficient. Therefore, efficiency may still be improved. The added inefficiency is due to the rotation of the space of possible coefficients.

Figure 18:
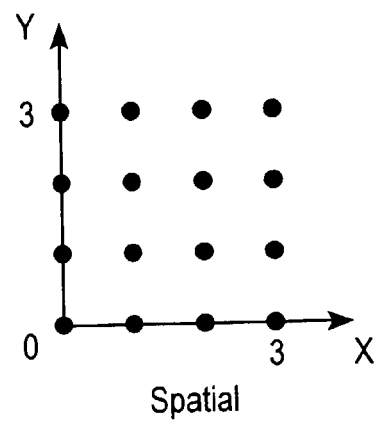
FIG. 18 illustrates the coefficient range of various transforms.
Figure 18:
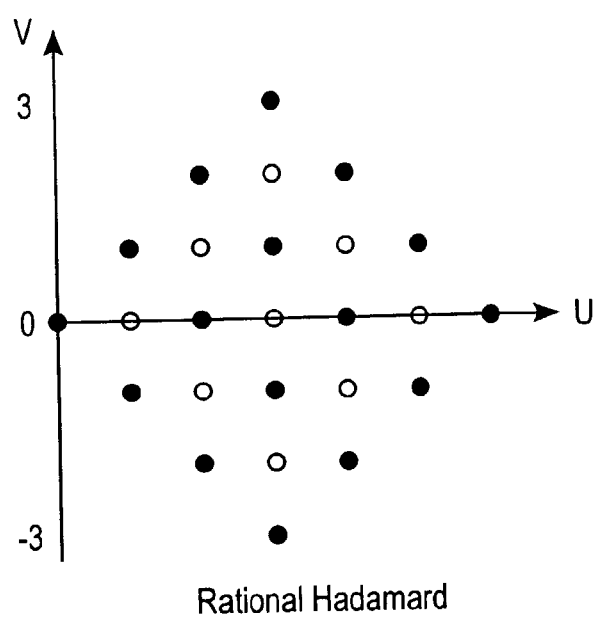
Figure 18:
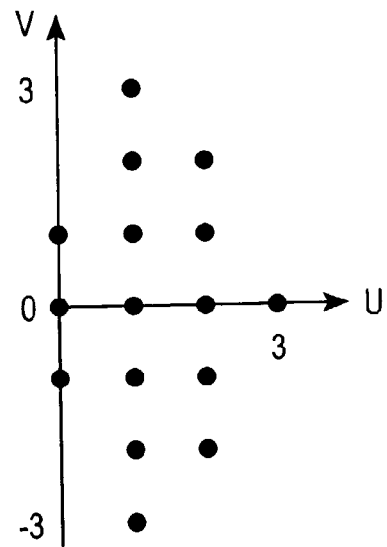

It should be noted that certain results of the transform operations uniquely identify numbers used in the computations. This occurs when the results are near the bounds of those ranges of possible results. This is exemplified by FIG. 18, wherein u represents the low-pass and v represents the high-pass. Because the values of u and v are not independent, these numbers may also be easier to entropy code taking joint information into account. This is because, as shown in FIG. 18, for most low pass values, some code space for the high pass is not used. In many applications there is little advantage because the probability assigned to these impossible pairs is low. However, there might be a worthwhile gain in some applications. To speed operations, more bits of the LL coefficients could be sent prior to the LH, HL and HH coefficients. This may make bounding easier.

In some embodiments, after each coding unit has been coded, everything is reset, all the statistics and probabilities are reset when coding the second unit. In one embodiment, some of the statistics or all are saved. These then act as the initial statistics when coding of a later coding unit begins. In one embodiment, the statistics are saved at a predetermined point in the coding of the first or previous coding unit. For example, after coding the third bit plane, the statistics used by code the current coding unit are saved and act as the statistics for the beginning of coding of the following coding unit or later coding unit. In another embodiment, the classes for all images are evaluated and a hard coded set of statistics are determined. Then, coding is performed using these hard coded statistics as a default. In another embodiment, statistics are saved for each bit plane, such that when coding in the similar bit plane in another tile, the statistics are used.

In one embodiment, there is no coding until the first one bit. At the occurrence of the first one bit in the coefficient, the sign is encoded. Although the head bits are image/region dependent, the tail bits are more uniform across different images and regions. Based on how far the tail bits are from the initial one bit (in the head bit), certain probability classes are used to encode the bits in the tail. In one embodiment, the first tail bit in a coefficient is coded with a probability class including 0.7. The second and third tail bits are coded with a probability class including 0.6. Lastly, the fourth and further tail bits are coded with probability classes that includes 0.5.

A. Performing the Wavelet Transform

In the one-pass system, the wavelet transform performed is a compromise between compression performance and the amount of memory used. The coding unit size is chosen for the least memory usage with the fewest line buffers (assuming the image is delivered in raster order). The intermediate coefficients of the wavelet transform are stored in the same memory replacing the input as appropriate.

Choice of Wavelet Transform Filters

The wavelet 2-D transform described herein is designed for a one-pass implementation and restricted memory usage. There are four levels of separable pyramidal decompositions. In the horizontal decomposition, solely the TS-transform is used, i.e., the horizontal decomposition is formed of TS-TS-TS-TS. In the vertical decomposition, the S-transform and the TS-transform are both used, and the vertical decomposition is formed of TS-TS-S-S. The horizontal and vertical transforms are applied alternatively. FIG. 20 illustrates the horizontal and vertical decompositions.

Two of the TS-transforms are replaced by S-transform at a small cost to the lossless compression, but significant impact on the memory usage. The choice of using the S-transform in the last two vertical passes is solely to use less memory. The usage of the S-transform saves approximately 32 lines of coefficient buffer (e.g., 16 lines down from 48 lines). Note that using the TS-transform for all the decompositions does provide better compression performance.

Coding Unit Definition

Figure 21:
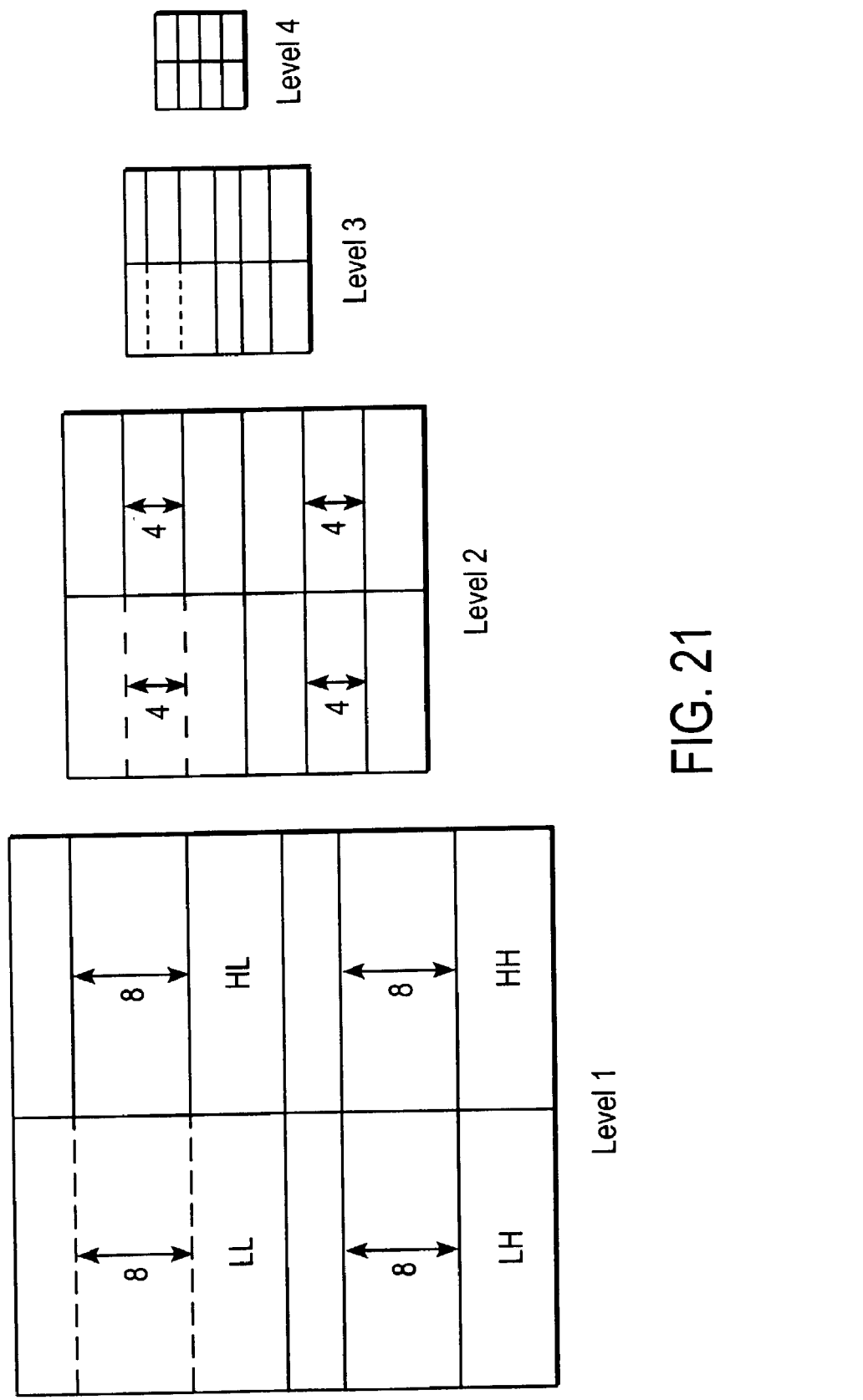
FIG. 21 illustrates one coding unit.

In one embodiment, the coding unit is defined by one line of trees (a line of LL coefficients and all their descendants. With four levels of decomposition, this implies that in the spatial domain, a coding unit is 16 lines by the width of the image. FIG. 21 illustrates one coding unit. Note that FIG. 21 is not to scale. The level 1 block is the image after one 2-D decomposition. To reiterate, the names LL(low-low), LH (low-high), HL (high-low), and HH (high-high) are used to address a subblock and are applied to all the level 1–4 blocks. Level 2 block is the result of the 2-D decomposition of the subblock LL in the level 1 block. Similarly, blocks 3 and 4 are 2-D decompositions of the subblocks LL in level 2 block and level 3 block respectively.

A coding unit is 8 lines high for the HH, HL, and LH coefficients in level 1, 4 lines high in level 2, 2 lines high in level 3, and 1 line in level 4 and the LL subblock. Notice that as the resolution decreases at each step, the length as well as the number of rows halve. Each coefficient in the LL of the level 4 block is the top parent of a tree.

Buffering and Coefficient Computation

In order to generate one coding unit described in FIG. 21, a workspace buffer of size 2·w·m, where w is the width of the image, and m is the maximum coefficient size in bits, may be used. Because of the nature of the wavelet filters chosen for the vertical transform (i.e., column-wise) passes, the workspace memory requirement is approximately 18–20 lines. Each horizontal transform (i.e., row-wise) pass, all of which are TS-transforms, is computed one line (row) at a time and the new coefficients replace the old coefficients or pixels.

Figure 22:
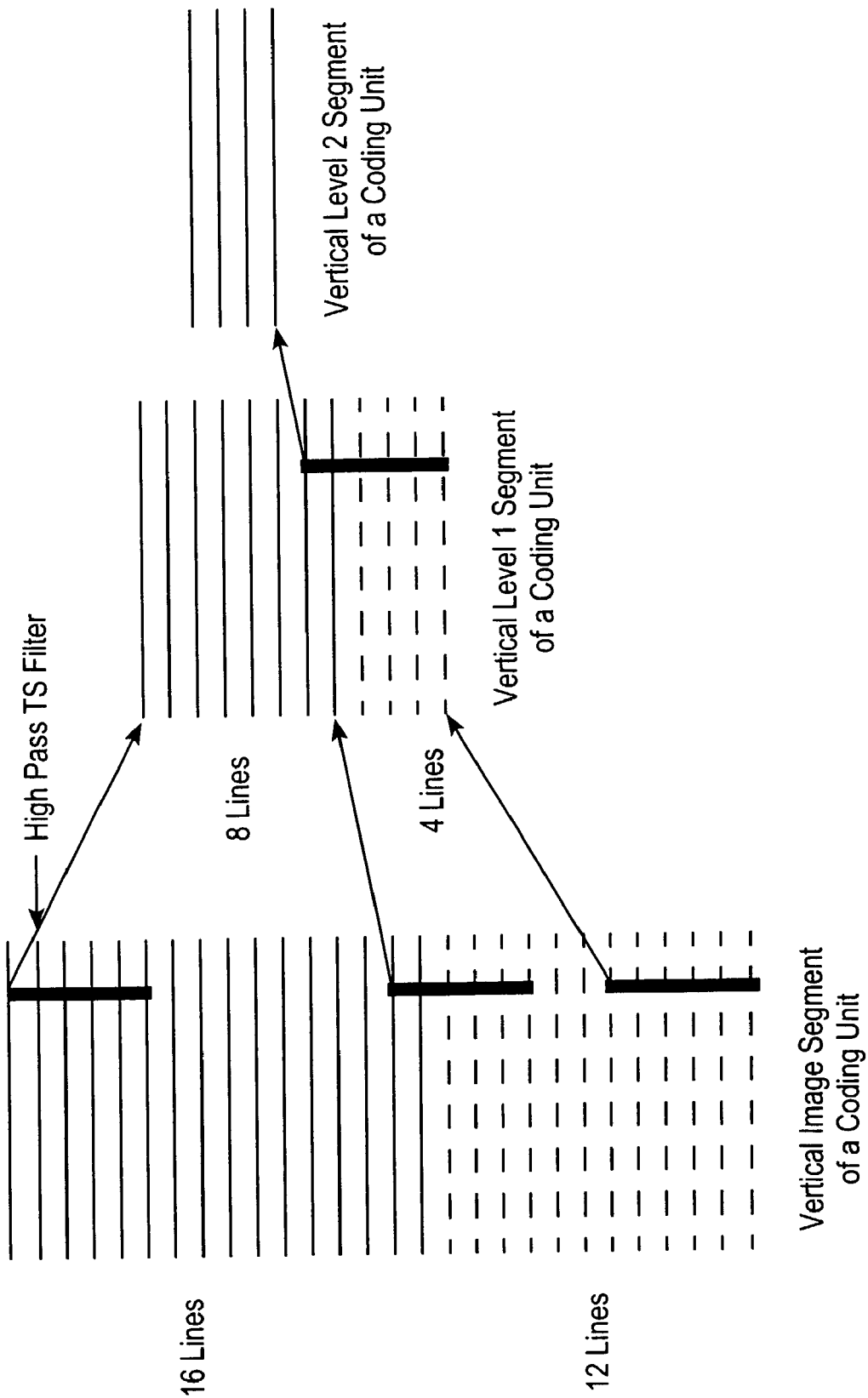
FIG. 22 illustrates vertical passes with the TS-transform.

The first two vertical transform passes use the TS-transform filters. Because of the six-tap high pass filter, each high pass coefficient in the vertical pass depends on six lines of either pixel of coefficient data. A high pass TS coefficient generated is related to the top two lines with four lines below for overlap. This is shown in FIG. 22. Referring to FIG. 22, a vertical image segment of a coding unit is shown. The vertical image segment of the coding is the result of the original image being transformed by a horizontal pass of the TS-transform. A vertical level 1 segment of a coding unit is shown and is the first level 2-D transform of the image. The vertical level 1 segment is obtained by performing a horizontal pass with a TS-transform. A vertical level 2 segment of a coding unit is also shown and results from applying the TS transform on the LL subblock of the level 1 block on both dimensions.

It should be noted that since the TS-transform is overlapped by four pixels (or coefficients), four lines of data are saved at the end of a coding unit to be used in the computation of the coefficients of the next coding unit. In other words, to create the level 1 coefficients, two extra lines of pixels are needed at both the top and the bottom or four extra lines are needed at the bottom. To create the level 2 coefficients, two extra lines of level 1 coefficients are needed at both the top and the bottom, or four are needed at the bottom. To generate these extra level 1 coefficients, another two lines of pixels are required on both the top and the bottom or four are needed at the bottom. Thus, each coding unit spans 28 vertical lines.

Importantly, however, no extra computation is required to generate these "extra" level 1 coefficients since they will be used in the coding units above and below the current one. Also note that only 20 lines of storage are required because only the level 2 coefficients are stored.

The final two vertical passes are S-transforms that have no overlap in the low pass and, thus, do not require extra lines.

Memory for the Transform Computation

Given pixel values or coefficient values of size b bits (in the range of $-2^{b-1} \ldots, 0, \ldots 2^{b-1}-1$) the smooth outputs, s(.), of both the S-transform and the TS-transform are also b bits. In other words, they have the same range as the input. However, the one-dimensional detail outputs, d(.), of the S-transform and TS-transform will take b+1 and b+2 bits to express respectively.

Figure 23:
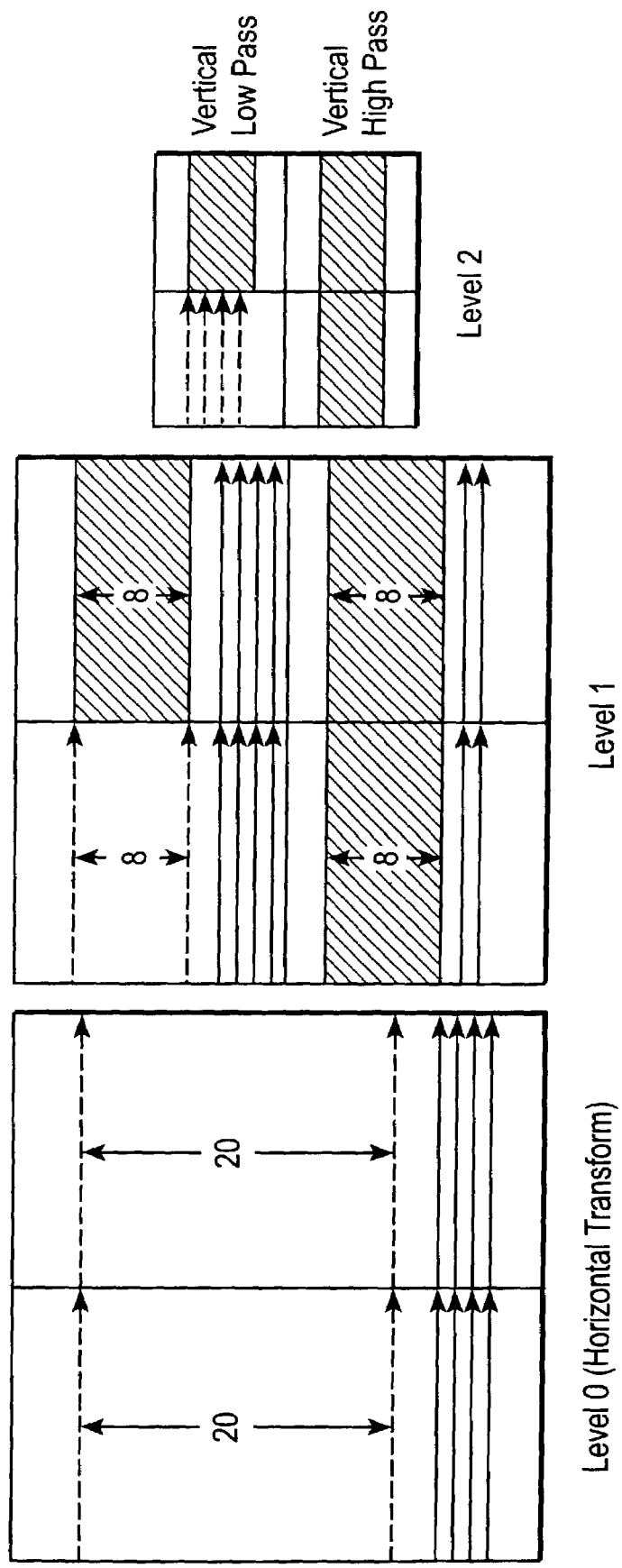
FIG. 23 illustrates buffering and coefficient computation.

FIG. 23 illustrates some of the line buffering needed in addition to the coding unit. The gray areas and arrows are the coefficients which are part of the current coding unit and need to be saved in memory for the current coding. The dashed arrows are the temporary coefficients which are needed to compute the coefficients in the coding unit. These are overwritten by the new coefficients. The solid arrows are the coefficients which are the by-products of the computation of the current coding unit coefficients and are saved to be part of the next coding unit.

The final level (level 4) of coefficients is a single line in all four subblocks (LL, LH, HL, HH). Referring only to the vertical transform, to calculate level 4 from level 3, the S-transform is used so all subblocks require only two lines of coefficients in level 3. Likewise, to calculate level 3 from level 2 requires four lines of coefficients in level 2. All of these coefficients are part of the current coding unit.

To calculate the vertical passes of level 2 and 1, the TS-transform is used. Because of the overlapped nature of the six-tap high pass overlapped filter, these levels require data from the next coding unit. That data is used to calculate the coefficients in the current coding unit and then are stored for use in the next coding unit.

To calculate the high pass subblocks in level 2 (LH, HH) from level 1, 12 lines are needed (8 lines to 4 lines from downsampling and 4 extra lines for the overlap). These lines are shown in low pass subblocks of level 1 (LL, HL) of FIG. 23 as the 8 lines that are part of the current coding unit and 4 lines that are part of the next.

To calculate the 12 lines in the low pass subblocks of level 1 (LL, HL), 24 lines are needed from level 0. These 24 lines at level 0 can create the 10 lines in the high pass subblocks of level 1 (16 lines to 8 lines from downsampling and 4 extra lines for the overlap). It is most efficient to calculate all 10 of these lines and store them at level 1 even though only 8 are needed for the current coding unit. Thus, only the 4 extra lines used for the overlap need be saved at level 0.

Starting from an image of pixel depth b, for a separable 2-D transform, for the case that both row and column transforms are TS, the ranges of the coefficients are b, b+2, b+4 for LL, HL, LH, HH (FIG. 12) subblocks respectively. In the case the separable 2-D transform consists of horizontal TS and vertical S transforms, the ranges of the coefficients are, b, b+1, b+2, b+3 for LL, HL, LH, HH respectively. Tables 2, 3, 4, 5, and 6 illustrate the calculation for the memory required by each block. Note that the calculation is done in terms of size in bits for an image of width w, one for each block:

TABLE 2

Memory cost for Level 0

| Subblock | L | H |
|---|---|---|
| Memory | 4·b·w/2 | 4·(b + 2)·w/2 |

TABLE 3

Memory cost for Level 1

| Subblock | LL | HL | LH | HH |
|---|---|---|---|---|
| Memory | 4·b·w/2 | 10·(b + 2)·w/2 | 12·(b + 2)·w/2 | 10·(b + 4)·w/2 |

TABLE 4

Memory cost for Level 2

| Subblock | LL | HL | LH | HH |
|---|---|---|---|---|
| Memory | 0·b·w/4 | 4·(b + 2)·w/4 | 4·(b + 2)·w/4 | 4·(b + 4)·w/4 |

TABLE 5

Memory cost for Level 3

| Subblock | LL | HL | LH | HH |
|---|---|---|---|---|
| Memory | 0·b·w/8 | 2·(b + 1)·w/8 | 2·(b + 2)·w/8 | 2·(b + 3)·w/8 |

TABLE 6

Memory cost for Level 4

| Subblock | LL | HL | LH | HH |
|---|---|---|---|---|
| Memory | 1·b·w/16 | 1·(b + 1)·w/16 | 1·(b + 2)·w/16 | 1·(b + 3)·w/16 |

Adding all of the above numbers equals $$\left(26b + 55\frac{7}{8}\right) \cdot w \text{ bits,}$$

which rounded is (26b+56)·w bits. A two line computational buffer of the largest size, b+4 bits, adds 2·(b+4)·w bits leading to a total memory cost of (28b+64)·w bits. For example, for an 8-bit 512 pixel wide image, 147,456 bits or about 18K bytes of memory is required.

In one embodiment, the size of the transform is selected based on the width of the image and the fixed size of the memory available. In other words, an image of a particular may be inputted into the system of the present invention, and due to a limited amount of available transform memory, the number of levels of decomposition are reduced. If more memory is available, then the number of decomposition levels are increased. Note that this may occur dynamically as the image is being received into the system. If enough memory is available, the LL coefficients are fed through wavelet filters to perform the additional level of decomposition. Note that an effect of decreasing or increasing the number of levels is to decrease or increase, respectively, the amount of compression that may be achieved.

B. Embedded Order of the Present Invention

Ordering of the Codestream

Figure 24A:
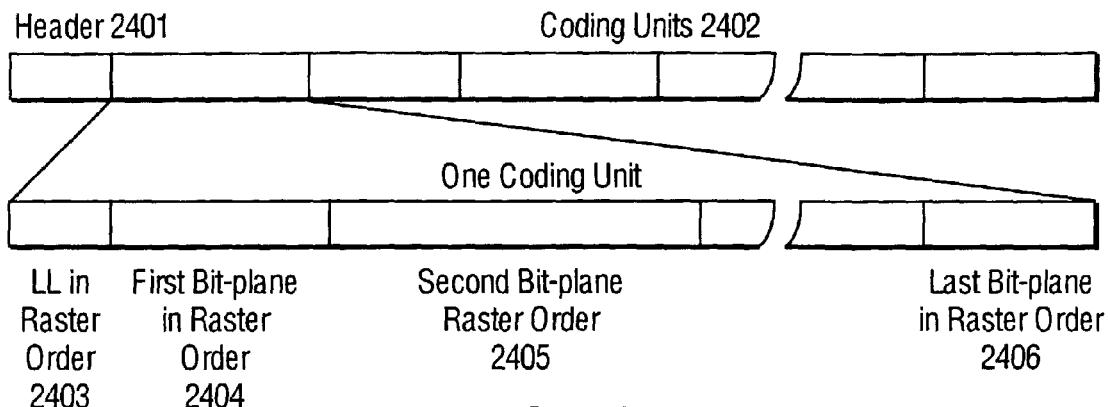
FIG. 24A illustrates one embodiment of a codestream configuration.

FIG. 24A illustrates the ordering of the codestream and the ordering within a coding unit. Referring to FIG. 24A, the header 2401 is followed by the coding units 2402 in order from top to bottom. Within a coding unit, the LL coefficients 2403 are uncoded in raster (line) order. Following the LL coefficients is entropy coded data one bit-plane at a time, starting from the most significant bit-plane to the least significant bit-plane. Then the first bit-plane from every coefficient is coded followed by the second bit-plane, etc.

Alignment of the Coefficients

In one embodiment of the present invention, the context model uses an unnormalized $1+Z^{-1}$ low-pass filter. However, the context model may be used with normalized filters, such as $$\frac{1 + Z^{-1}}{\sqrt{2}}$$

In order to use normalized filters, an alignment unit between the forward wavelet filter 1600 and the context model 105, can be used to compensate for the energy gained (or alternatively, lost) from the unnormalized filter, which improves compression. Because alignment allows non-uniform quantization for lossy operation, alignment can enhance the visual quality of lossy image reconstructions. In the one-dimensional case, coefficients from each level of the tree would have different alignment (divisors=$\sqrt{2}$, 2, 2$\sqrt{2}$, 4, multipliers=2$\sqrt{2}$, 2, $\sqrt{2}$, 1). In the two-dimensional case, the divisors would be 2, 4, 8, 16 and the multipliers would be 8, 4, 2, 1.

Since the alignment is only for grouping similar binary decisions for coding, using the exact normalization value is not critical. The alignment must be inverted during decoding, so both multiplication and division are required. Using factors/divisors that are powers of two would allow hardware efficient shifting to be performed instead. When coefficients are multiplied by a power of two, the lessor significant zero bits added do not have to be coded.

Coefficient alignment can be used for tuning and for finer and non-uniform quantization. In case of images (two dimensional signals), one embodiment of the RTS-transform aligns the coefficients by multiplying the frequency band by the numbers depicted in FIG. 12B. Multiplying these numbers results in the RTS-transform being a very close approximation of the exact reconstruction wavelets of the TS-transforms.

This one-pass embodiment uses only one alignment that is optimal with respect to MSE for the filter pairings. Table 7 illustrates the alignment numbers. The coefficients are coded by bit-significance where the first bit-plane is the left most magnitude bit of all the coefficients. The sign bit for each coefficient is not coded until the highest bit-plane where that coefficient has a non-zero magnitude bit. In other words, the sign bit is encoded right after the first "on-bit" is coded. This has the advantage of not coding a sign bit for any coefficient that has zero magnitude, and not coding a sign bit until the point in the embedded codestream where the sign bit is relevant. For an image of pixel depth b, the largest possible coefficient magnitude is $2^{b+3}-1$, i.e., a b+3 bit number. Therefore, every coefficient is encoded in b+3 binary decisions plus an additional one for the sign bit, if needed.

TABLE 7

| Coefficient alignment | | | | | | | |
|---|---|---|---|---|---|---|---|
| 1-HH reference | 1-HL, 1-LH Left 1 | 2-HH Left 1 | 2-HL, 2-LH Left 2 | 3-HH Left 2 | 3-HL, 3-LH Left 3 | 4-HH Left 3 | 4-HL, 4-LH Left 4 |

The alignment of different sized coefficients is known to both the coder and the decoder and has no impact on the entropy coder efficiency.

Note also that every subblock of every block of a coding unit has its own possible largest magnitude range, which is known to the coder and the decoder. For most subblocks, there are several completely deterministic binary zero values that are skipped by the entropy coder for the sake of efficiency.

The order that the coefficients during each bit-plane are processed are from the low resolution to the high resolution and from low frequency to the high frequency. The coefficient coder within each bit-plane is from the high level (low resolution, low frequency) to the low level (high resolution, high frequency) as follows:
4-LL, 4-HL, 4-LH, 4-HH, 3-HL, 3-LH, 3-HH, 2-HL, 2-LH, 2-HH, 1-HL, 1-LH, 1-HH Within each subblock, the coding is in raster scan order.

Note that coding units of the same data set may have different alignments. In one embodiment, the alignment may be specified in a header, such as header 2401 in FIG. 24A.

The Horizon Context Model

Figure 25:
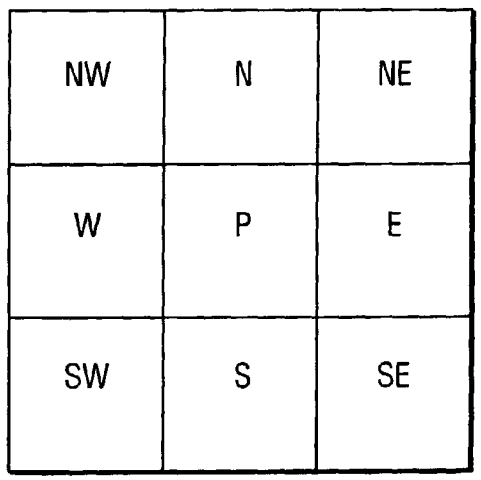
FIG. 25 illustrates the neighboring relationship among coefficients (or pixels).

FIG. 25 shows the neighborhood coefficients for every coefficient of a coding unit. Referring to FIG. 25, the neighborhood coefficients are denoted with the obvious geographical notations (e.g., N=north, NE=northeast, etc).

Given a coefficient, such as P in FIG. 25, and a current bit-plane, the context model can use any information from all of the coding unit prior to the given bit-plane. The parent coefficient of the present coefficient is also used for this context model.

Rather than using the neighborhood or parent coefficient values to determine the context for the present bit of the present coefficient, the information is reduce to two bits referred to herein as tail-information. This information can be stored in memory or calculated dynamically from the neighbor or parent coefficient. The tail-information relates whether or not the first non-zero magnitude bit has been observed (e.g., whether the first "on-bit" has been observed) and, is so, about how many bit-planes ago. Table 8 describes the tail-information bits.

TABLE 8

Definition of the tail information

| Tail | Definition |
|---|---|
| 0 | no on-bits is observed yet |
| 1 | the first on-bit was on the last bit-plane |
| 2 | the first on-bit was two or three bit-planes ago |
| 3 | the first on-bit was more than three bit-planes ago |

From the 2-bit tail information, a "tail-on" bit of information indicates whether the tail information is zero or not. In one embodiment, the tail-information and the tail-on bits are updated immediately after the coefficient has been coded. In another embodiment, updating occurs later to allow parallel context generation.

As an example, Table 9 shows the tail-on bit, as a function of bit-plane, for a coefficient with the magnitude expressed in binary as follows ("*" means it does not matter whether it is 0 or 1):

| 0 | 0 | 0 | 1 | * | * | * | * |
|---|---|---|---|---|---|---|---|

TABLE 9

Table if tail information for the example context coefficient

| Bit-plane | 1 | 2 | 3 | 4 | 5 | 6 | 7 | 8 |
|---|---|---|---|---|---|---|---|---|
| Prior to the occurrence of the example coefficient | 0 | 0 | 0 | 1 | 2 | 2 | 3 | 3 |
| Subsequent to the occurrence of the example coefficient | 0 | 0 | 0 | 0 | 1 | 2 | 2 | 3 |

A third type of context information is the sign bit. Since the sign-bit is coded right after the first on-bit, the tail indicates whether the sign information is known or not. Therefore, the sign-bit has no information context unless the tail is non-zero (recall that there are three possibilities for the sign: positive, negative, or unknown).

The context model of the system uses up to 11 bits to described the context. This number is not fully specified: only 1030 or 1031 contexts are actually used, including the sign bit contexts. The meaning of every bit position depends on the previous binary values. One embodiment follows these rules:

If the tail-on bit of the present coefficient is zero (for head bits), then 1024 contexts from the tail-information bits of the parent and W coefficient and the tail-on bit of the NW, N, NE, E, SW, and S coefficients respectively. In one embodiment, adaptive coding is used for head bits. In some embodiments, a single context is used to provide some "run coding" of head bits. If the next 16 bits to be coded are all head bits and their N, S, E, and W neighbors and parent all have tail-information 0, a single decision will be coded. This decision indicates if any of the 16 bits to be coded has a one bit at the current bitplane. If there is no one bit, the 16 decisions normally coded can be skipped. If any of the next 16 coefficients contain their first significant bit, then 16 decisions are used one for each bit. This "look ahead" results in fewer calls to the binary entropy coder which results in higher speed and higher compression.

If the tail-on bit of the present coefficient is one (for tail bits), then three contexts from the tail-information bits present coefficient. Fixed probability coding may be used as discussed previously.

If the present bit of the present coefficient is the first non-zero magnitude bit, then the sign bit of the present coefficient is encoded immediately after. The context for the sign bit is 3 contexts from the N_tail-on bit and the N_sign bit, where if the N_tail-on bit is zero, then the N_sign bit is unknown. If the N_sign bit is unknown, the sign is coded with the probability 0.5. Otherwise, the sign is coded adaptively.

In summary, an 11 bit number is created denoting the context from the information available from the current, neighboring, and parent coefficients in the same coding unit.

FIGS. 26A–D illustrate causal and non-causal coefficients that may be used to condition a coefficient P. Each of the templates illustrated include the use of both tail-on bits and tail-on information. While the tail-on bit of each coefficient provides 1 bit, the tail-on information of each coefficient comprises 2 bits. In FIG. 26A, the total number of bits provided by the template is 8. In FIGS. 26B and 26C, the total number of bits provided by the template is 10.

Additional bits may be used to condition the head bits of coefficient P. In one embodiment, two additional bits may specify bit position as follows:

| | |
|---|---|
| 00 | first bit (MSB) and second bit |
| 01 | third bit and fourth bit |
| 10 | fifth bit and sixth bit |
| 11 | other bits |

It should be noted that other templates may be designed based on neighboring and parent coefficients. Furthermore, in one embodiment, the coefficients used to condition coefficient P are causal, if not by position by bit plane.

In one embodiment, the S-transform parents are used for conditioning, not TS-transform parents. This reduces buffering needed for conditioning by saving low pass lines before continuing to code the next one. This is not advantageous where the order of entropy coding is important and encoder memory is not important.

Note that there is a tradeoff between having more contexts to create more skewed data and the adaptation efficiency as a result of less data within a context.

In one embodiment, the tail bits that do not need conditioning do not have to be buffered (for conditioning). They can be coded immediately as soon as they are available. In such a case, the channel manager may send the bits out immediately to the channel.

In one embodiment, rather than coding the coefficients on the lowest level of the decomposition in the same way as the other coefficients or not coding them at all, the coefficients may be coded using prediction coding, such as DPCM.

For tail coding bits, either fixed probabilities or adaptive ones may be used.

With respect to conditioning, the last bit may be conditioned, in part, on the second-to-last bit. Also, bits after the first "on" bit may be conditioned on how far they are from the first "on" bit.

In one embodiment, some tail bits are coded adaptively. For example, when there are fewer than T tail bits in a coefficient (e.g. T=2, T=3), adaptive coding is used. The context for these bits include the bit position and any previously coded tail bits in the current coefficient. This is similar to the M-ary coding of centers taught by Langdon for DPCM data.

In an alternative embodiment, some or all data is coded with a M-ary entropy coder instead of a binary entropy coder. M-ary coders include Tunstall, fixed Huffman, Adaptive Huffman, etc. For example, one Huffman code could be used for head bits. In an alternative embodiment instead of coding head bits one bit at a time, a priority encoder is used to determine the position of the first "on" bit. The bits in the binary representation of the position are then coded with a binary entropy coder.

Horizon Context Model

Figure 27:
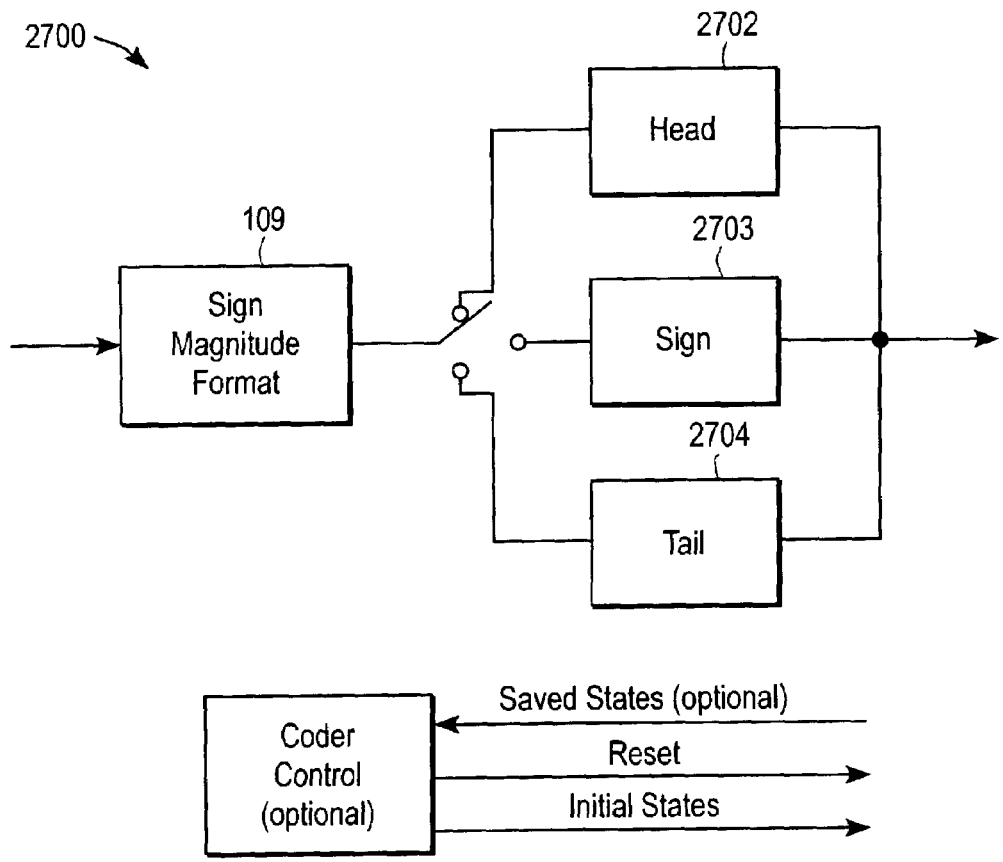
FIG. 27 is a block diagram of one embodiment of the context model of the present invention.

The context model of the present invention is shown in block diagram form in FIG. 27. Context model 2700 contains the sign/magnitude unit 109 (FIG. 2), and three units for processing the different bits in the coefficient. Based on the bit being coded, one of the three units is selected. A switch may be included to facilitate the switching between the units in a hardware implementation. These units include a head bit block 2701, a sign bit block 2702, and a tail bit block 2703. The head bit block 2701, a sign bit block 2702, and a tail bit block 2703 model the head bits, the sign and the tail bits, respectively, as described above. The output of these three units is sent to the entropy coder 104 (FIG. 1).

The coder may include optional control that saves states (optional), provides initial states and resets the coder (for instance, at the end of a coding unit).

The contexts defined above are used with an adaptive binary entropy coder with a few exceptions. The contexts of the head bits (present coefficient tail-on bit=0) and the sign bits when N_tail-on=1 are allowed to adapt.

However, the bits after tail-on=1 and the sign bits when N_tail-on=0 are modeled by a stationary source. In these cases, the adaptation feature of the entropy coder is not necessary and, in fact, can be a source of compression inefficiency. For the following contexts a fixed (non-adaptive) state, described in terms of the states of the Q-coder is used.

Statistical Models

The context is for coding the sign bit when N_tail-on=0 (the sign of the N-coefficient is not known) is coded at the fixed Q-coder state 0—probability approximately 0.5.

The context is for coding the first binary value after the first non-zero (tail-information=1)) bit is coded at the fixed Q-coder state 4—probability approximately 0.7.

The context is for coding the second and the third binary values after the first non-zero bit (tail information=2) is coded at the fixed Q-coder state 3—probability approximately 0.6.

The context is for coding the fourth and later binary values after the first non-zero bit (tail-information=3) is coded at the fixed Q-coder state 0—probability approximately 0.5.

In some embodiments, the entropy coding is reset after each coding unit, so the adaptation cost for contexts that are allowed to adapt (e.g., contexts used to encode binary values before the first on-bit) is significant. To keep this cost to a minimum, a set of initial states may be computed for these contexts from, for instance, some training data.

The following discussion assumes that the coefficients are 18-bits and that the input data has undergone a four level decomposition.

Figure 28:
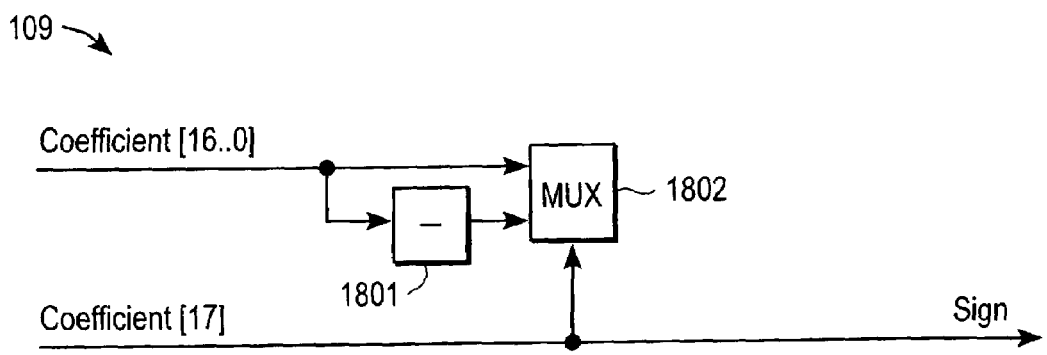
FIG. 28 is a block diagram of one embodiment of the sign/magnitude unit of the present invention.

One embodiment of the sign/magnitude unit 109 is shown in FIG. 28 and converts input coefficients into a sign/magnitude format. Sign/magnitude unit 109 is coupled to receive 18 bits of the coefficients and includes an inverter 2801 and a multiplexer (MUX) 2802. The sign/magnitude unit 109 outputs a significance indication (e.g., a 5-bit value), the mantissa of the input coefficient, (e.g., 17 bits), the sign of the input coefficient 1 bit and an index from counter 2804, (e.g., 7 bits.)

MUX 2802 is coupled to receive 17 bits of the coefficient directly input into sign/magnitude unit 109 and an inverted version of the 17 bits from two's complementer 2801. Based on the sign bit (coefficient bit 17) received on the select input of MUX 2802, the positive of the two inputs is output as the mantissa.

Coding Alternatives

The binary entropy coder is given a context and the bit to be encoded.

For bitplane by bitplane coding, the present invention uses a carry-save style computation (on a general purpose computer) so the computation is done with a data format that is suitable for fast coding by bitplane. For instance, in such an implementation, a 32 bit processor may compute 1 bit of each of 32 coefficients in the same bit plane at the same time, instead of one entire coefficient. Using such an embodiment results in increased speed when coding by bitplanes.

Since a coding unit is encoded at a time and all the coefficients in a coding unit reside in the memory, there is no memory cost for the storage of context information, except what the adaptive binary entropy coder needs. For example, the Q-coder needs to keep the binary value of the LPS (least significant symbol) for all contexts and the current state for each context that is allowed to adapt. Since Q-coder has 30 states, a 6-bit number (1 bit for the LPS and 5 bits for states) is needed for each context. Therefore, the memory cost is 1024×5+1030=6150 bits of memory.

Note that there is no special signaling information necessary for the one-pass embodiment described above. If the number of levels of decomposition were a variable, that would require at least 3 bits of header information. The header used for this embodiment, but not counted in the compressed bits, are the following:

Width, 2 bytes,
Height, 2 bytes,
Bits per pixel of input image, 1 bytes.

Memory Management

Memory management for coded data in the one pass system is presented for systems that store all of the data in memory and for systems that transmit data in a channel. In the one-pass system, coded data must be stored such that it can be accessed in an embedded causal fashion, so that less significant data can be discarded without losing more significant data. Since coded data is variable length, dynamic memory allocation can be used.

In one embodiment of the present invention, the embedded coding scheme uses 18 bitplanes and, thus, assigns 18 levels of significance to the data. The coder in a one-pass system is "embedded causal." That is, the decoding events corresponding to a bitplane do not require information from lower order bitplanes. In one embodiment, all of the bits from one tree will be coded before any of the bits in the next tree are coded, so bits of different significance are not separated. For coders that do not use internal state, like Huffman coders, this is not a problem. However, many sophisticated compressors with better compression use internal state.

One way to solve this problem for these coders is to use 18 different coders, perhaps 18 Q-coder chips. A technique that would allow the use of 9 Q-coder chips is described in U.S. Pat. No. 5,097,261 (Langdon, Jr.), entitled "Data Compression for Recording on a Record Medium," issued Mar. 17, 1992. A better way uses a pipelined coder to implement different virtual codes with a single physical coder, such as that described in U.S. Pat. No. 5,381,145, entitled "Method and Apparatus for Parallel Decoding and Encoding of Data", issued Jan. 10, 1995. In such a coder, the multiple bit generator states for each probability are each assigned to a part of the data. For example, each of 18 states could be assigned to a particular bitplane for 18 bit data. Registers in the shifter in the coder are also assigned to each part of the data. In the encoder, no interleaving is performed; each part of the data is simply bitpacked.

In embodiments either with multiple physical or virtual coders, memory is allocated to each part of the data. When compression is complete, a linked list describing the memory allocated plus the contents of the allocated memory is the result.

If the memory overflows, the memory allocation routing causes more important data to overwrite less important data. For example, the least significant bit of numeric data might be overwritten first. The information that describes how memory is allocated must be stored in addition to the coded data.

Figure 29:
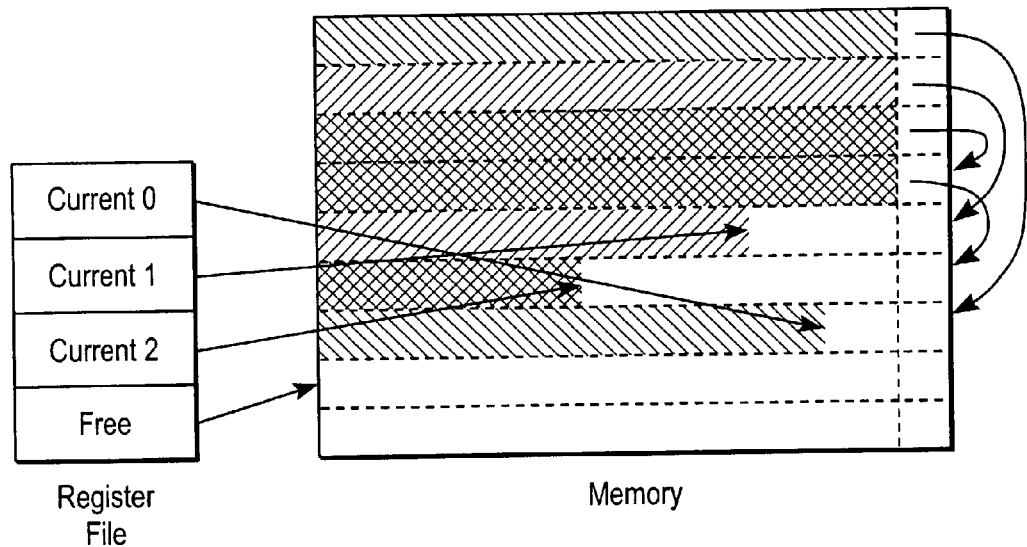
FIG. 29 illustrates the dynamic allocation of coded data memory for one pass operation.

FIG. 29 shows an example dynamic memory allocation unit for three categories of significance. Only three categories are described to avoid obscuring the present invention; typically, a larger number of categories, such as 8, 16 or 18, would be used. A register file (or other storage) holds a pointer for each category of significance plus another pointer for indicating the next free memory location. The memory is divided into fixed size pages.

Initially, each pointer assigned to a significance category points to the start of a page of memory and the free pointer points to the next available page of memory. Coded data, identified with a significance category, is stored at the memory location addressed by the corresponding pointer. The pointer is then incremented to the next memory location.

When the pointer reaches the maximum for the current page, the address of the start of the next free page stored in the free pointer is stored with the current page as a link. In one embodiment, the part of the coded data memory or a separate memory or register file could be used for this purpose. Then the current pointer is set to the next free page. The free pointer is incremented. These steps cause a new page of memory to be allocated to a particular significance category and provide links to pages of memory containing data for a common significance category so that the order of allocation can be determined during decoding.

When all pages in the memory are in use and there is more data that is more significant than the least significant data in memory, memory reassignment may be performed. Three such reassignment techniques are described. In all three cases, memory assigned to the least significant data is reassigned to more significant data and no more least significant data is stored.

First, the page currently being used by the least significant data is simply assigned to the more significant data. Since most typical entropy coders use internal state information, all of the least significant data stored previously in that page is lost.

Second, the page currently being used by the least significant data is assigned to the more significant data. Unlike the previous case, the pointer is set to the end of the page and as more significant data is written to the page, the corresponding pointer is decremented. This has the advantage of preserving the least significant data at the start of the page if the more significant data does not require the entire page.

Third, instead of the current page of least significant data being reassigned, any page of least significant data may be reassigned. This requires that the coded data for all pages be coded independently, which may reduce the compression achieved. It also requires that the uncoded data corresponding to the start of all pages be identified. Since any page of least significant data can be discarded, greater flexibility in quantization is available.

The third alternative might be especially attractive in a system that achieves a fixed rate of compression over regions of the image. A specified number of memory pages can be allocated to a region of the image. Whether lessor significant data is retained or not can depend on the compression achieved in a particular region. Note that the memory assigned to a region might not be fully utilized if lossless compression required less than the amount of memory assigned. Achieving a fixed rate of compression on a region of the image can support random access to the image regions.

When compression is complete, the data may be transferred, if desired, to a channel or storage device in order of significance. The various links and pointers would then no longer be needed and multi-pass decoding could be performed. Alternatively, for one-pass decoding, the pointers to the data for each significance can be kept.

In some applications, some significance categories might not be used. For example, a 16-bit compressor might be used on a 12-bit medical image, so significance categories corresponding to bitplanes 15 . . . 12 would be unused. In implementations with large pages and many unused significance categories, this would waste memory (when the system does not know in advance that some categories are unused), since memory does not have to be allocated to them. Another solution to this memory waste would be to use a small memory (or register) to hold a count for each significance category. The count would keep track of the number of "insignificant" decisions that occur before any other decision occurs. The memory required to store these counters must be "traded-off" against the memory used by unused significance categories.

The ability to write data into each page from both ends can be used to better utilize the total amount of memory available in the system. When all pages are allocated, any page that has sufficient free space at the end can be allocated for use from the end. The ability to use both ends of a page must be balanced against the cost of keeping track of the location where the two types of data meet. Note that this is different from the case where one of the data types was not significant and could simply be overwritten.

Improvements

In one embodiment, the present invention provides lossless compression with a small memory buffer. The present invention is capable of serving many different application and device environments. The following describes techniques to implement various features to enable the system of the present invention to be more flexible for different applications and target devices. Note that for the present invention, choices in resolution, pixel depth, random access, quantization, etc. do not have to be made at encode time.

Data Arrangement

With respect to data arrangement, there are a number of options for arranging the image and coefficient data with the system of the present invention. As is discussed in more detail below, these options include, but are not limited to, the tiling of coded units, the number of levels of decomposition, the selection of wavelet transform filters, and the alignment of coefficients. As such, each of these could be a user or system designer controlled parameter.

As discussed above, one parameter may be the tiling of coded units. The height and width of the coding unit are defined with respect to trees of the present invention. For random access, the start of the coded data for each coding unit can be designated by pointers or markers in the codestream or pointers in the header. This would allow access to blocks not the width of the image.

Another parameter that may be controlled is the number of levels of decomposition. Varying the number of levels of decomposition varies the compression performance based on the fact that the more levels of decomposition results in better compression. Note that varying the number of decomposition levels also affects the memory requirements, as more levels requires more line buffers. More levels might be needed to target a resolution below full resolution. For example, if an original image is 2000 dpi, five levels of decomposition is needed to achieve about 63 dpi. This allows a high resolution scan to be displayed at close to real size on a monitor without decompression and subsampling.

The type of wavelet transform filters for the horizontal and vertical pass at each level may also be different. This allows for different memory requirements and compression performance. Note that the coefficient size does not increase with more levels. Also, since the wavelet transform is an order N transform, and there is less data to transform as the levels increase, there is little computational cost for more levels.

Target Devices for the Embedded Codestream

There are many possible application targets for a particular compressed codestream. It might be desirable to have a codestream that can be sent to a monitor with lower resolution but full pixel depth, a printer with full resolution but lower pixel depth, a fixed-rate real-time device with a limited channel, or a fixed-size limited memory device. It is possible that the same codestream is required to serve all of these needs. FIG. 34 shows a generalization of the relative device characteristics a single application might serve.

Transmission or Decode Codestream Parser

The system of the present invention with enough speed at the encoder and decoder and enough bandwidth can extract the required data from the decompressed image. Furthermore, the encoder can create a codestream that is intended for one of the above devices. At the encoder, the image can be quantized or down sampled in the traditional fashion.

However, a virtue of the present invention is that, with the proper signaling, a codestream can be created that can be parsed before transmission or decoding without decompression for any of the above devices. Such a parser may be shown in FIGS. 35A and B. Referring to FIG. 35A, a parser 3501 is shown receiving a lossless bitstream and generating a lossy bitstream. Referring to FIG. 35B, a parser 3502 is shown receiving a lossy bitstream and generating another lossy bitstream; however, the relationship between the output and the input in FIG. 35B in such that the present invention has the property of being idempotent, which will be described in further detail below. Note that in the case of both parsers 3501 and 3502, the bit rate of data received as an input is greater than that being outputted.

Low Resolution, High Pixel Depth Embedded Target

If the target is a low resolution, high pixel depth embedded target, this application assumes that the target device has a lower spatial resolution than is available but the full pixel depth is required. Examples of a low resolution, high pixel depth embedded target are monitors. Using the codestream shown in FIG. 24A, each bit-plane is decoded for as many higher level coefficients as needed. This requires the parser to truncate each bit-plane. To assist the parser, each bit-plane of each coding unit could have markers or pointers denoting the location where the truncation can occur. In such an embodiment, if more than one target resolution is desired, more markers or pointers are required. The bit-planes are coded independently so the entropy coder can be reset for the next bit-plane.

Figure 24B:
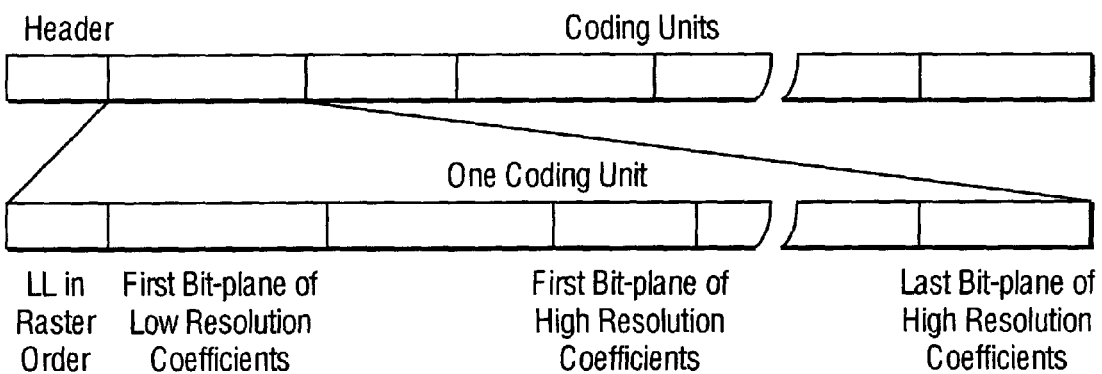
FIG. 24B illustrates one embodiment of a codestream configuration for a low resolution target.

Another approach is to embed the data differently, such as shown in FIG. 24B. Referring to FIG. 24B, the target resolution coefficients within each coding unit is coded first followed by the bit-planes of the remaining high resolution coefficients. In this case, there is only one truncation necessary per coding unit and the entropy coder need not be reset. Markers or pointers can denote the desired truncation point.

High Resolution, Low Pixel Depth Embedded Target

If the target is a high resolution, low pixel depth embedded target, this application assumes that the target device requires the full resolution available, or more, but cannot use the full pixel depth. Examples of the high resolution, low pixel depth embedded target include low end printers and standard monitors (when images are more than 8 bits/plane). The codestream shown in FIG. 24A is embedded in this order. Each coding unit is truncated at the point at the right number of bit-planes and the transform is performed on the quantized coefficients. There is a direct relationship between coefficient depth and pixel depth. Markers or pointers can denote the desired truncation point.

Alternately, if the codestream is embedded as shown in FIG. 24B, then two markers or pointers are used to denote truncation, one for the low resolution bit-planes and one for the high resolution bit-planes. The two sets of bit-planes are coded independently to allow the entropy coder to be reset.

Yet another alternative is to decode some or all of the low resolution coefficients, as described with respect to the low resolution, high pixel depth embedded target, and possibly some data from the high resolution coefficients. Then perform the interpolating wavelet transform described below.

Fixed-Rate Embedded Target

If the target is a fixed-rate embedded target, this application assumes that a real-time constant pixel output must be maintained while using a constrained channel. In this case, there is a certain maximum codestream data rate locally in time (minimum compression ratio). To achieve this goal, first, the coding units are chosen based on the amount of buffering available at the target device. This defines the locality over which the average compression ratio is to be achieved. Then each coding unit with more data than is allowed is truncated.

Note that if the codestream data rate does not exceed the maximum channel bandwidth the image is recovered losslessly. This is not true of any other fixed-rate system.

Fixed-Size Embedded Target

If the target is a fixed-size embedded target, this application assumes that a fixed-size frame buffer is available to the compressed image data. Unlike the fixed-rate application, this requires a minimum compression rate averaged over the entire image, not just locally. Of course, the fixed-rate method could be used here, but, by using the concept of averaging over the entire image rather than locally, better bit allocation and image quality can be obtained.

If the coding unit contained the entire image, it would be trivial to truncate the data that overflows the buffer. If coding units are less than the entire image and all the coding units are truncated to the same number of bits, there is no guarantee that the truncation has uniformly removed the lowest importance levels. A simple solution is to record at encode time (or a later parsing time) the number of coded bits that each importance level contributes to the codestream for each coding unit or globally, or both. The recording can be done using simple counters. These numbers are recorded in a header and can be used for deciding how to truncate each coding unit at transmission or storage time. The header contains an importance level and its corresponding number of bits. The header may also contain this information for each of the coding units that are contained in the stream. When deciding where to truncate, the same effect on each coding unit. For example, if due to memory constrainst, it is determined that one and a half importance levels are to be discarded, then one and a half importance levels from each coding unit are discarded. This allows the effect of the truncation to be spread across the coding units in a uniform manner.

Achieving a fixed-size compressed image can be achieved at encode time as well. The memory is divided into segments for importance levels. If the memory is about to overflow, lessor important segments are overwritten with more important data.

Note that if the compressed data does not overflow the memory buffer the image is recovered losslessly. This is not true of any other fixed-size system.

Interpolating with the Wavelet Transform

Wavelets can be used to interpolate images to higher resolution. The results are visually quite comparable to bi-cubic spline techniques. If the compressed data is already in the form of wavelet coefficients, the effective additional computation for interpolation is less than bi-cubic spline.

Imagine that all the coefficients of N level decomposition are available. By creating a new lowest level of coefficients, by padding with zeros or some other method, and then performing a N+1 level wavelet reconstruction, the new image is a 2:1 interpolated version of the original.

This method can also be used with the systems in which there are target devices for the embedded codestream, especially for high resolution, low pixel depth target devices. The coding units are truncated so only the low resolution coefficients are present (or only the low resolution coefficients and a few bits of some or all of the high resolution coefficients). The coefficients are padded to the higher resolution and the reconstruction is performed.

Using a Channel

In a system where data is transmitted in a channel instead of being stored in a memory and fixed size pages of memory are used (but only one page per significance category is needed), when a page of memory is full, it is transmitted in the channel, and memory location can be reused as soon as they are transmitted. In some applications, the page size of the memory can be the size of data packets used in the channel or a multiple of the packet size.

In some communications systems, for example ATM (Asynchronous Transfer Mode), priorities can be assigned to packets. ATM has two priority levels, priority and secondary. Secondary packets are only transmitted if sufficient bandwidth is available. A threshold can be used to determine which significance categories are priority and which are secondary. Another method would be to use a threshold at the encoder to not transmit significance categories that were less significant than a threshold.

Thus, one embodiment of the memory manager of the present invention controls the storage of compressed data in a fixed size memory. That is, the memory manager divides the compressed data into different importance levels. When the memory is full, lessor important data is overwritten by more important data.

In order to manage a channel using a limited amount of buffer memory (e.g., a fixed-rate), in one embodiment of the present invention, all data is transmitted if sufficient bandwidth is available; otherwise, lessor importance data is discarded and only more important data is transmitted.

Figure 30:
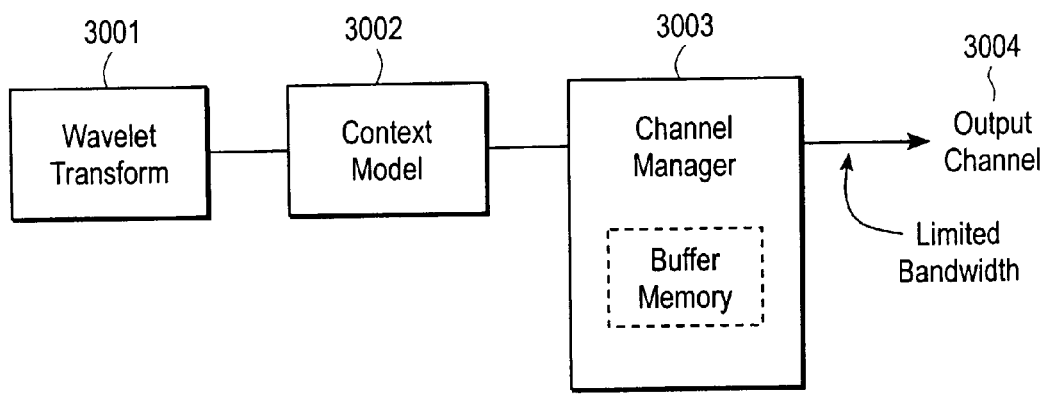
FIG. 30 illustrates one embodiment of a channel manager.

FIG. 30 illustrates a system utilizing a channel manager. Referring to FIG. 30, wavelet transform 3001 generates coefficients. These coefficients are subjected to context model 3002. Context model 3002 is coupled to a channel manager 3003 that includes a buffer memory. The channel manager 3003 is coupled to a limited bandwidth channel 3004.

Channel manager 3003 controls the rate at which data is output to channel 3004. As data is received into its buffer memory, channel manager 3003 determines if the amount of data is greater than the bandwidth of channel 3004. If the amount of data is not greater, then channel manager 3003 outputs all of the data. On the other hand, if the amount of data received into the buffer memory is greater than the channel bandwidth, then channel manager 3003 discards information in its buffer memory to match the bandwidth of channel 3004.

Channel 3004 may indicate its bandwidth to channel manager 3003. In another embodiment, channel manager 3003 may dynamically determine the bandwidth of channel 3004 based on the amount of time that it takes channel 3004 to send a predetermined unit (e.g., packet) of data through channel 3004. That is, the channel bandwidth can be treated as dynamic if desired.

In one embodiment, channel manager 3003 operates on an image that is broken up into tiles (or bands). This is a "tile dominant over importance" scheme in contrast to the fixed size memory manager where tiling and importance are somewhat independent. Each tile is separately coded and divided by importance levels and fixed size pages. Therefore, all the coded data for each tile is grouped together. Coded data within each tile is tagged by importance level.

In one embodiment, the buffer memory in channel manager 3403 is at least two (or perhaps three) times the size of the channel's packet size and several times (perhaps four times) larger than the expected compressed data size for a tile.

A fixed maximum amount of the buffer memory is assigned to a tile. The maximum amount is matched to the bandwidth of the channel. Buffer memory is broken into fixed size segments and allocated as needed. If the memory usage reaches the maximum allowed, segments are reassigned as in the management of fixed size memory system.

Figure 31:
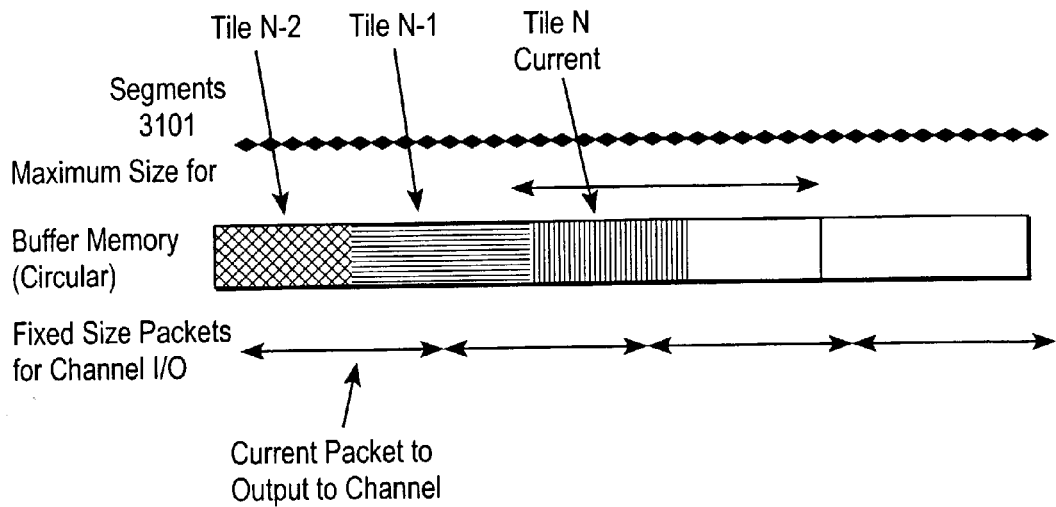
FIG. 31 illustrates memory utilization in the present invention.

FIG. 31 illustrates an example of buffer memory usage. Referring to FIG. 31, a circular buffer memory has multiple fixed sized segments 3101 that are divided into multiple fixed size packets 3102 for channel input/output. As shown, different tiles of data may occupy the same packet of memory. In one embodiment, the different tiles represent different importance levels. As the packet size amount of buffer space is used, channel manager 3103 indicates to the context model to output the data to channel 3104 (FIG. 30). As shown, tile N-2 and part of tile N-1 would be output as the current packet. Thus, a packet size amount of memory is allocated and filed in order to match the bandwidth of the channel.

If the buffer does not fill up, the extra memory may be used for future tiles. In one embodiment, to avoid noticeable tile boundaries at the start of a difficult to compress region versus the next block, only some fraction (½, ⅓, etc.) of the extra is used by the next tile.

The channel manager of the present invention may be used where data can only be transmitted in a certain period of time. Using such a channel manager, the data transmission occurs during the time period regardless of the complexity, because the data is embedded based on its importance.

Alternate Embodiment of the Channel Manager

One goal of the channel manager of the present invention is to use minimal memory. In one embodiment, where the channel manager does not contain buffer memory, the following may be used:

for each coding unit
  for each bitplane do
    for each frequency do
      for each spatial location do In one embodiment, the coder (or set it to a known state) is reset at the start of each band. In one embodiment a band comprises 16 lines for a four level decomposition if the band memory is to be reduced.

Figure 32:
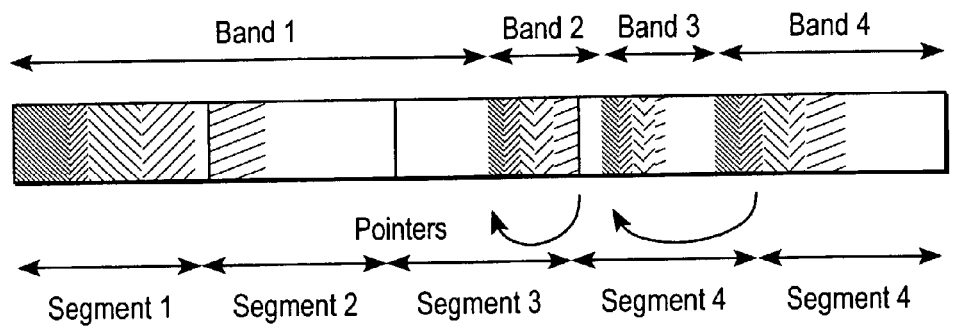
FIG. 32 illustrates a bitstream in the present invention.

FIG. 32 illustrates a bitstream using the above method. Referring to FIG. 32, the bit stream is divided into fixed size segments, which are channel packets, disk sectors or whatever is a reasonable amount of buffer for the channel. Note that this division may be no more than a logical division during encoding; the encoder can output using no buffering if desired. Each fixed size segment includes an indication of the most important data in the segment.

Figure 33:
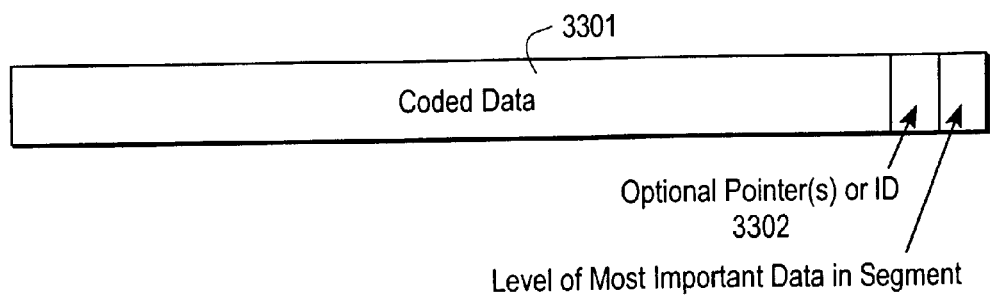
FIG. 33 illustrates the structure of a segment.

The structure of a segment is shown in FIG. 33. Referring to FIG. 33, the bitstream for one segment includes coded data 3301, an optional pointer(s) or ID 3302 and a level of the most important data in the segment 3303. In one embodiment, bit field 3303 comprises 2 to 5 bits. If the most important level is 0 (the most important one), the next to last M bits of the segment is a pointer that tells where in the segment the level 0 data starts at. Note that the first segment of data can be entirely coded data, no overhead is needed.

In one embodiment, the starting point for each band may be identified using restart markers, similar to those used in the JPEG standard. However, the marker used should be that symbol that occurs least often during coding.

Now again considering FIG. 31, assume it is desired to decompress only some importance levels (perhaps only the most important level). Decompression starts with the first segment. For segment 2, the "level of the most important data in segment" is checked, and perhaps the entire segment can be skipped where the most important level contained in the segment is less than the level(s) being decompressed. For the third segment, the pointer is used to find the start of band 2, and decompression of band 2 can begin.

Note that to ensure that all the most significant data in a segment is obtained, it might be required to decompress the entire segment, particularly when more than one band falls in the segment.

By selectively decompressing only a predetermined number of significant bands, a preview image maybe obtained. This may be advantageous when data is in embedded form and lossy versions of lossless data are desired.

Depending on the desired access and quantization possibilities, and whether or not the time to decompress an entire band is important, the optional pointer(s) or ID at the end of the segment can contain:

A next segment pointer for fixed size memory management.

An ID for the segment or ID of band(s) contained. (Supports channel quantization, would indicate if segment 2 were dropped for example)

The number of different bands that the segment contains data for (or at least a bit indicating that a band contains more than two segments). (Supports not decompressing entire segments after decompressing the desired data).

An example of the overhead for a band of 512×16 pixels, consider 8-bit image having 2:1 lossless compression, and a segment size of 512 bytes. Note that a band typically compresses to 8 segments. For 32 importance levels, 5 bit tags are used. Assume pointers are on byte boundaries, so 9-bit pointers are used. Therefore, there are 49 overhead bits/(32K compressed bits+49) representing a total of 0.15%.

Near-Lossless

One concept of near lossless compression is based on absolute error in the reconstructed pixel values. Hence, in a near-lossless compressed image with an absolute error of 1 it is guaranteed that no pixel value in the decompressed image differs from the original by more than 1 unit of pixel value. This is an absolute definition independent of the pixel depth or the dynamic range of the image. An obvious and, under some reasonable assumptions, optimal to such a system is to keep the compression/decompression part lossless and use preprocessing and post-processing schemes to achieve near-lossless. This method has been adopted in this implementation.

The near-lossless compressed image with an absolute error of e is achieved by the quantization method that maps every 2e+1 consecutive integers to their middle integer. For example, for error equal to 3, the pixel values are quantized such that 0 through 6 is mapped to 3 and 7 through 13 is mapped to 10, and so on. The quantized image as such is not suited for a transform-based compression system. Hence, it is mapped one-to-one (losslessly) into an image of lower dynamic range or depth, called the shallow image. This is done by mapping the middle values (representative values) to consecutive integers preserving the order. Mathematically given a pixel value x, it is quantized to:

$$q(x) = \left(\left\lfloor \frac{x}{2e+1} \right\rfloor + 1\right) \cdot e$$

The one-to-one mapping of the representative values to the shallow image values is, $$p(x) = \left\lfloor \frac{x}{e} \right\rfloor - 1$$

The inverse of the one-to-one mapping p which maps the shallow image values back to representative values is, $$p^{-1}(x) = e \cdot (x+1)$$

Quantization (q(x))) followed by the mapping to the shallow image values (p(x)) is the pre-processing operation, which proceeds the lossless compression. The map from the shallow image values to the representative values form the post-processing operation, which follows the lossless decompression.

Transform domain quantization can also be used. Many coefficients have an effect on peak error propagates through multiple levels of the transform. It is easier to determine the effect on peak error for the high-pass coefficients that have no children.

Consider a one-dimensional signal which is to be encoded with a maximum peak error of ±E. This can be achieved by quantizing the finest detail high-pass coefficients to ±3E. For a two-dimensional signal, since there are two applications of the high-pass filter, the finest detail HH coefficients can be quantized to ±4E.

An alternative to using quantization of the input image is to control the decisions to the entropy coder. One example is the following. For each coefficient, if setting the coefficient to zero would not cause the error in any pixel affected by that coefficient to exceed the maximum error, the coefficient is set to zero. In some implementations only particular coefficients will be tested, perhaps only the AC coefficients that have no children. Coefficients can be considered with a greedy strategy where one is considered at a time. Other strategies can consider small groups of coefficients and choose to zero the largest possible subset of the group.

As described above, quantization is achieved by the embedding function and is optimized to maximize performance with respect to a quantitative metric such a RMSE. In one embodiment, the quantization of the various coefficients is performed to achieve improved results with respect to the Human Visual System. In such a case, little modification of the embedding scheme is required. For instance, the coefficients are shifted to change the relation between them by a factor of two and/or to represent the number in a different type of numbering system such as Gray code.

The compressed wavelet system of the present invention may be useful in an image editing situation. In the prior art, applying image processing functions to a full resolution print image is time consuming and makes interactive processing difficult.

In one embodiment, if an image editing system saved tiles that are compressed, it could very quickly apply operations to the scale representation (the very low pass) for the user to evaluate. This can be done quickly because only the displayed pixels are operated on. It is only an approximation of the final result since the actual full resolution pixels affect the output. The user will therefore zoom in (perhaps on some text) on various portions of the image. As the user does, the image editing system applies the operation to that part of the image. To facilitate this, a tree is stored that contains the compressed coefficients and information about which processing operations have been applied and which still need to be applied.

In one embodiment, the importance levels are redefined to permit lossless compression in a defined window and lossy compression for the rest of the image. The window could be fixed or selectable by a user. There could be multiple windows of different importance. In one embodiment, the window is as small as 48×48 blocks, although it should be possible to have much finer occurrence even down to the two pixel level.

A possible application of this is satellite imagery, where satellites use a lossless window on data so that statistical studies are not messed up with JPEG artifacts, but the lossy compression allows a much wider field of view than would be possible with lossless compression.

In one embodiment, the user draw arbitrary boxes on an image and specifies the relative importance of the data in the box. Once a box has been drawn, software increases the size of the box bigger to the smallest size which meets the required constraints and contains the user box. The file header would contain information about the boxes used and the importance level. The encoder and decoder would then provide more resolution to the coefficients in the important boxes as coding/decoding proceeds. For the satellite imagery case, the important window is likely to be predefined.

Idempotent Operation

For a lossy compressor, in general, idempotent operation as DCDCI=DCI, where I is the image, C the compression operation and D the decompression operation. In the present invention, when data is compressed to X bits and then decompressed, they should be able to be recompressed to X bits and have the original X bits. There is an even stronger version of idempotent for an embedded system. In one embodiment, an image when compressed to X bits, decompressed and recompressed to Y bits with Y<X is the same as if the original image is compressed to Y bits.

This is important because compression and processing causes images to drift farther from the original. If the compressor is idempotent, then multiple lossy compression decompression cycles do not affect the data. In the present invention, it does not matter how many times data is compressed and decompressed at the same compression ratio. Also, a lossy input to a parser subjected to further quantization produces an identical result to the case when a lossless input is used. Thus, the present invention comprises a transform-based idempotent system that includes a wavelet transform, a context model, and an entropy coder, such that coefficients are described and stored in an order such that removing information does not change the description for prior coefficients.

Applications

The present invention may be used for a number of applications, some of which are mentioned as examples below. Specifically, high-end applications with high-resolution and deep pixels and applications that are artifact intolerant can use the present invention. The present invention enables high-end applications maintain the highest quality in high-quality environments while applications with more limited bandwidth, data storage, or display capabilities can also use the same compressed data. This is precisely the device-independent representation that is commonly being required of modem imaging applications such as web browsers.

The superior lossless compression performance of the present invention on deep pixel images (10 bits to 16 bits per pixel) is ideal for medical imagery. In addition to the lossless compression, the present invention is a true lossy compressor without many of the artifacts known to block-based compressors. Lossy artifacts derived by using the present invention tend to be along sharp edges where they are often hidden by the visual masking phenomena of the Human Visual System.

The present invention may be used in applications involving the pre-press industry in which the images tend to be very high resolution and have high pixel depth. With the pyramidal decomposition of the present invention, it is easy for the pre-press operator to perform image processing operations on a lower resolution lossy version of the image (on a monitor). When satisfied, the same operations can be performed on the lossless version.

The present invention is also applicable for use in facsimile document applications where the time of transmission required without compression is often too long. The present invention allows very high image output from fax machines with different spatial and pixel resolutions. Since transmission time is a premium in this application, the interpolation feature of the present invention is useful.

The present invention may be used in image archival systems that require compression, particularly for increasing storage capacity. The device independent output of the present invention is useful because the system can be accessed by systems with different resources in bandwidth, storage, and display. Also, progressive transmission capabilities of the present invention are useful for browsing. Lastly, the lossless compression is desirable for output devices in image archiving systems may be provided by the present invention.

The hierarchical progressive nature in the lossless or high quality lossy data stream of the present invention make it ideal for use in the World Wide Web, particularly where device independence, progressive transmission, high quality, and open standards are imperative.

The present invention is applicable to satellite images, particularly those that tend to be deep pixel and high resolution. Furthermore, satellite imagery applications have limited bandwidth channel. The present invention allows flexibility and with its progressive transmission qualities, it may be used to allow humans to browse or preview images.

Some satellites are using a lossless window on data so that statistical studies are not messed up with JPEG artifacts, but the lossy compression allows a much wider field of view than would be possible with lossless compression.

In one embodiment, the importance levels may be redefined to get lossless compression in a defined window and lossy compression for the rest of the image. The window could be fixed or selectable by a user. There could be multiple windows of different importance. One implementation would probably be with 48×48 blocks as the smallest unit for a window, although it should be possible to have much finer accuracy even down to the two pixel level. This will probably result in more accurate pixels close to the lossless region, but this might make the region stand out less.

One way this might be implemented is to have the user draw arbitrary boxes on an image and specify the relative importance of the date in the box. Software would make the box bigger to the smallest size which meets the required constraints and contains the user box. The file header would contain information about the boxes used and the importance level. The encoder and decoder would then provide more resolution to the coefficients in the important boxes as coding/decoding proceeds. For the satellite imagery case, the important window is likely to be predefined. Note that this is applicable to applications other than satellite imagery.

"Fixed-rate", limited-bandwidth applications such as ATM networks need ways of reducing data if it overflows the available bandwidth. However, there should be no quality penalty if there is enough bandwidth (or the compression is high enough). Likewise, "fixed-size" applications like limited-memory frame stores in computers and other imaging devices need a way to reduce data if the memory fills. Once again, there should be no penalty for an image that can be compressed losslessly into the right amount of memory.

The embedded codestream of the present invention serves both of these applications. The embedding is implicit to allow the codestream to be trimmed or truncated for transmission or storage of a lossy image. If no trimming or truncation is required, the image arrives losslessly.

In sum, the present invention provides a single continuous-tone image compression system. The system of the present invention is lossless and lossy with the same codestream and uses quantization that is embedded (implied by the codestream). The system is also pyramidal, progressive, provides a means for interpolation, and is simple to implement. Therefore, the present invention provides a flexible "device-independent" compression system.

The unified lossy and lossless compression system is very useful. Not only is the same system capable of state-of-the-art lossy and lossless compression performance, the same codestream is as well. The application can decide to retain the lossless code of an image or truncate it to a lossy version while encoding, during storage or transmission of the codestream, or while decoding.

Lossy compression provided by the present invention is achieved by embedded quantization. That is, the codestream includes the quantization. The actual quantization (or visual importance) levels can be a function of the decoder or the transmission channel, not necessarily the encoder. If the bandwidth, storage, and display resources allowed it, the image is recovered losslessly. Otherwise, the image is quantized only as much as required by the most limited resource.

The wavelet used in the present invention is pyramidal, wherein a decomposition by a factor of two of the image without difference images is performed. This is more specific than hierarchical decomposition. For applications that need thumbnails for browsing or to display images on low resolution devices, the pyramidal nature of the present invention is ideal.

The embedding use in the present invention is progressive, specifically by bitplane, i.e., MSB followed by lessor bits. Both the spatial and wavelet domains can be decomposed progressively, although the present invention is progressive in the wavelet domain specifically. For applications that have spatial resolution but lower pixel resolution, such as printers, the progressive ordering of the bits in the present invention is ideal. These features are available with the same codestream.

One virtue of the structure of the present invention is that it provides a computationally efficient mode for interpolation. If higher resolution is desired, the high pass coefficients can be interpolated from the available wavelet coefficients and the inverse wavelet of the present invention is performed. This method is visually competitive with bi-cubic spline but is far less computationally intensive with the transform of the present invention.

The present invention is idempotent meaning that an image can be decompressed in a lossy form and recompressed to the same codestream. This virtue allows multiple compression and decompression cycles in an application that has browsing, filtering, or editing.

The present invention is relatively simple to implement in both software and hardware. The wavelet transform can be calculated with just four add/subtract operations and a few shifts for each high-pass, low-pass coefficient pair. The embedding and encoding is performed with a simple "context model" and a binary "entropy coder". The entropy coder can be performed with a finite state machine or parallel coders.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

We claim:

1. An apparatus comprising:
   a wavelet transform to generate wavelet coefficients;
   a model to model the wavelet coefficients from the wavelet transform as part of a process to generate coded data;
   a channel manager to control rate at which the coded data is transmitted to a limited bandwidth channel, the coded data being categorized based on significance;
   wherein the channel manager permits transmission of all coded data onto the limited bandwidth channel if bandwidth is available and discards less significant data to enable transmission of more significant data if bandwidth is not available; and
   wherein the channel manager determines significance for portions of the coded data using a threshold.

2. The apparatus defined in claim 1 wherein the wavelet transform comprises a reversible wavelet transform.

3. The apparatus defined in claim 1 wherein the channel manager divides the coded data based on significance.

4. The apparatus defined in claim 1 wherein the channel manager includes a memory to store coded data and overwrites less important data when the memory is full.

5. The apparatus defined in claim 1 wherein the channel manager prevents transmission of coded data categorized as less significance, where significance is determined based on a threshold.

6. The apparatus defined in claim 1 wherein the limited bandwidth channel indicates its bandwidth to the channel manager.

7. The apparatus defined in claim 1 wherein tiles in the coded data are categorized based on the significance.

8. An apparatus comprising:
a wavelet transform to generate wavelet coefficients;
a model to model the wavelet coefficients from the wavelet transform as part of a process to generate coded data; and
a channel manager to control rate at which the coded data is transmitted to a limited bandwidth channel, the coded data being categorized based on significance, wherein the channel manager dynamically determines the bandwidth of the limited bandwidth channel based on the amount of time expended in sending a predetermined packet of data through the channel.

9. A method comprising:
generating wavelet coefficients using a wavelet transform;
modeling the wavelet coefficients from the wavelet transform as part of a process to generate coded data;
determining significance for portions of the coded data using a threshold; and
controlling rate at which the coded data is transmitted to a limited bandwidth channel, the coded data being categorized based on significance, wherein controlling rate at which the coded data is transmitted to a limited bandwidth channel comprises permitting transmission of all coded data onto the limited bandwidth channel if bandwidth is available and discards less significant data to enable transmission of more significant data if bandwidth is not available.

10. The method defined in claim 9 wherein the wavelet transform comprises a reversible wavelet transform.

11. The method defined in claim 9 wherein controlling rate at which the coded data is transmitted to a limited bandwidth channel comprises dividing the coded data based on significance.

12. The method defined in claim 9 further comprising:
storing coded data in a memory; and
overwriting less important data in the memory when the memory is full.

13. The method defined in claim 9 wherein controlling rate at which the coded data is transmitted to a limited bandwidth channel comprises preventing transmission of coded data categorized as less significance, where significance is determined based on a threshold.

14. The method defined in claim 9 further comprises the limited bandwidth channel indicating its bandwidth to a channel manager.

15. The method defined in claim 9 wherein tiles in the coded data are categorized based on the significance.

16. A method comprising:
generating wavelet coefficients using a wavelet transform;
modeling the wavelet coefficients from the wavelet transform as part of a process to generate coded data;
dynamically determining the bandwidth of the limited bandwidth channel based on the amount of time expended in sending a predetermined packet of data through the channel, and
controlling rate at which the coded data is transmitted to a limited bandwidth channel, the coded data being categorized based on significance.

17. An article of manufacturing having one or more machine-readable media storing instructions which, when executed by a machine, cause the machine to:
generate wavelet coefficients using a wavelet transform;
model the wavelet coefficients from the wavelet transform as part of a process to generate coded data;
determine significance for portions of the coded data using a threshold; and
control rate at which the coded data is transmitted to a limited bandwidth channel, the coded data being categorized based on significance, wherein controlling rate at which the coded data is transmitted to a limited bandwidth channel comprises permitting transmission of all coded data onto the limited bandwidth channel if bandwidth is available and discards less significant data to enable transmission of more significant data if bandwidth is not available.

18. An article of manufacturing having one or more machine-readable media storing instructions which, when executed by a machine, cause the machine to:
generate wavelet coefficients using a wavelet transform;
model the wavelet coefficients from the wavelet transform as part of a process to generate coded data;
control rate at which the coded data is transmitted to a limited bandwidth channel, the coded data being categorized based on significance; and
dynamic determining the bandwidth of the limited bandwidth channel based on the amount of time expended in sending a predetermined packet of data through the channel.

* * * * *